United States Patent
Horibe et al.

(10) Patent No.: US 9,793,293 B1
(45) Date of Patent: Oct. 17, 2017

(54) SEMICONDUCTOR DEVICE AND METHOD FOR MANUFACTURING SAME

(71) Applicant: Toshiba Memory Corporation, Minato-ku (JP)

(72) Inventors: Kosuke Horibe, Yokkaichi (JP); Shinichi Nakao, Yokkaichi (JP); Yasuhito Yoshimizu, Yokkaichi (JP); Kouji Matsuo, Ama (JP); Kei Watanabe, Yokkaichi (JP); Atsuko Sakata, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/461,509

(22) Filed: Mar. 17, 2017

Related U.S. Application Data

(60) Provisional application No. 62/422,162, filed on Nov. 15, 2016.

(51) Int. Cl.
*H01L 27/11582* (2017.01)
*H01L 27/11556* (2017.01)
(Continued)

(52) U.S. Cl.
CPC ...... *H01L 27/11582* (2013.01); *H01L 21/283* (2013.01); *H01L 21/32105* (2013.01); *H01L 23/5283* (2013.01); *H01L 27/11519* (2013.01); *H01L 27/11556* (2013.01); *H01L 27/11565* (2013.01)

(58) Field of Classification Search
CPC ............ H01L 27/11582; H01L 21/283; H01L 21/32105; H01L 23/5283; H01L 27/11519; H01L 27/11556; H01L 27/11565
See application file for complete search history.

(56) References Cited

U.S. PATENT DOCUMENTS 8,877,587 B2    11/2014  Noh
2010/0224928 A1  9/2010  Fukuzumi et al.
(Continued)

FOREIGN PATENT DOCUMENTS

JP    2010-205904    9/2010
JP    2011-54899     3/2011
(Continued)

*Primary Examiner* — Walter H Swanson
(74) *Attorney, Agent, or Firm* — Oblon, McClelland, Maier & Neustadt, L.L.P.

(57) ABSTRACT

A semiconductor device includes a stacked body including a plurality of electrode layers stacked with an insulator interposed; a columnar portion provided in the stacked body and extending in a stacking direction of the electrode layers; and a first separation region provided in the stacked body and extending in a first direction. The stacked body includes a memory cell array and a staircase portion arranged in the first direction, the memory cell array including memory cells provided along the columnar portion, and the staircase portion including a plurality of terraces arranged along the first direction. The first separation region includes a first portion and a second portion in the staircase portion, the first portion having a first width in a second direction crossing the first direction, and the second portion having a second width in the second direction. The second width is narrower than the first width.

17 Claims, 47 Drawing Sheets

(51) Int. Cl.
*H01L 23/528* (2006.01)
*H01L 27/11519* (2017.01)
*H01L 27/11565* (2017.01)
*H01L 21/321* (2006.01)
*H01L 21/283* (2006.01)

(56) References Cited

U.S. PATENT DOCUMENTS

| 2011/0057250 | A1 | | 3/2011 | Higashi |
| 2011/0057251 | A1 | | 3/2011 | Higashi |
| 2011/0156132 | A1 | | 6/2011 | Kiyotoshi |
| 2012/0228697 | A1 | * | 9/2012 | Youm ................ H01L 29/7926 257/329 |

FOREIGN PATENT DOCUMENTS

| JP | 2011-60838 | 3/2011 |
| JP | 2011-138945 | 7/2011 |

\* cited by examiner

FIG. 7A REFERENCE EXAMPLE
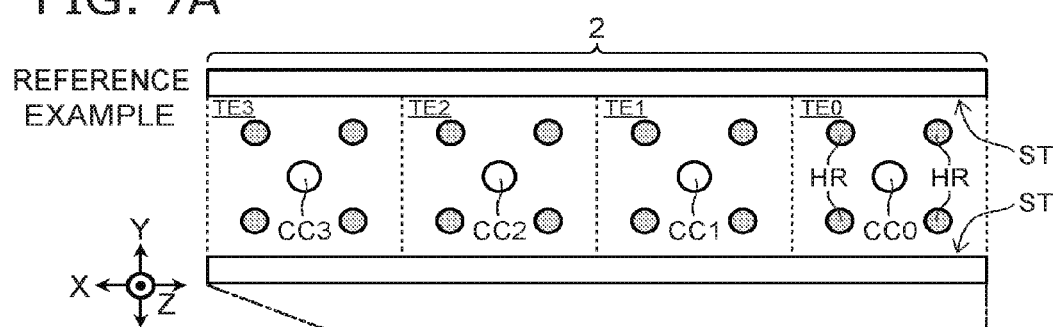
FIG. 7B EMBODIMENT
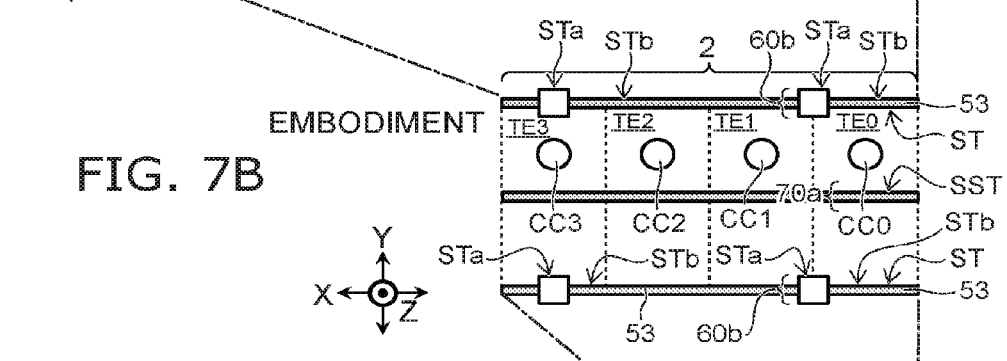
FIG. 7C EMBODIMENT
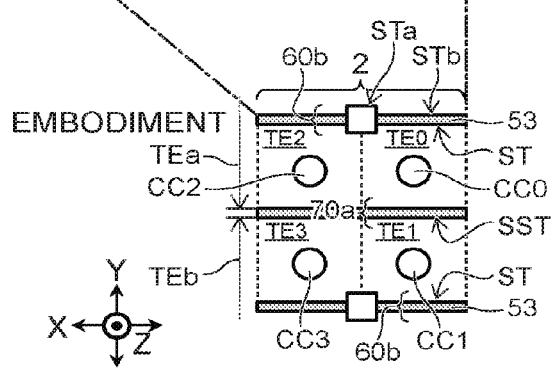

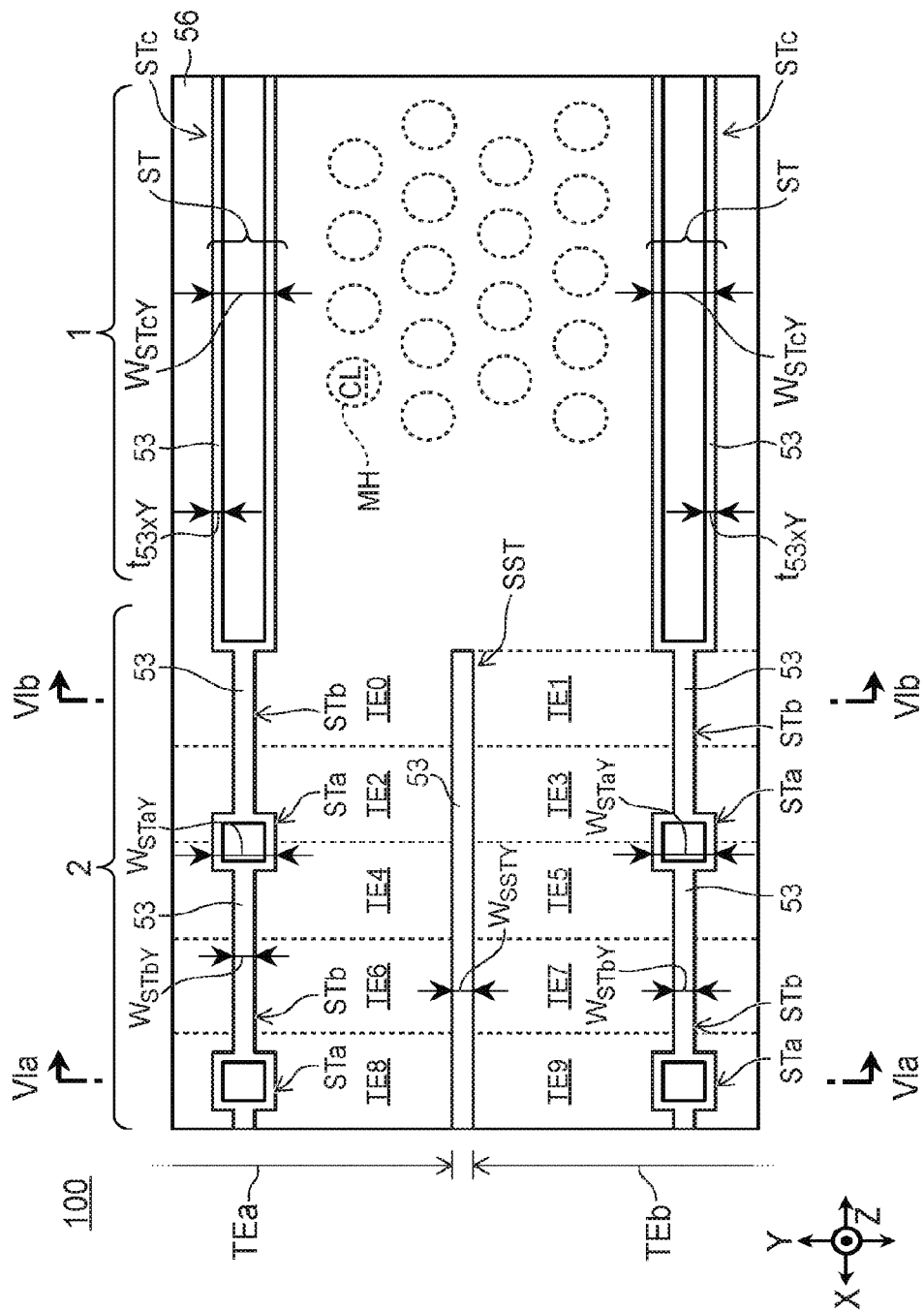

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/422,162 filed on Nov. 15, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which memory holes are formed in a stacked body in which multiple electrode layers are stacked, and a charge storage film and a semiconductor film are provided to extend in the stacking direction of the stacked body inside the memory hole. The stacked body includes a staircase portion at an end portion of the stacked body. The staircase portion includes multiple terraces. The terraces are portions where the electrode layers are electrically drawn out from the stacked body. Dummy posts for supporting the stacked body in the process of replacing sacrificial layers with the electrode layers are provided in the terraces. It is necessary to ensure a large planar size of the terrace to provide the dummy posts. Therefore, downscaling of the memory device is impeded. It is desirable to reduce the planar size of the staircase portion.

BRIEF DESCRIPTION OF THE DRAWINGS

FIG. 7A to FIG. 7C are schematic plan views showing a comparison of a reference example and the embodiments;

FIG. 8A to FIG. 8M are schematic plan views showing a method for manufacturing the semiconductor device of the first embodiment;

DETAILED DESCRIPTION

According to one embodiment, a semiconductor device includes a stacked body including a plurality of electrode layers stacked with an insulator interposed; a columnar portion provided in the stacked body and extending in a stacking direction of the electrode layers; and a first separation region provided in the stacked body and extending in a first direction. The stacked body includes a memory cell array and a staircase portion arranged in the first direction, the memory cell array including memory cells provided along the columnar portion, and the staircase portion including a plurality of terraces arranged along the first direction. The first separation region includes a first portion and a second portion in the staircase portion, the first portion having a first width in a second direction crossing the first direction, and the second portion having a second width in the second direction. The second width is narrower than the first width.

Various embodiments will be described hereinafter with reference to the accompanying drawings. The same reference numbers are applied to the same elements in figures. A semiconductor memory device of an embodiment is a semiconductor memory device including a memory cell array.

First Embodiment

<Semiconductor Device>

Figure 1:
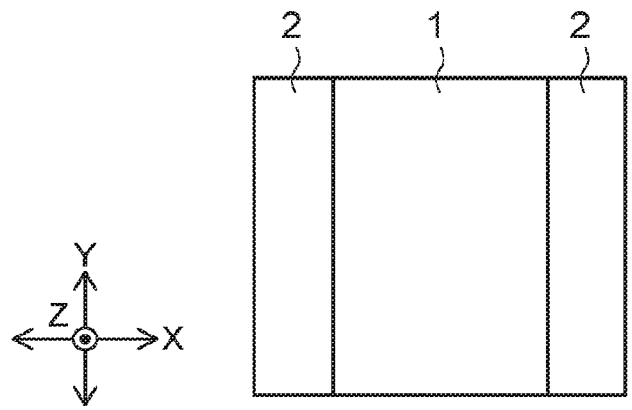
FIG. 1 is a schematic plan view showing a planar layout of a semiconductor device of a first embodiment.

FIG. 1 is a schematic plan view showing a planar layout of a semiconductor device of a first embodiment.

As shown in FIG. 1, the semiconductor device of the first embodiment includes a memory cell array (a cell array portion) 1 and a staircase portion 2. The memory cell array 1 and the staircase portion 2 are provided on a substrate. The staircase portion 2 is provided on the outer side of the memory cell array 1. In FIG. 1, two mutually-orthogonal directions parallel to a major surface of the substrate are taken as an X-direction and a Y-direction. A direction that crosses both the X-direction and the Y-direction, for example, orthogonal thereto is taken as a Z-direction. In the specification, "down" refers to a direction toward the substrate; and "up" refers to a direction away from the substrate.

Figure 2:
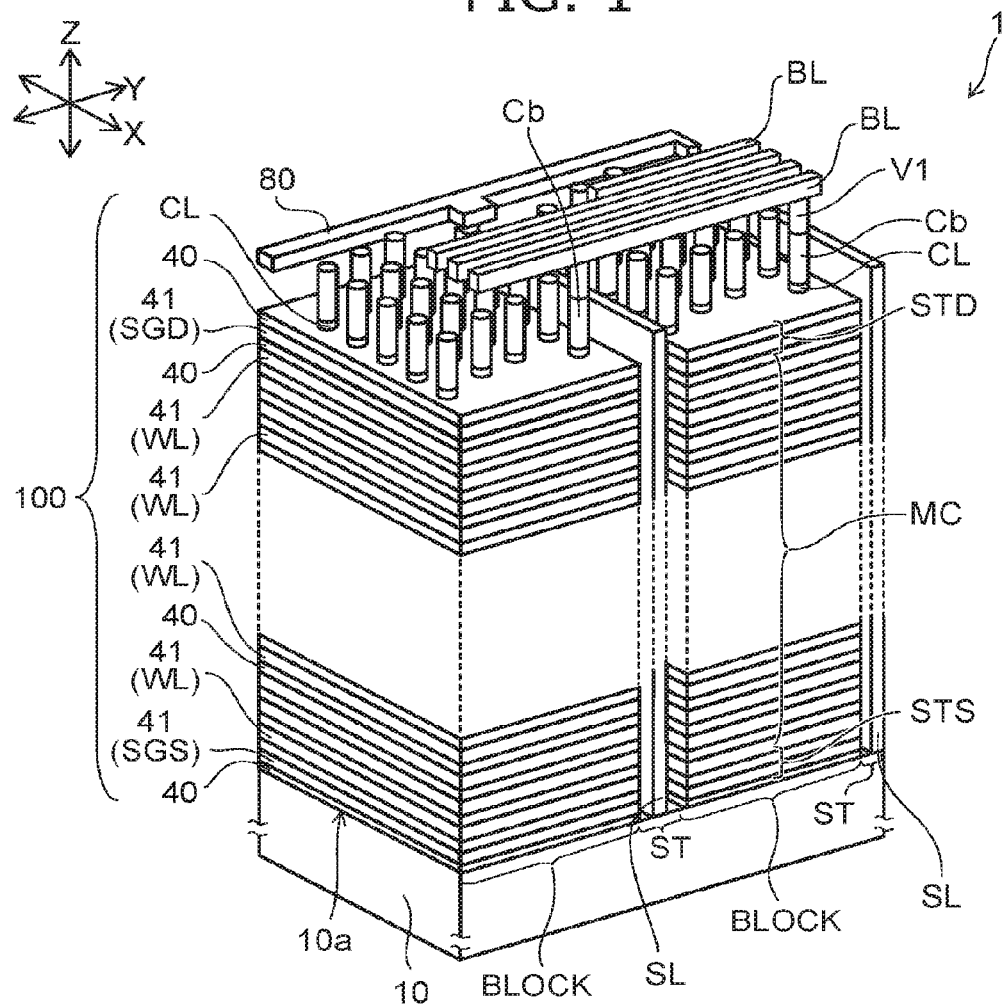
FIG. 2 is a schematic perspective view of a memory cell array of the semiconductor device of the embodiment.

FIG. 2 is a schematic perspective view of the memory cell array 1 of the semiconductor device of the embodiment.

As shown in FIG. 2, the memory cell array 1 includes a stacked body 100. The stacked body 100 is provided on a major surface 10a of a substrate 10. The substrate 10 includes, for example, a crystallized P-type silicon layer. The stacked body 100 includes multiple insulating bodies 40 and multiple electrode layers 41 stacked alternately. The insulating bodies 40 include an insulator. The insulator is, for example, silicon oxide. The electrode layers 41 include a conductor. The conductor is, for example, polysilicon, tungsten (W), molybdenum (Mo), etc. The multiple electrode layers 41 include at least one source-side selection gate (SGS), multiple word lines WL, and at least one drain-side selection gate (SGD). The source-side selection gate (SGS) is a gate electrode of a source-side selection transistor STS. The word lines (WL) are gate electrodes of memory cells MC. The drain-side selection gate (SGD) is a gate electrode of a drain-side selection transistor STD. The number of stacks of the electrode layers 41 is arbitrary.

The source-side selection gate (SGS) is provided in a lower region of the stacked body 100. The drain-side selection gate (SGD) is provided in an upper region of the stacked body 100. The lower region refers to a region on the side of the stacked body 100 proximal to the substrate 10; and the upper region refers to a region on the side of the stacked body 100 distal to the substrate 10. For example, at least one of the multiple electrode layers 41 including the electrode layer 41 most proximal to the substrate 10 is used as a source-side selection gate SGS. At least one of the multiple electrode layers 41 including the electrode layer 41 most distal to the substrate 10 is used as the drain-side selection gate (SGD). The word lines WL are provided in the intermediate region between the lower region and the upper region of the stacked body 100.

A slit ST and a columnar portion CL are provided inside the stacked body 100. The columnar portion CL extends in the Z-direction (the stacking direction of the stacked body 100). The slit ST extends in the Z-direction and the X-direction. For example, a source line SL is provided inside the slit ST. The source line SL is provided inside the slit ST in a state of being electrically insulated from the stacked body 100. For example, the lower end of the source line SL is electrically connected to a source region of the source-side selection transistor STS. The upper end of the source line SL is connected to a shunt interconnect 80. The shunt interconnect 80 electrically provides a shunt connection of the multiple source lines SL along the Y-direction. The lower end of the slit ST reaches the substrate 10. The slit ST electrically isolates the stacked body 100 into multiple regions along the Y-direction. For example, the separated regions are called "blocks." The block is, for example, the minimum unit of the information erase. The erase size is set to one block or is set by combining multiple blocks.

For example, the upper end of the columnar portion CL is electrically connected to a bit line BL via a contact Cb and a conductive body V1. For example, the bit line BL extends in the Y-direction crossing the slit ST.

Figure 3:
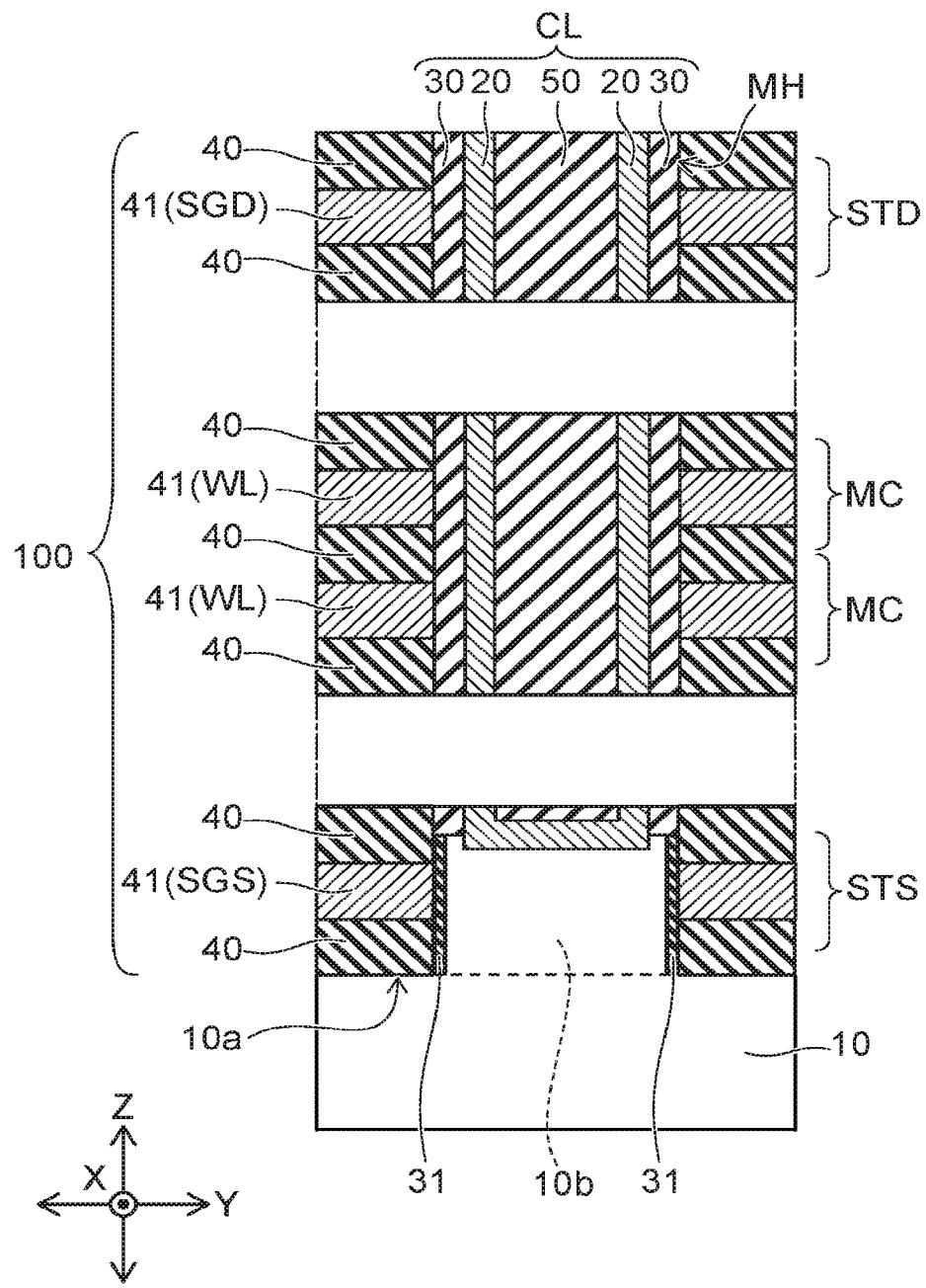
FIG. 3 is a schematic cross-sectional view showing an enlarged columnar portion.

FIG. 3 is a schematic cross-sectional view showing the enlarged columnar portion CL.

As shown in FIG. 3, a memory hole MH is provided inside the stacked body 100. The memory hole MH is an opening extending in the Z-direction. The columnar portion CL is provided inside the memory hole MH. The memory hole MH is formed in a circular columnar configuration or an elliptical columnar configuration. The lower end of the memory hole MH reaches the substrate 10.

The columnar portion CL includes a memory film 30, a semiconductor body 20, and a core layer 50. The memory film 30, the semiconductor body 20, and the core layer 50 are provided inside the memory hole MH. The memory film 30 includes a charge storage portion inside a film. The charge storage portion includes, for example, trap sites that trap charge and/or a floating gate. The threshold voltage of the memory cell MC changes due to the existence or absence of the charge or the amount of the charge inside the charge storage portion. Thereby, the memory cell MC stores information. Although not illustrated in FIG. 3, the memory film 30 includes a tunneling insulating film between the charge storage portion and the semiconductor body 20. Also, although similarly not illustrated in FIG. 3, the memory film 30 includes a blocking insulating film between the charge storage portion and the electrode layers 41. Tunneling of the charge, e.g., electrons, occurs in the tunneling insulating film when erasing the information and when programming. The memory film 30 may be removed at the portion where the electrode layer 41 used as a drain-side selection gate SGD is formed. In such a case, the gate insulating film of the drain-side selection transistor STD is formed instead of the memory film 30.

The semiconductor body 20 extends in the Z-direction. The semiconductor body 20 includes, for example, crystallized P-type silicon. For example, the semiconductor body 20 is electrically connected to the substrate 10 via a semiconductor pillar 10b. The semiconductor pillar 10b is provided at the bottom of the memory hole MH. The semiconductor pillar 10b includes, for example, crystallized P-type silicon. The semiconductor pillar 10b contacts the substrate 10 and is included in a portion of the substrate 10. For example, the semiconductor pillar 10b opposes the electrode layer 41 (the source-side selection gate SGS) with a gate insulating film 31 interposed. The semiconductor pillar 10b may be omitted. In the case where the semiconductor pillar 10b is omitted, for example, the memory film 30 and the semiconductor body 20 extend to the portion where the source-side selection transistor STS is formed; and the semiconductor body 20 directly contacts the substrate 10. The core layer 50 includes an insulating body. The core layer 50 fills the memory hole MH in which the memory film 30 and the semiconductor body 20 are provided.

Figure 4:
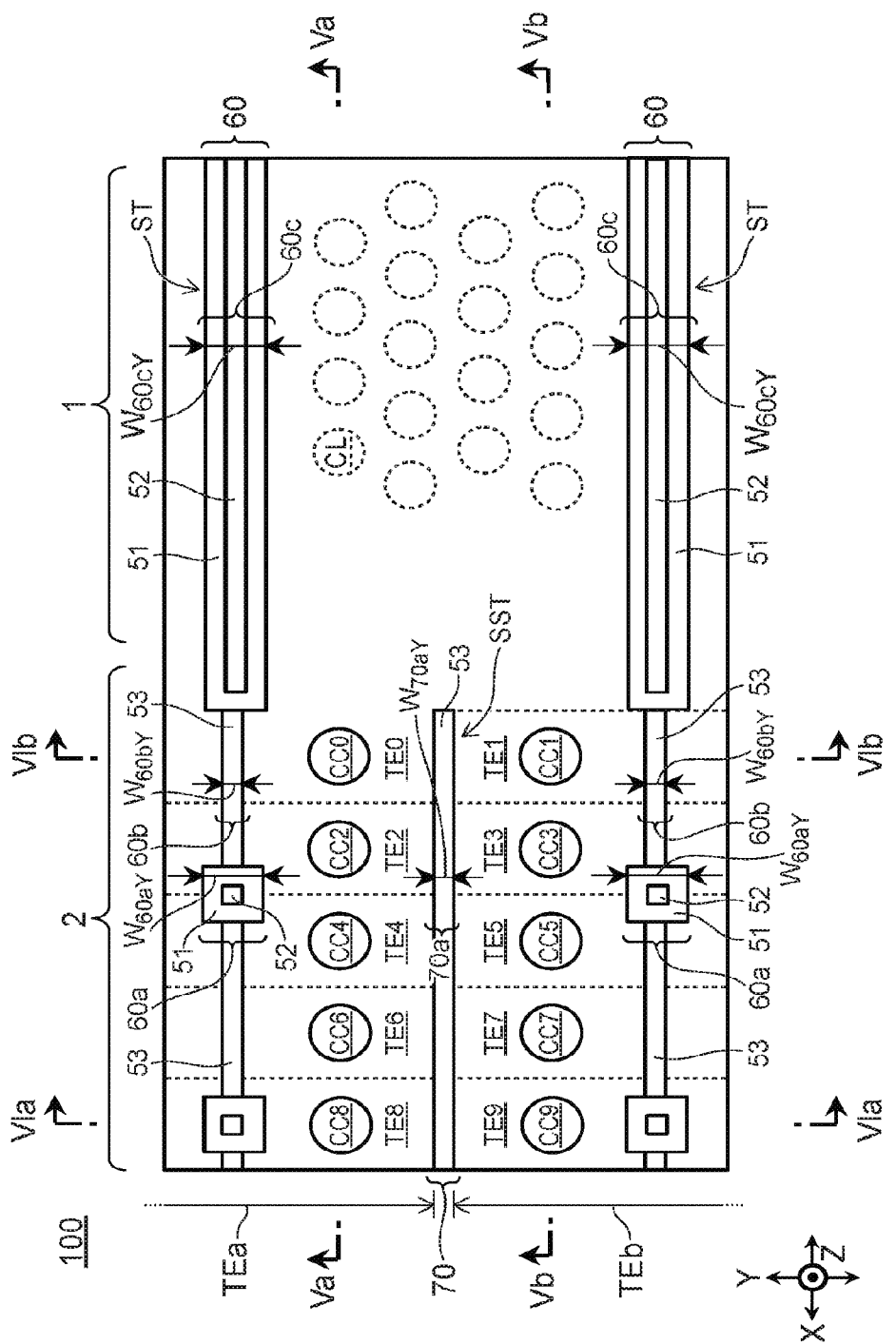
FIG. 4 is a schematic plan view of the memory cell array and a staircase portion of the semiconductor device of the first embodiment.
Figure 5A:
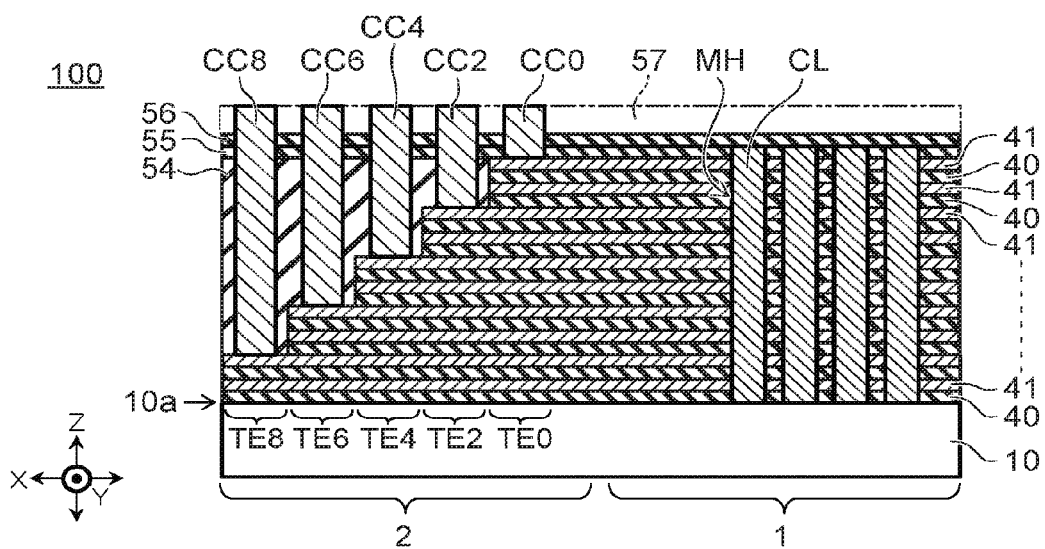
FIG. 5A is a schematic cross-sectional view along line Va-Va in FIG. 4.
Figure 5B:
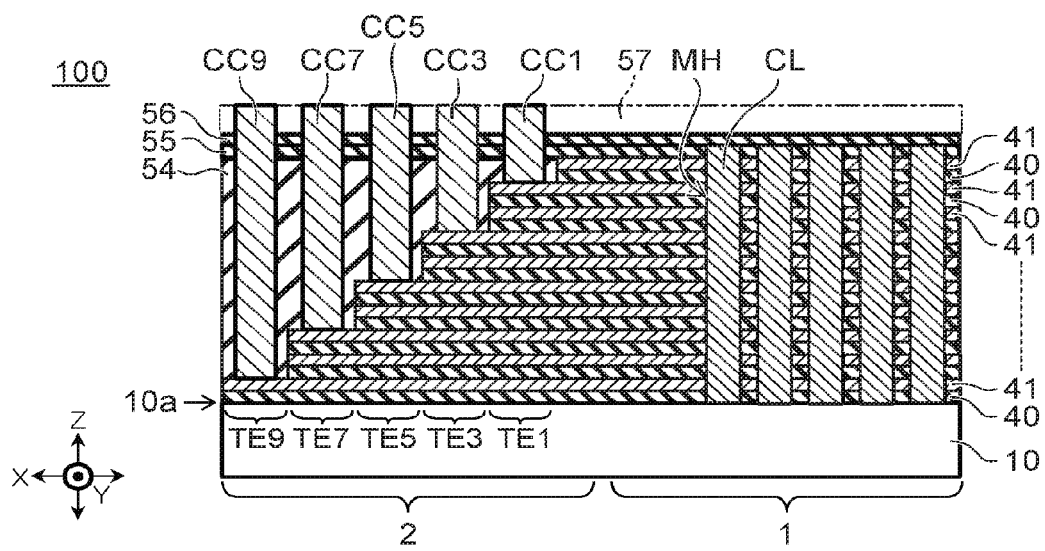
FIG. 5B is a schematic cross-sectional view along line Vb-Vb in FIG. 4.
Figure 6A:
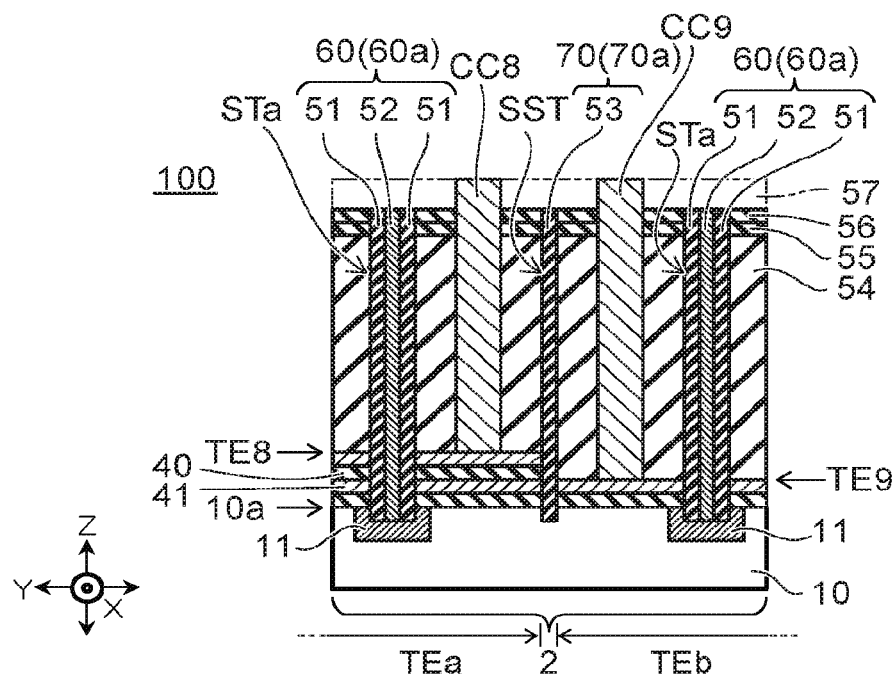
FIG. 6A is a schematic cross-sectional view along line VIa-VIa in FIG. 4.
Figure 6B:
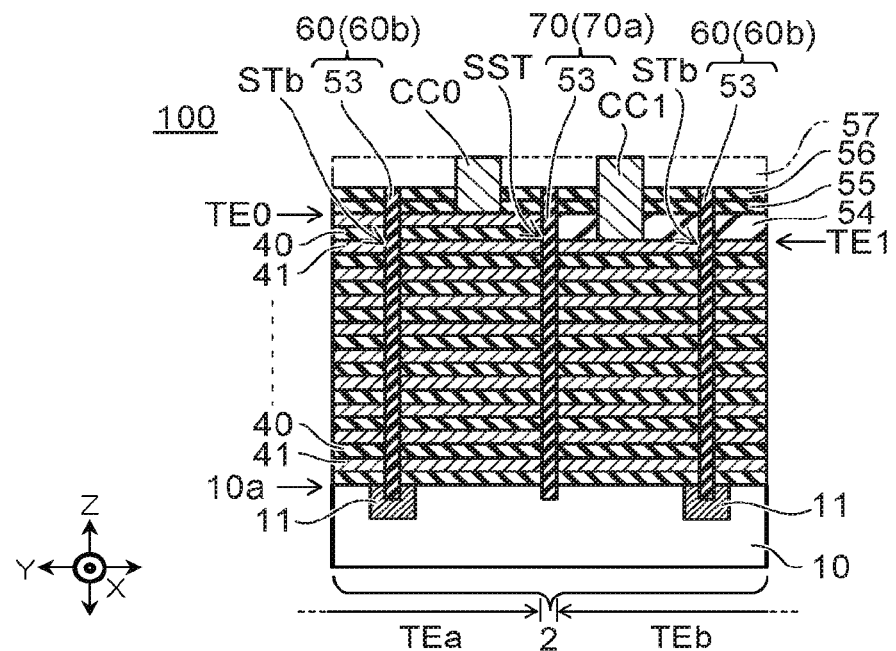
FIG. 6B is a schematic cross-sectional view along line VIb-VIb in FIG. 4.

FIG. 4 is a schematic plan view of the memory cell array and the staircase portion of the semiconductor device of the first embodiment. FIG. 5A is a schematic cross-sectional view along line Va-Va in FIG. 4. FIG. 5B is a schematic cross-sectional view along line Vb-Vb in FIG. 4. FIG. 6A is a schematic cross-sectional view along line VIa-VIa in FIG. 4. FIG. 6B is a schematic cross-sectional view along line VIb-VIb in FIG. 4.

As shown in FIG. 4 to FIG. 6B, the multiple columnar portions CL are provided in the memory cell array 1. Multiple terraces TE0 to TE9 are provided in the staircase portion 2. The terraces TE0 to TE9 are arranged along the X-direction. A first separation region 60 and a second separation region 70 are provided in the stacked body 100.

The first separation region 60 extends in the X-direction. For example, the first separation region 60 is provided inside the slit ST shown in FIG. 2. The first separation region 60 is provided in the memory cell array 1 and the staircase portion 2. The first separation region 60 pierces the stacked body 100 and reaches the substrate 10. The first separation region 60 includes a first portion 60a and a second portion 60b in the staircase portion 2. The first separation region 60 includes an array portion 60c in the memory cell array 1.

One example of the relationship between a width $W_{60aY}$ in the Y-direction of the first portion 60a, a width $W_{60bY}$ in the Y-direction of the second portion 60b, and a width $W_{60cY}$ in the Y-direction of the array portion 60c is shown below.

$$W_{60aY} > W_{60bY}$$

$$W_{60aY} \approx W_{60cY}$$

The symbol "≈" used in the specification refers to the right side and the left side being "substantially equal" or "nearly equal." Also, the wording "substantially equal" in the specification and the claims of the application is defined to refer not only to "equal" but also to include "approximately equal" or "nearly equal." For example, "substantially equal" or "nearly equal" refers to being actually the same, the design values being the same, etc.

The first portion 60a and the array portion 60c include a first insulator 51 and a first conductor 52. The second portion 60b includes a second insulator 53. An example of the first insulator 51 is silicon oxide. An example of the first conductor 52 is tungsten (W). An example of the second insulator 53 is silicon oxide. For example, the first conductor 52 functions as the source line SL. For example, an N-type semiconductor layer 11 is provided in the portion of the substrate 10 corresponding to the portion under the first separation region 60. The N-type semiconductor layer 11 also functions as the source line SL.

The second separation region 70 extends in the X-direction. The second separation region 70 is provided in the staircase portion 2. The second separation region 70 pierces the stacked body 100 and reaches the substrate 10. For example, the second separation region 70 is provided inside a short slit SST provided in the staircase portion 2. In the staircase portion 2, the second separation region 70 includes a third portion 70a.

One example of the relationship between a width $W_{70aY}$ in the Y-direction of the third portion 70a, the width $W_{60aY}$ in the Y-direction of the first portion 60a, and the width $W_{60bY}$ in the Y-direction of the second portion 60b is shown below.

$$W_{70aY} < W_{60aY}$$

$$W_{70aY} \approx W_{60bY}$$

The third portion 70a includes, for example, the second insulator 53. The first portion 60a and the third portion 70a are arranged along the Y-direction. In the first embodiment, one second separation region 70 is provided between two first separation regions 60. Therefore, the first portion 60a and the third portion 70a are arranged alternately along the Y-direction.

For example, the terraces TE0 to TE9 approach the substrate 10 in the order that the "numerals" of the reference numeral end parts increase. For example, in FIG. 4 to FIG. 6B, the terrace TE0 is the terrace of the uppermost layer; and the terrace TE9 is the terrace of the lowermost layer.

In the first embodiment, two columns of terraces are included between the two first separation regions 60 in the staircase portion 2. A first terrace column TEa includes the even-numbered terraces TE0, TE2, TE4, TE6, and TE8. A second terrace column TEb includes the odd-numbered terraces TE1, TE3, TE5, TE7, and TE9. Thus, the terraces TE0, TE2, TE4, TE6, and TE8 of the first terrace column TEa and the terraces TE1, TE3, TE5, TE7, and TE9 of the second terrace column TEb are arranged to have mutually-different positions in the Z-direction. The first terrace column TEa and the second terrace column TEb extend in the X-direction. The second separation region 70 is provided at the boundary between the first terrace column TEa and the second terrace column TEb.

A third insulator 54 is provided on the terraces TE1 to TE9. The third insulator 54 fills the "recess" occurring on the terraces TE1 to TE9. An example of the third insulator 54 is silicon oxide. A fourth insulator 55 is provided on the third insulator 54 and on the electrode layer 41 of the uppermost layer. For example, the columnar portions CL are provided to pierce the stacked body 100 from, for example, the front surface of the fourth insulator 55 to reach the substrate 10. An example of the fourth insulator 55 is silicon oxide.

A fifth insulator 56 is provided on the fourth insulator 55 and on the columnar portions CL. The fifth insulator 56 functions as a capping layer covering the columnar portions CL. For example, the first separation region 60 and the second separation region 70 are provided to pierce the stacked body 100 from the front surface of the fifth insulator 56 to reach the substrate 10. An example of the fifth insulator 56 is silicon oxide.

A sixth insulator 57 is provided on the fifth insulator 56. The sixth insulator 57 functions as a capping layer covering the first separation region 60 and the second separation region 70. An example of the sixth insulator 57 is silicon oxide.

Contacts CC0 to CC9 are provided in the sixth insulator 57. The contacts CC0 to CC9 are conductors. An example of the conductors is tungsten. The contact CC0 is electrically connected to the electrode layer 41 of the terrace TE0 through the sixth insulator 57, the fifth insulator 56, and the fourth insulator 55. The contact CC1 is electrically connected to the electrode layer 41 of the terrace TE1 through the sixth insulator 57, the fifth insulator 56, the fourth insulator 55, and the third insulator 54. Similarly hereinbelow, the contact CC9 is electrically connected to the electrode layer 41 of the terrace TE9 through the sixth insulator 57, the fifth insulator 56, the fourth insulator 55, and the third insulator 54.

FIG. 7A to FIG. 7C are schematic plan views showing a comparison of a reference example and the embodiments. FIG. 7A shows the reference example; FIG. 7B shows the basic configuration of the embodiments; and FIG. 7C shows the configuration of the first embodiment.

The reference example shown in FIG. 7A is an example in which dummy posts HR are included in the staircase portion 2. In the replacement process, the sacrificial layers that are provided between the insulating bodies 40 are replaced with the electrode layers 41. The sacrificial layers are removed via the slit ST. A "space" occurs between the insulating bodies 40 when the sacrificial layers are removed. The insulating bodies 40 may sag when the space occurs. The dummy posts HR suppress the sagging of the insulating bodies 40 in the staircase portion 2 in the "replace process."

However, as shown in FIG. 7A, a region for providing the dummy posts HR must be ensured in the terraces TE0 to TE3. Therefore, the planar surface area of the terraces TE0 to TE3 easily becomes large. Accordingly, in the reference example, it is difficult to reduce the width in the X-direction of the staircase portion 2.

Compared to the reference example, in the embodiment as shown in FIG. 7B, a region STa and a region STb that has a narrower width in the Y-direction than the region STa are provided in the slit ST in the staircase portion 2. Further, the short slit SST is provided in the staircase portion 2. In the "replace process," it is possible to pre-fill the second insulator 53 into the region STb and the short slit SST.

The region STb that is filled with the second insulator 53 corresponds to the second portion 60b shown in FIG. 4, etc. Similarly, the short slit SST that is filled with the second insulator 53 corresponds to the third portion 70a shown in FIG. 4, etc. The second portion 60b and the third portion 70a that are filled with the second insulator 53 are used as support walls in the "replace process." Thereby, the sagging of the insulating bodies 40 in the staircase portion 2 can be suppressed. The region STa remains an opening in the "replace process." In the embodiment, the replacement in the staircase portion 2 can be performed via the region STa remaining as the opening.

As shown in FIG. 7B, in the "replace process" of the embodiment, the dummy posts HR are unnecessary because the second portion 60b and the third portion 70a filled with the second insulator 53 can be utilized as the support walls. Therefore, compared to the reference example, the embodiment can reduce the planar surface area of the terraces TE0 to TE3. Accordingly, compared to the reference example, the width in the X-direction of the staircase portion 2 can be reduced in the embodiment.

Further, in the first embodiment as shown in FIG. 7C, the first terrace column TEa that includes the even-numbered terraces TE0 and TE2 and the second terrace column TEb that includes the odd-numbered terraces TE1 and TE3 are included between two slits ST. For example, the first terrace column TEa and the second terrace column TEb are provided in the staircase portion 2 of the embodiment with the short slit SST as a boundary. Thereby, it is also possible to further reduce the width in the X-direction of the staircase portion 2 of the embodiment.

<Manufacturing Method>

FIG. 8A to FIG. 8M are schematic plan views showing a method for manufacturing the semiconductor device of the first embodiment. FIG. 9A, FIG. 9C, FIG. 9E, and FIG. 9G are schematic cross-sectional views along line Va-Va in FIGS. 8A to 8D. FIG. 9B, FIG. 9D, FIG. 9F, and FIG. 9H are schematic cross-sectional views along line Vb-Vb in FIGS. 8A to 8D. FIG. 10A, FIG. 10C, FIG. 10E, FIG. 10G, FIG. 10I, FIG. 10K, FIG. 10M, FIG. 10O, and FIG. 10Q are schematic cross-sectional views along line VIa-VIa in FIG. 8E to FIG. 8M. FIG. 10B, FIG. 10D, FIG. 10F, FIG. 10H, FIG. 10J, FIG. 10L, FIG. 10N, FIG. 10P, and FIG. 10R are schematic cross-sectional views along line VIb-VIb in FIG. 8E to FIG. 8M.

1. Formation of the Stacked Body 100

Figure 8A:
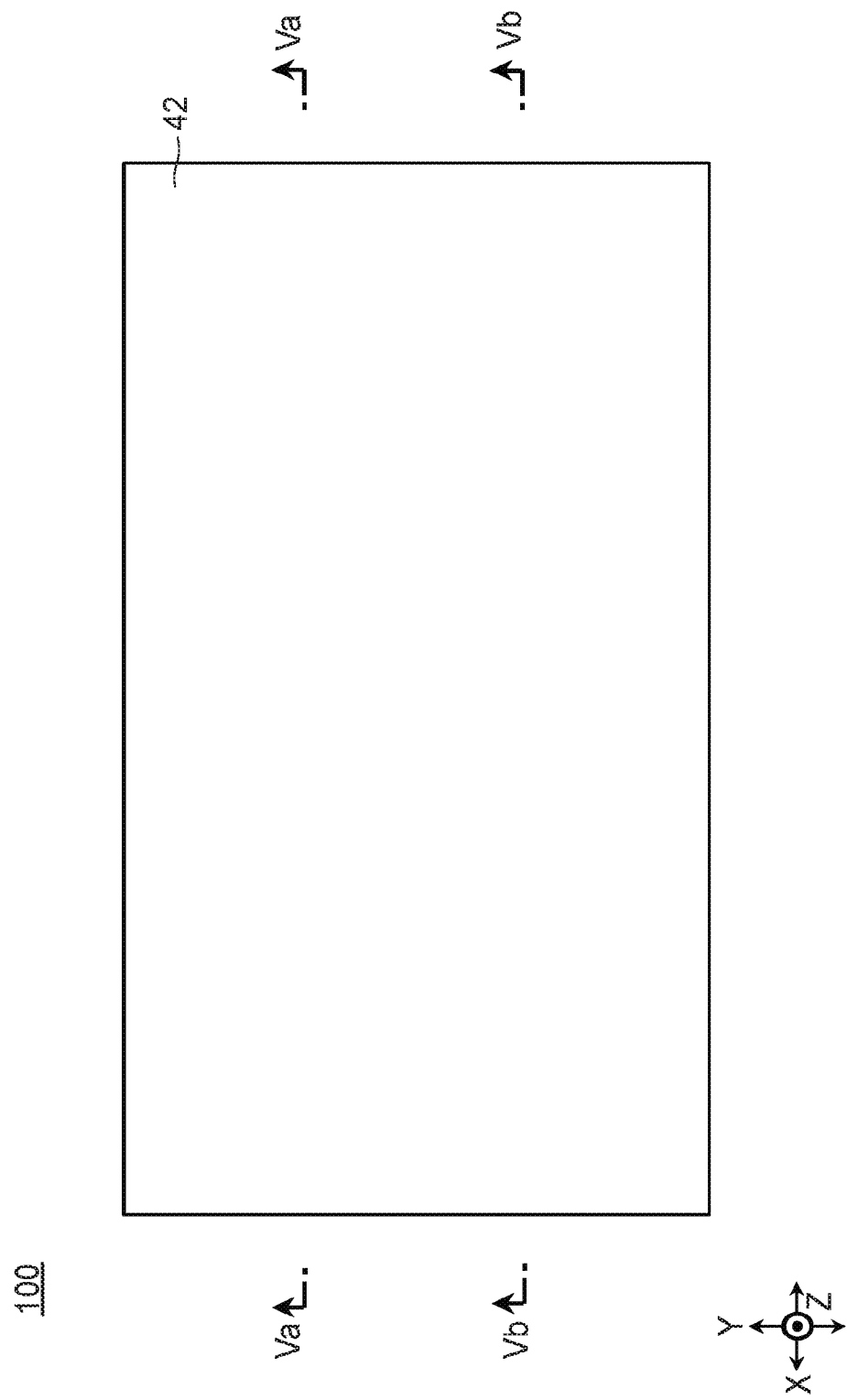
Figure 9A:
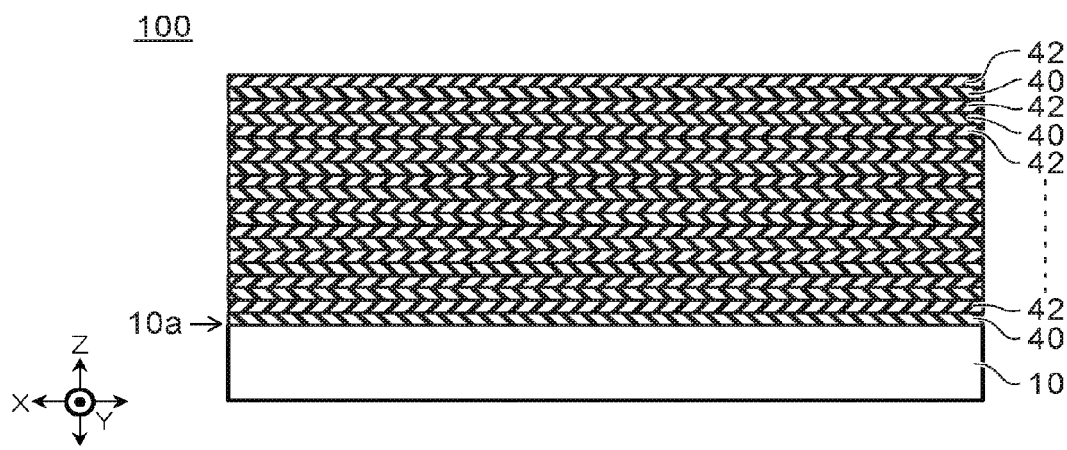
FIG. 9A, FIG. 9C, FIG. 9E, and FIG. 9G are schematic cross-sectional views along line Va-Va in FIGS. 8A to 8D.
Figure 9B:
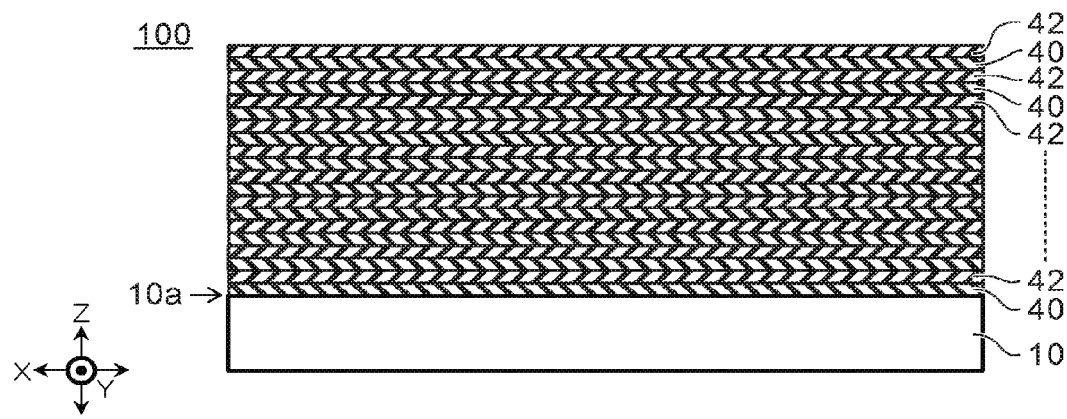
FIG. 9B, FIG. 9D, FIG. 9F, and FIG. 9H are schematic cross-sectional views along line Vb-Vb in FIGS. 8A to 8D.

As shown in FIG. 8A, FIG. 9A, and FIG. 9B, the stacked body 100 is formed on the major surface 10a of the substrate 10. The stacked body 100 is formed by alternately stacking the insulating body 40 and a sacrificial layer 42. The material of the insulating body 40 and the material of the sacrificial layer 42 are different from each other. For example, in the case where silicon oxide is selected as the material of the insulating body 40, for example, silicon nitride is selected as the material of the sacrificial layer 42.

2. Formation of the Staircase Portion 2

Figure 8B:
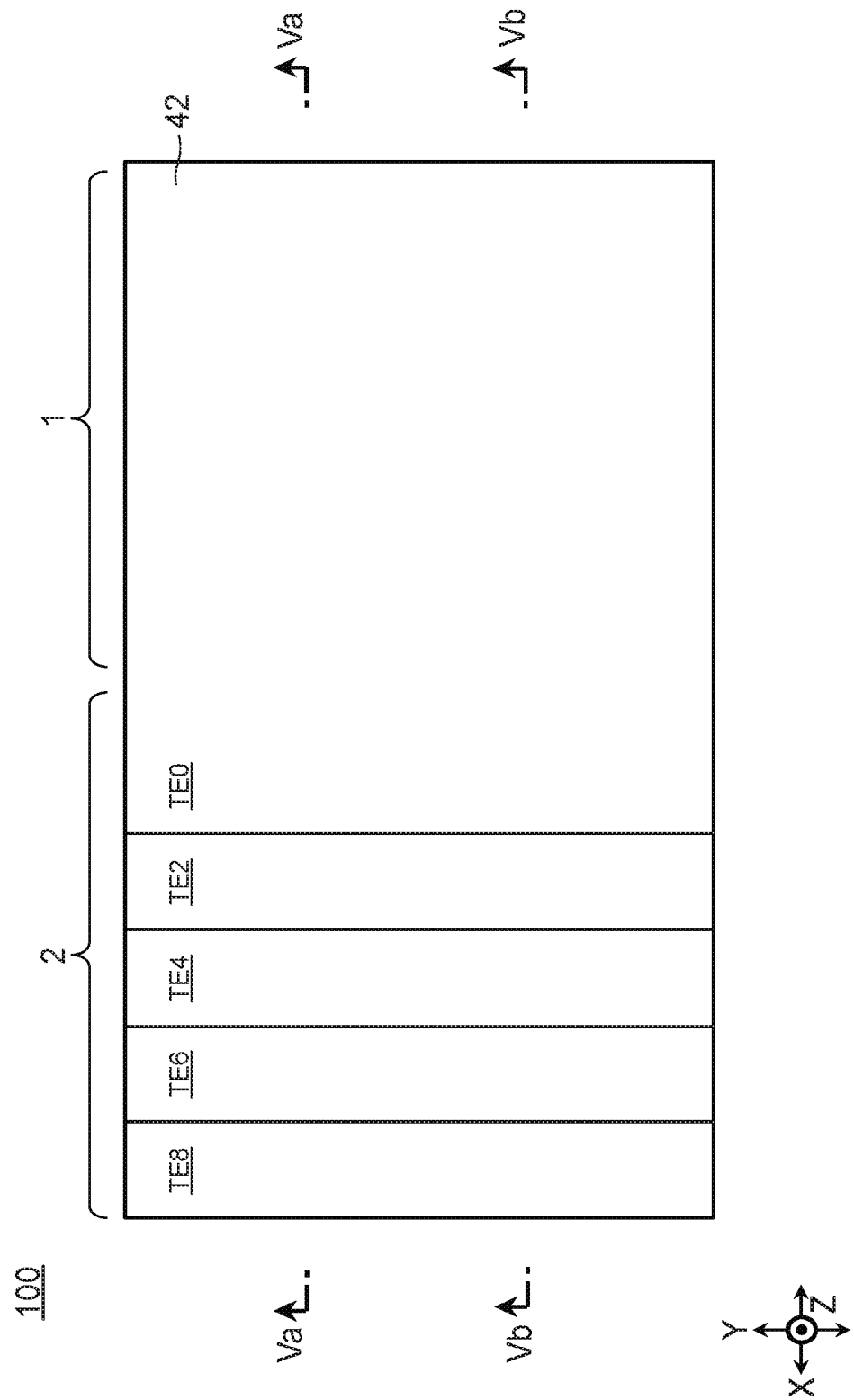
Figure 9C:
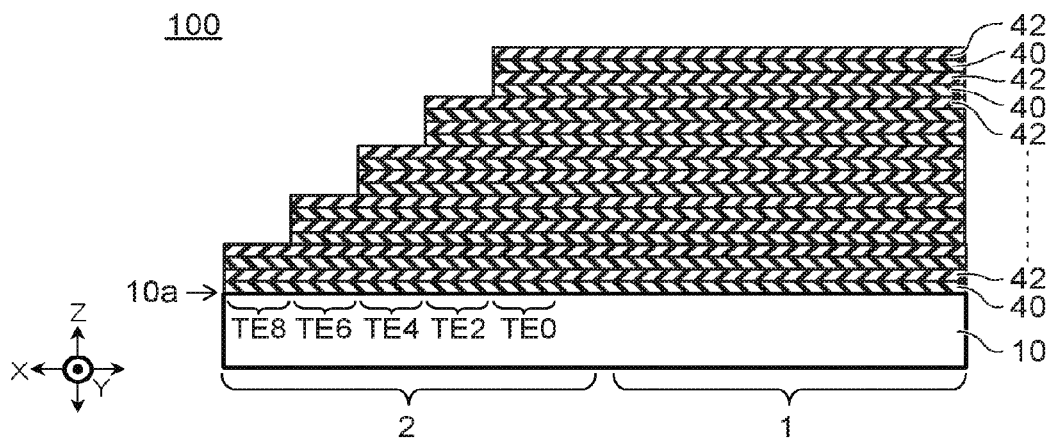
Figure 9D:
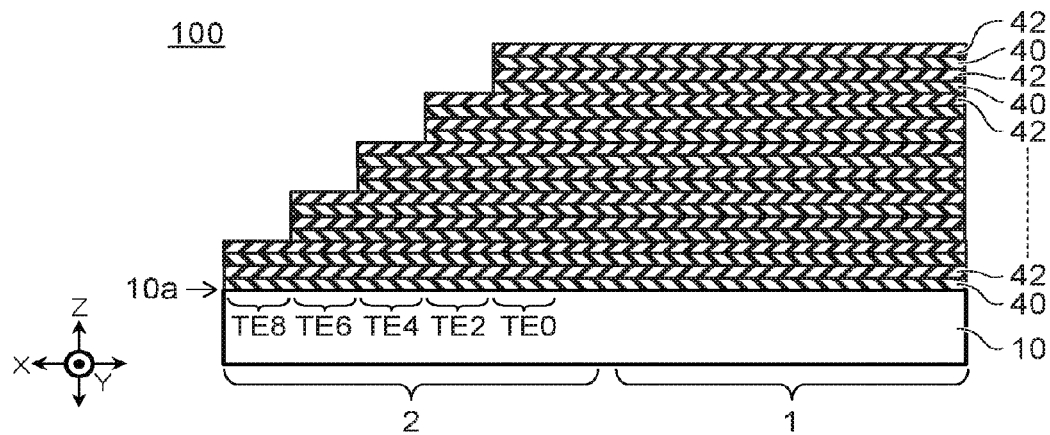

As shown in FIG. 8B, FIG. 9C, and FIG. 9D, the staircase portion 2 is formed in the end portion region of the stacked body 100. For example, the staircase portion 2 can be formed by using resist slimming, etc. In the first embodiment, the staircase portion 2 is etched to include, each time, two levels of the sacrificial layer 42 and two levels of the insulating body 40. Thereby, the even-numbered terraces TE0, TE2, TE4, TE6, and TE8 are obtained in the staircase portion 2.

Figure 8C:
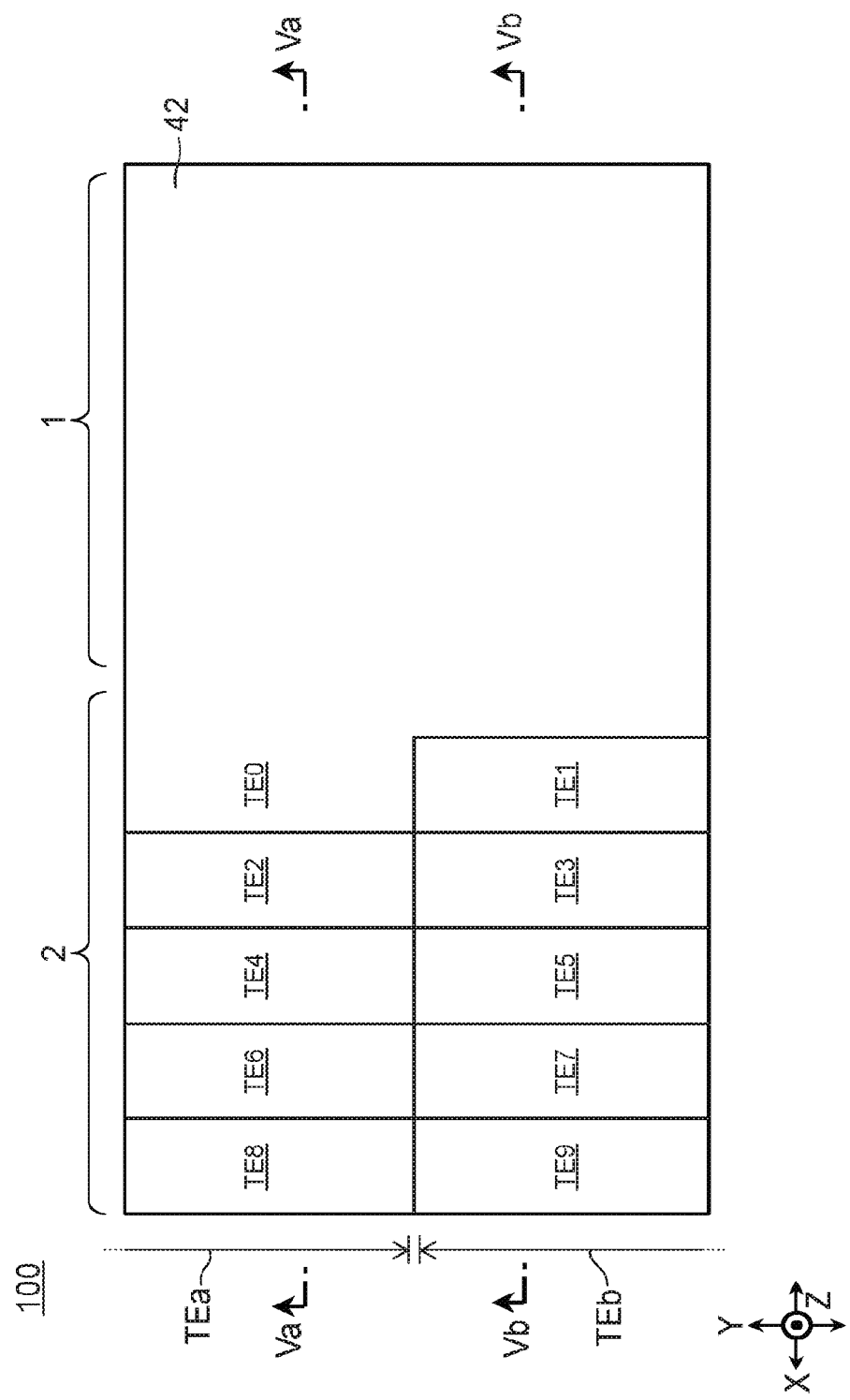
Figure 9E:
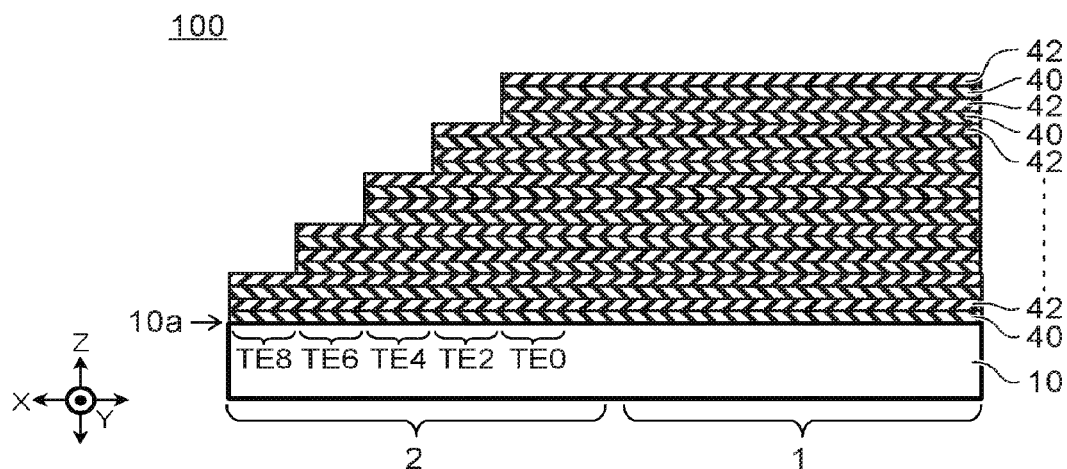
Figure 9F:
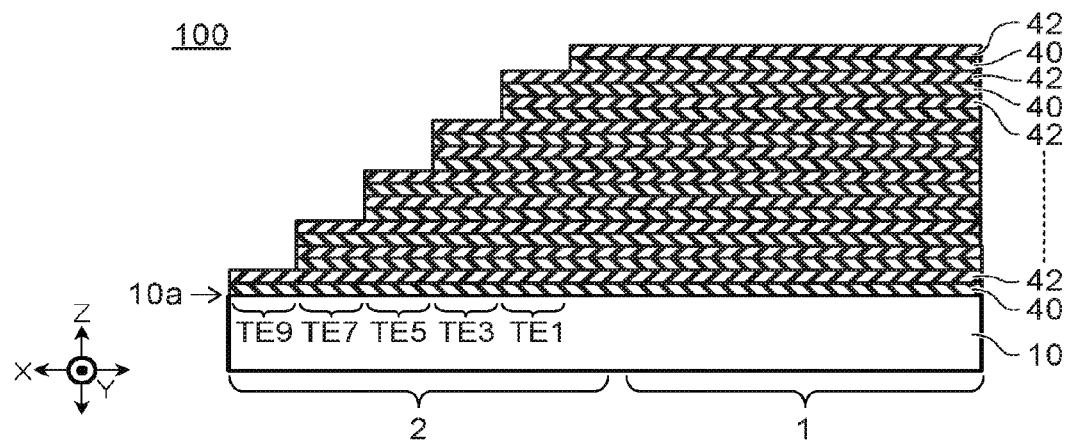

Then, as shown in FIG. 8C, FIG. 9E, and FIG. 9F, the odd-numbered terraces TE1, TE3, TE5, TE7, and TE9 are formed in the staircase portion 2. For example, the odd-numbered terraces TE1, TE3, TE5, TE7, and TE9 are formed by etching, each time, one level of the sacrificial layer 42 and one level of the insulating body 40 from the even-numbered terraces TE0, TE2, TE4, TE6, and TE8. The odd-numbered terraces TE1, TE3, TE5, TE7, and TE9 also can be formed by using, for example, resist mask. Thereby, the terraces TE0 to TE9 are formed in the staircase portion 2.

3. Burying of the Staircase Portion 2 and Formation of the Columnar Portions CL

Figure 8D:
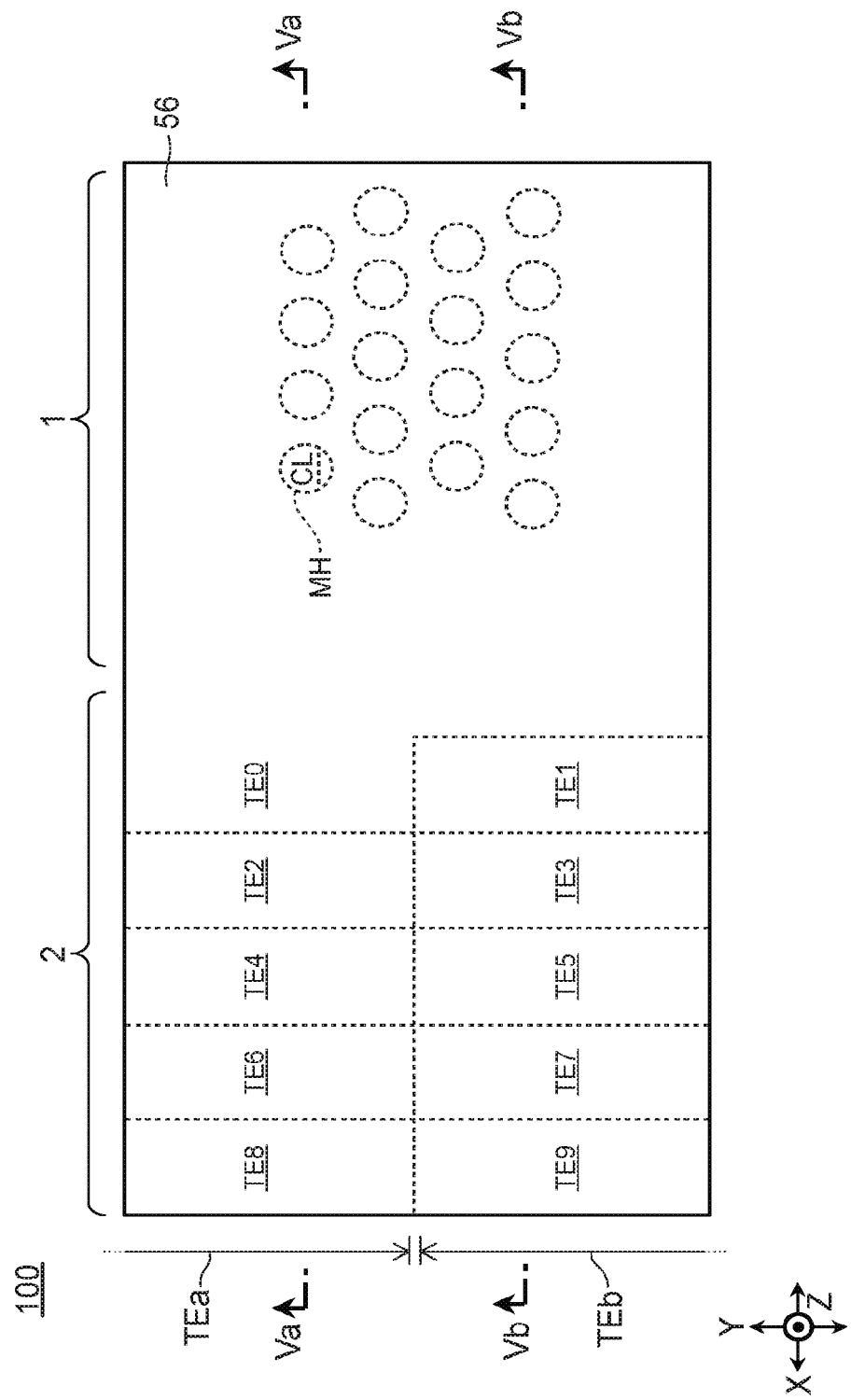
Figure 9G:
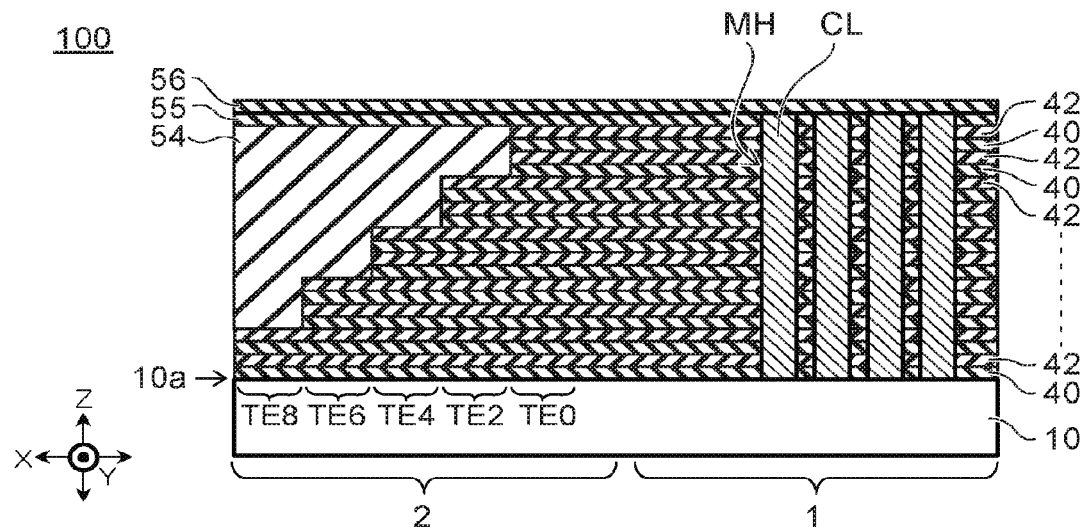
Figure 9H:
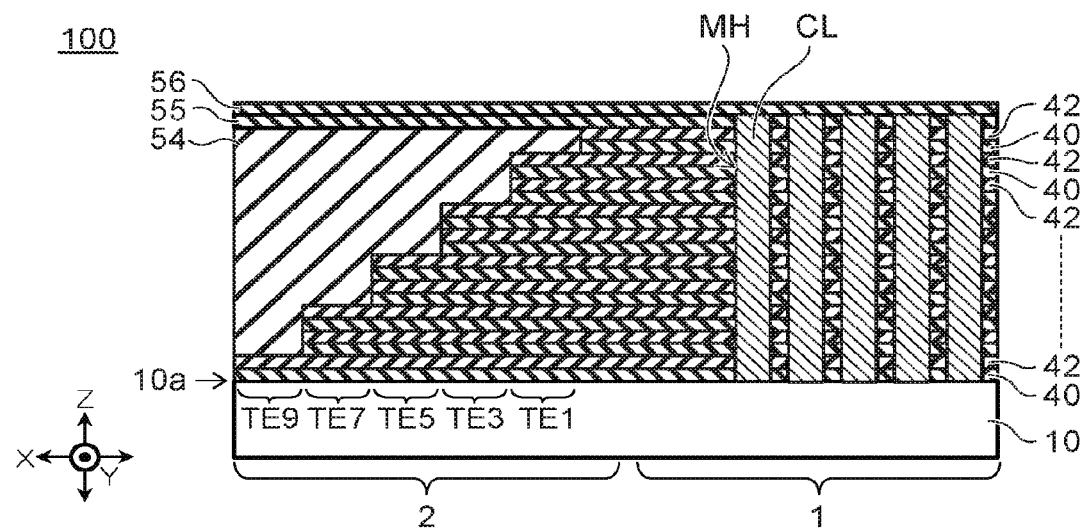

As shown in FIG. 8D, FIG. 9G, and FIG. 9H, the staircase portion 2 is buried in the third insulator 54. Thereby, the recess that occurs on the staircase portion 2 is filled with the third insulator 54. The third insulator 54 is formed by depositing an insulating film including, for example, silicon oxide on the structure body shown in FIG. 8C, FIG. 9E, and FIG. 9F and using CMP to planarize the insulating film to fill the recess occurring in the staircase portion 2.

Then, the fourth insulator 55 is formed on the third insulator 54 and the electrode layer 41 of the uppermost layer. Thereby, the third insulator 54 and the electrode layer 41 of the uppermost layer are covered with the fourth insulator 55. The fourth insulator 55 is, for example, silicon oxide.

Then, the columnar portions CL are formed in the stacked body 100. For example, in the case where the columnar portions CL shown in FIG. 3 are formed, summarily, it is sufficient to perform the following processes.

The memory hole MH is formed inside the fourth insulator 55 and the stacked body 100. The memory hole MH is formed in the memory cell array 1 to reach, for example, the substrate 10. Then, the semiconductor pillar 10b is formed by using, for example, CVD on the substrate 10 exposed at the bottom of the memory hole MH. For example, the semiconductor pillar 10b is formed on the substrate 10 to the height position of the insulating body 40 between the source-side selection gate SGS and the word lines WL (referring to FIG. 3).

Then, the memory film 30 is formed inside the memory hole MH. Then, the bottom of the memory film 30 is etched; and the surface of the semiconductor pillar 10b is exposed.

Then, the semiconductor body 20 is formed. Then, the memory hole MH is filled by forming the core layer 50 (referring to FIG. 3). Thus, the columnar portion CL is formed inside the memory hole MH.

Then, the fifth insulator 56 is formed on the fourth insulator 55 and the columnar portions CL. Thereby, the upper surfaces of the columnar portions CL are covered with the fifth insulator 56.

4. Formation of the Slit ST and the Short Slit SST

Figure 8E:
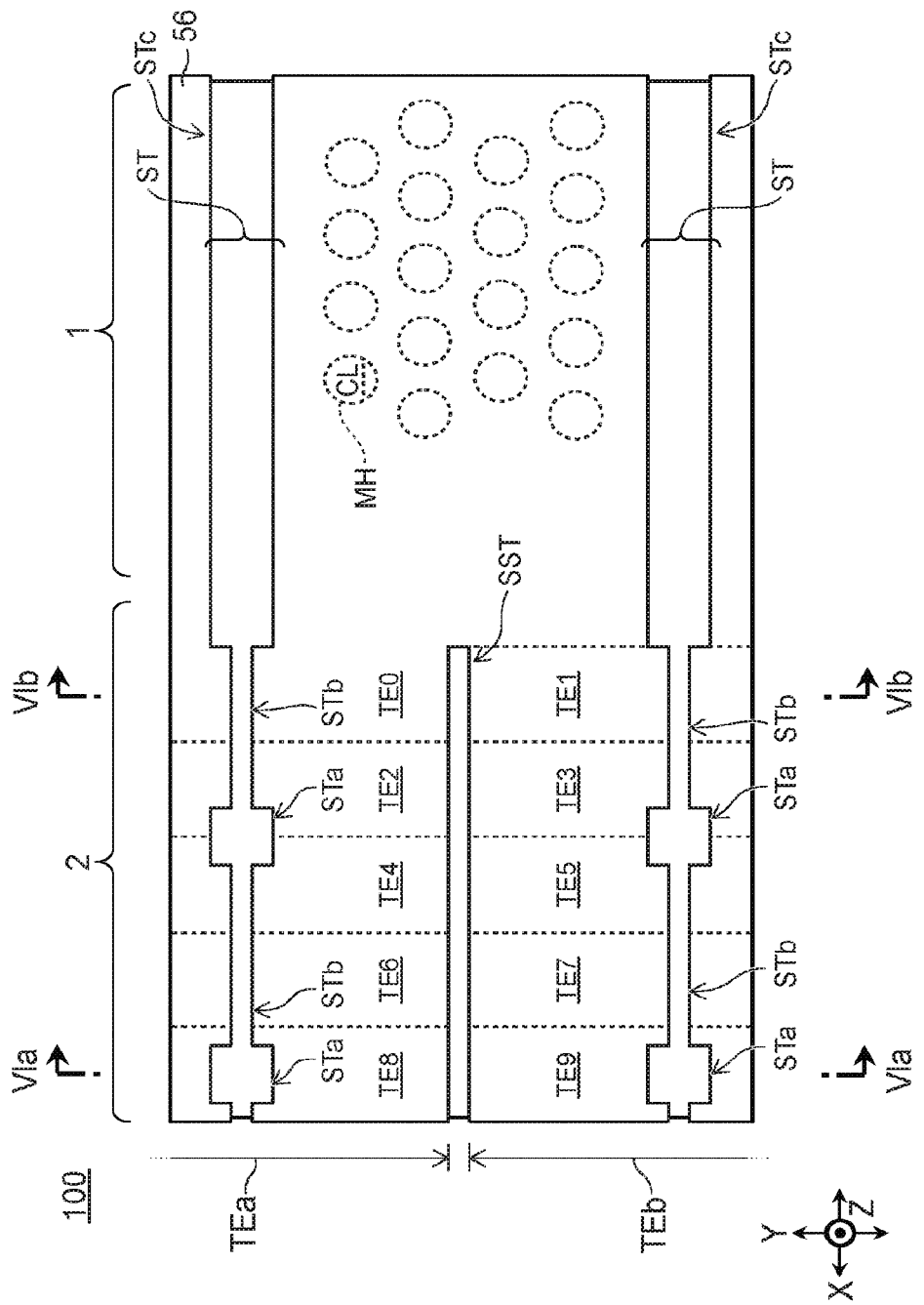
Figure 10A:
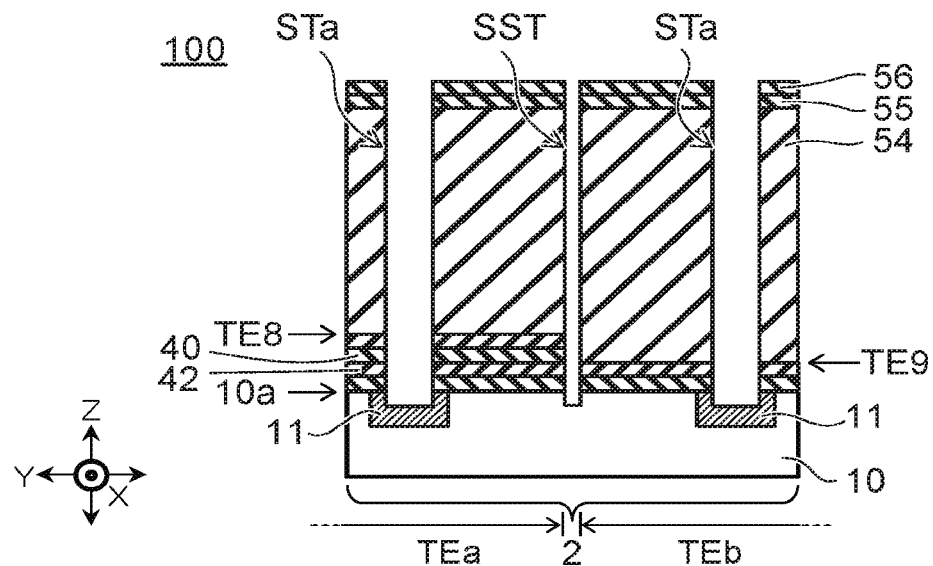
FIG. 10A, FIG. 10C, FIG. 10E, FIG. 10G, FIG. 10I, FIG. 10K, FIG. 10M, FIG. 10O, and FIG. 10Q are schematic cross-sectional views along line VIa-VIa in FIG. 8E to FIG. 8M.
Figure 10B:
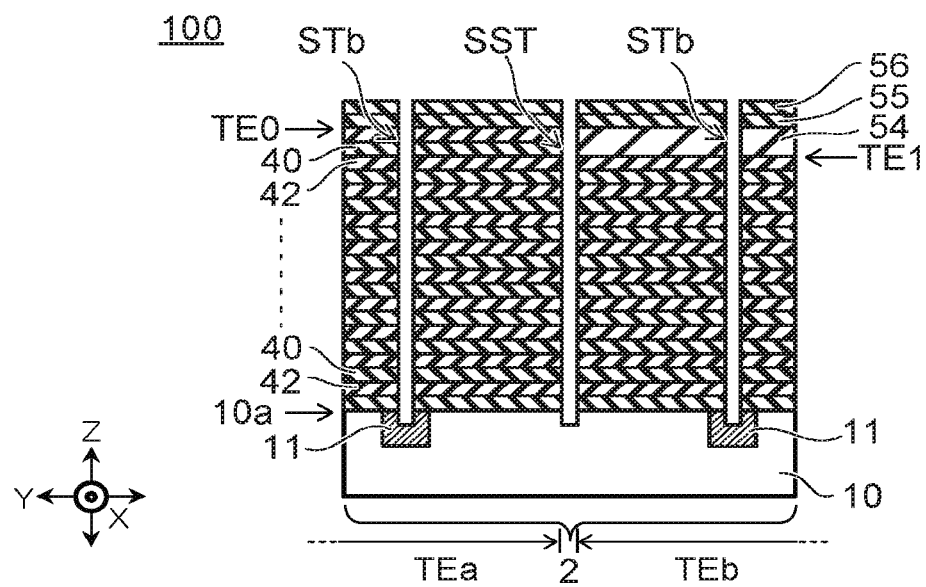
FIG. 10B, FIG. 10D, FIG. 10F, FIG. 10H, FIG. 10J, FIG. 10L, FIG. 10N, FIG. 10P, and FIG. 10R are schematic cross-sectional views along line VIb-VIb in FIG. 8E to FIG. 8M.

As shown in FIG. 8E, FIG. 10A, and FIG. 10B, the slit ST is formed inside the stacked body 100. The slit ST is formed in the memory cell array 1 and the staircase portion 2. The slit ST is formed to pierce the stacked body 100 to reach, for example, the substrate 10. The region STa, the region STb, and a region STc are provided in the slit ST. The regions STa and STb are provided in the staircase portion 2; and the region STc is provided in the memory cell array 1. In the first embodiment, the width in the Y-direction of the region STb is narrower than the width in the Y-direction of the region STa. Similarly, the width in the Y-direction of the region STa is substantially equal to the width in the Y-direction of the region STc.

Then, an impurity of the N-type is introduced to the substrate 10 via the slit ST. Thereby, the N-type semiconductor layer 11 is formed inside the substrate 10.

Then, the short slit SST is formed inside the stacked body 100. In the embodiment, the slit ST is formed in the staircase portion 2. The short slit SST is formed to pierce the stacked body 100 to reach, for example, the substrate 10.

5. Formation of the Second Portion 60b and the Third Portion 70a

Figure 10C:
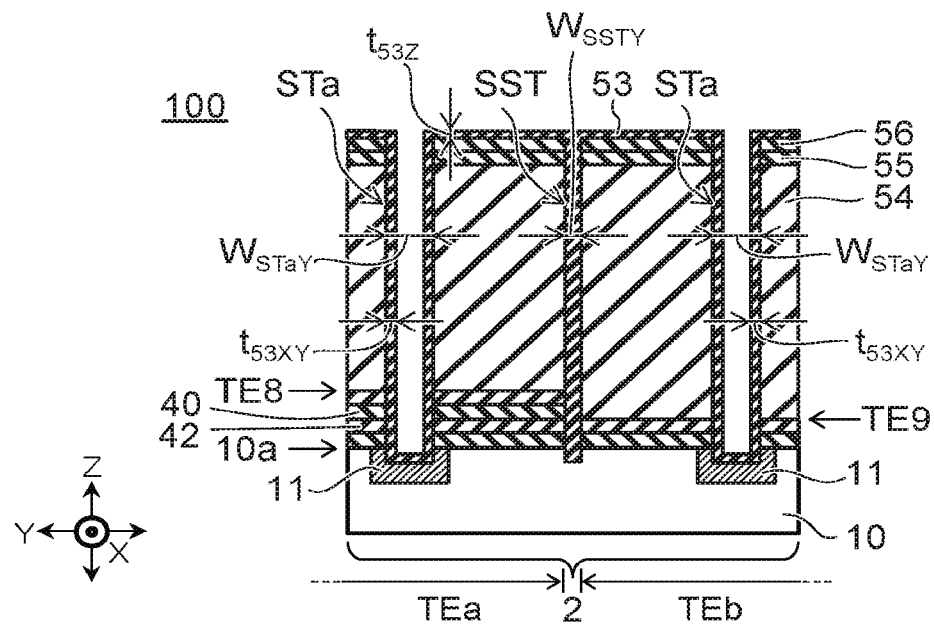
Figure 10D:
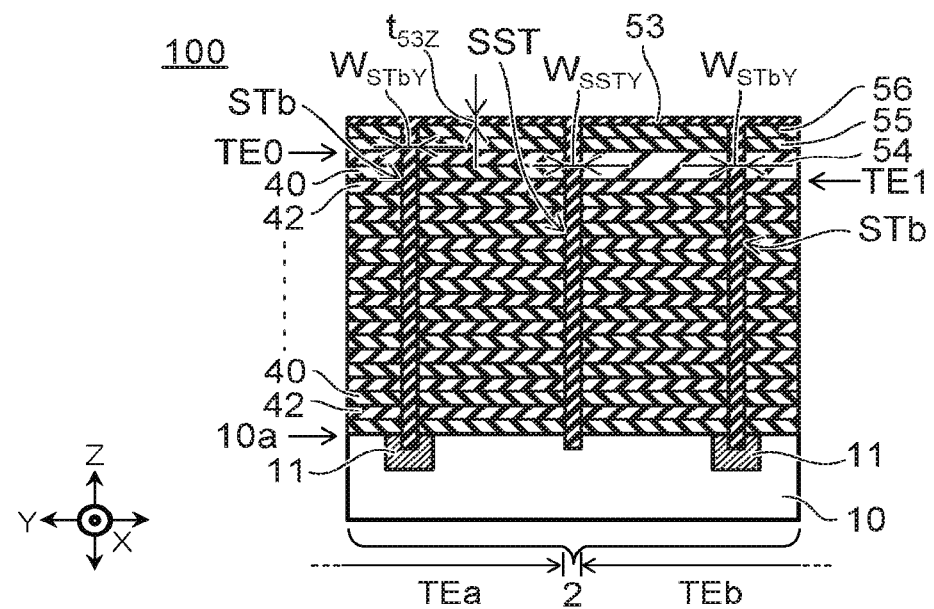

As shown in FIG. 8F, FIG. 10C, and FIG. 10D, the second insulator 53 is formed on the structure body shown in FIG. 8E, FIG. 10A, and FIG. 10B. The second insulator 53 is, for example, silicon oxide. For example, a film thickness $t_{53Z}$ in the Z-direction of the second insulator 53 is set as follows.

$$W_{STaY}/2 > t_{53Z} \geq W_{SSTY}/2 \qquad (1)$$

In Formula (1), "$W_{STaY}$" is the width in the Y-direction of the region STa. "$W_{SSTY}$" is the width in the Y-direction of the short slit SST.

In the first embodiment, the relationship between the width $W_{STaY}$ and a width $W_{STcY}$ in the Y-direction of the region STc is, for example, as follows.

$$W_{STaY} \approx W_{STcY}$$

Similarly, the relationship between the width $W_{SSTY}$ and a width $W_{STbY}$ in the Y-direction of the region STb is, for example, as follows.

$$W_{SSTY} \approx W_{STbY}$$

For example, it is considered that the film thickness $t_{53Z}$ in the Z-direction of the second insulator 53 is substantially equal to a film thickness $t_{53XY}$ in the XY-plane direction of the second insulator 53 ($t_{53Z} \approx t_{53XY}$). In such a case, if the film thickness $t_{53Z}$ in the Z-direction of the second insulator 53 satisfies the condition of Formula (1), the region STb and the short slit SST can be filled with the second insulator 53 without the regions STa and STc being plugged by the second insulator 53.

Figure 8G:
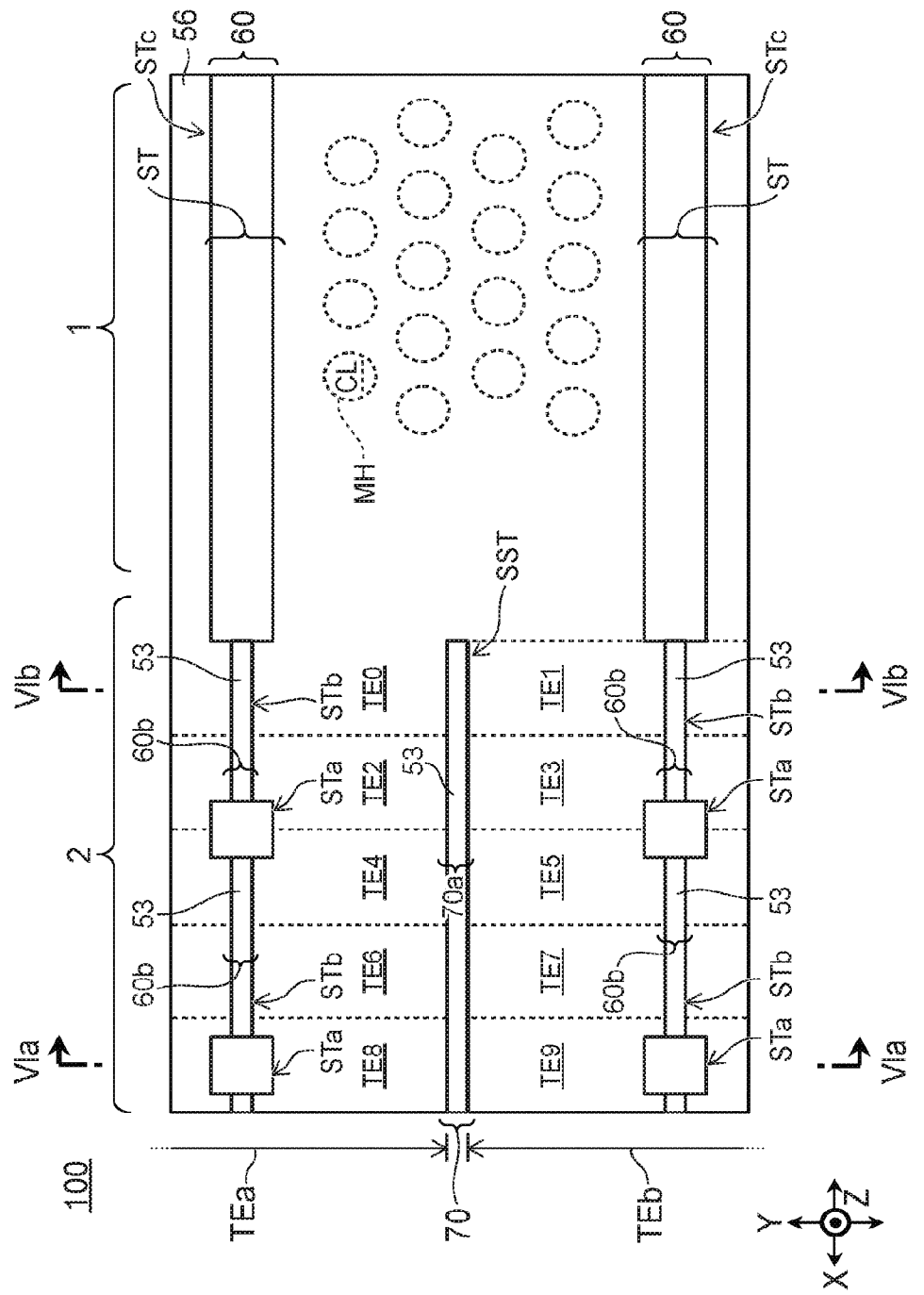
Figure 10E:
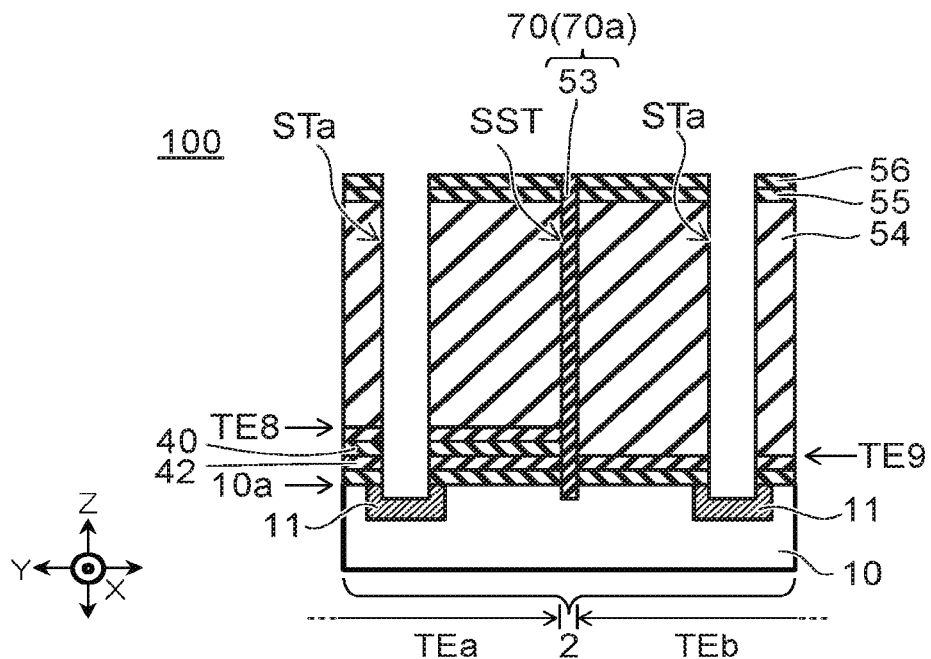
Figure 10F:
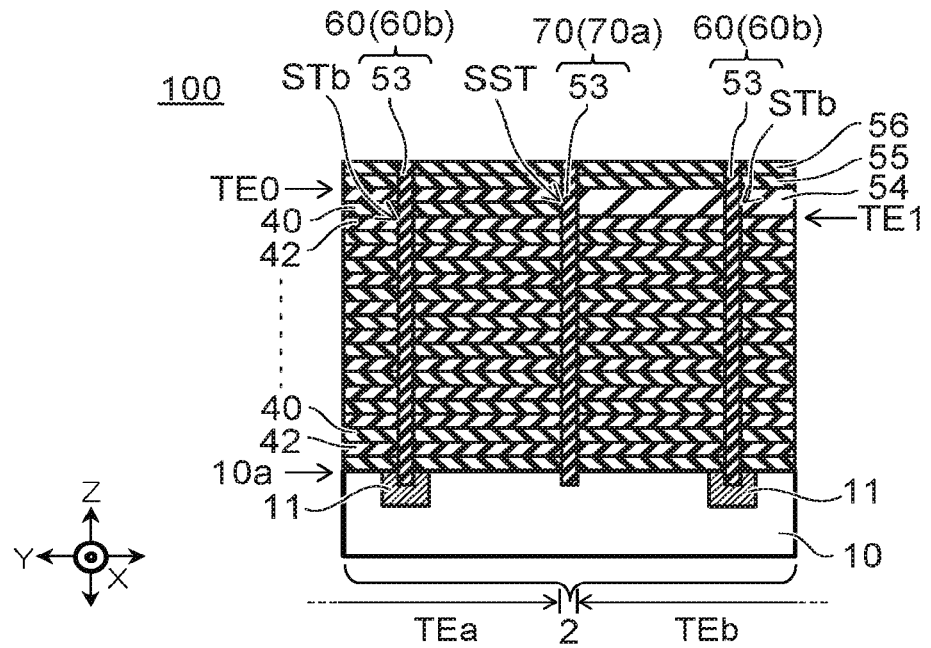

Then, as shown in FIG. 8G, FIG. 10E and FIG. 10F, the second insulator 53 is etched using, for example, isotropic etching; and the second insulator 53 is caused to remain inside the region STb and the short slit SST. One example of the isotropic etching is wet etching using BHF (Buffered Hydrogen Fluoride) and/or DHF (Diluted Hydrogen Fluoride). Thereby, the second portion 60b of the first separation region 60 and the third portion 70a of the second separation region 70 shown in FIG. 4, FIG. 6A, and FIG. 6B are formed respectively in the region STb and the short slit SST. The regions STa and STc are openings at the stage shown in FIG. 8G, FIG. 10E, and FIG. 10F.

6. Replacement (Formation of a Space 43)

Figure 8H:
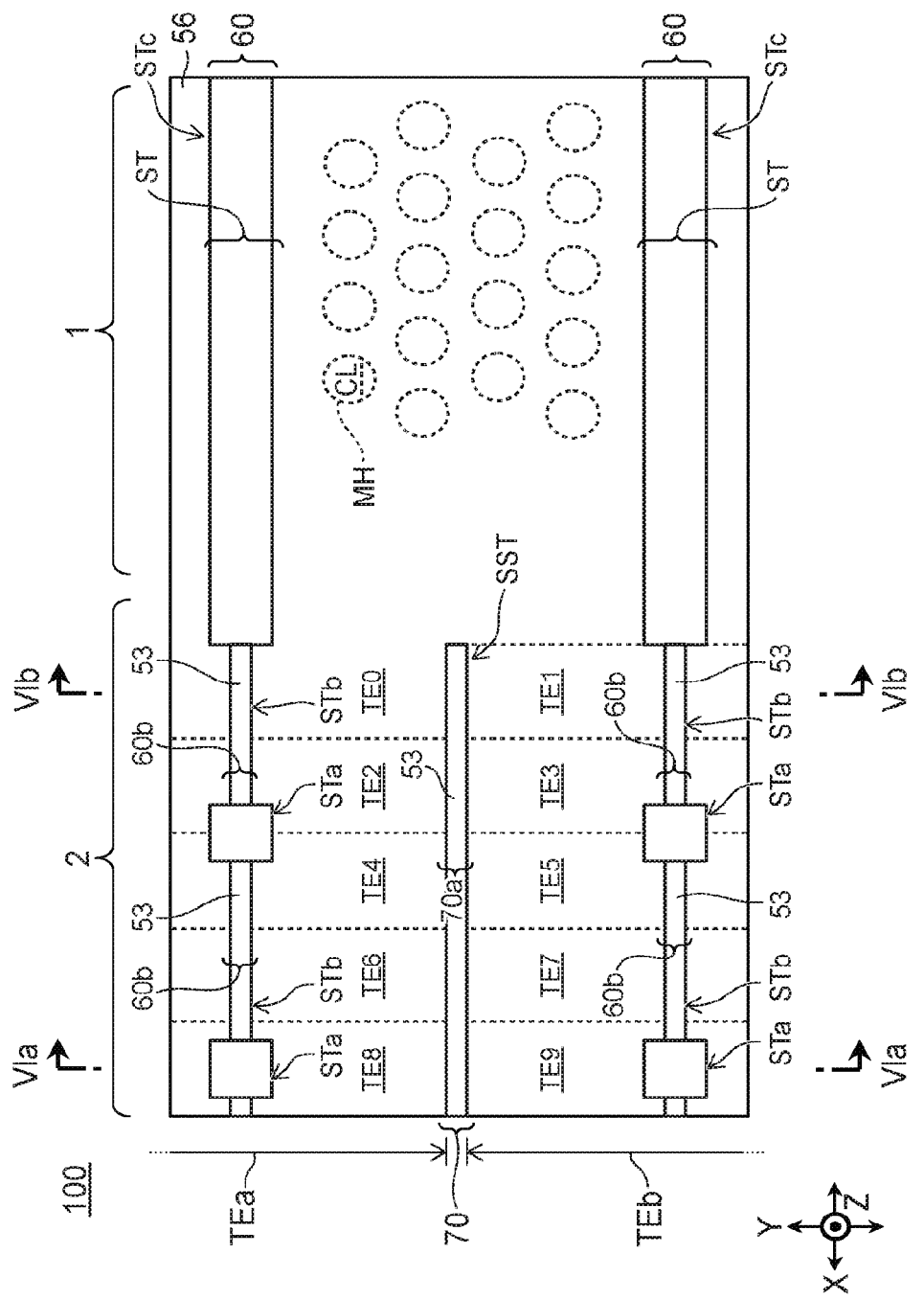
Figure 10G:
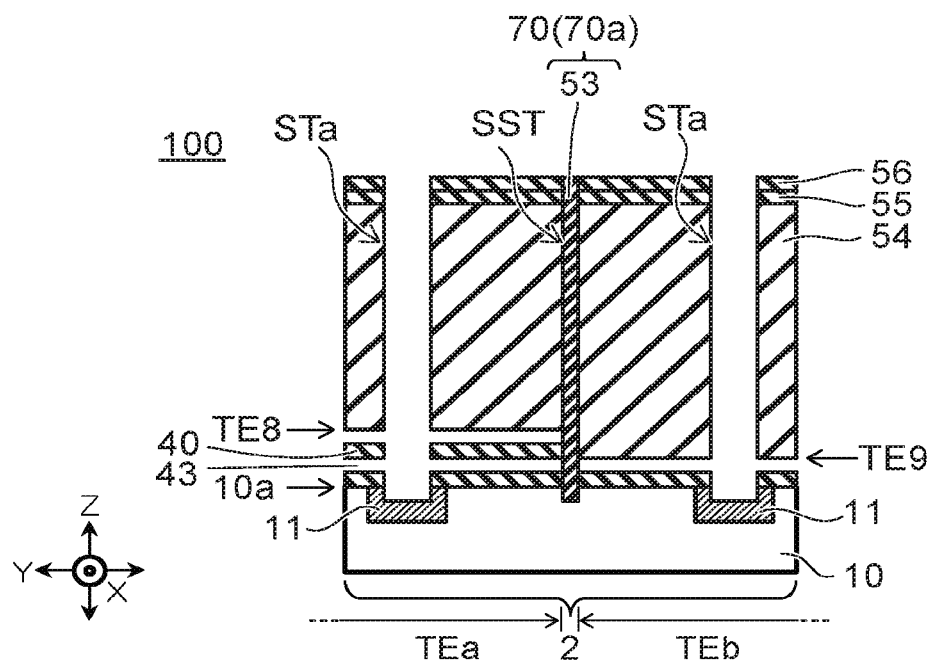
Figure 10H:
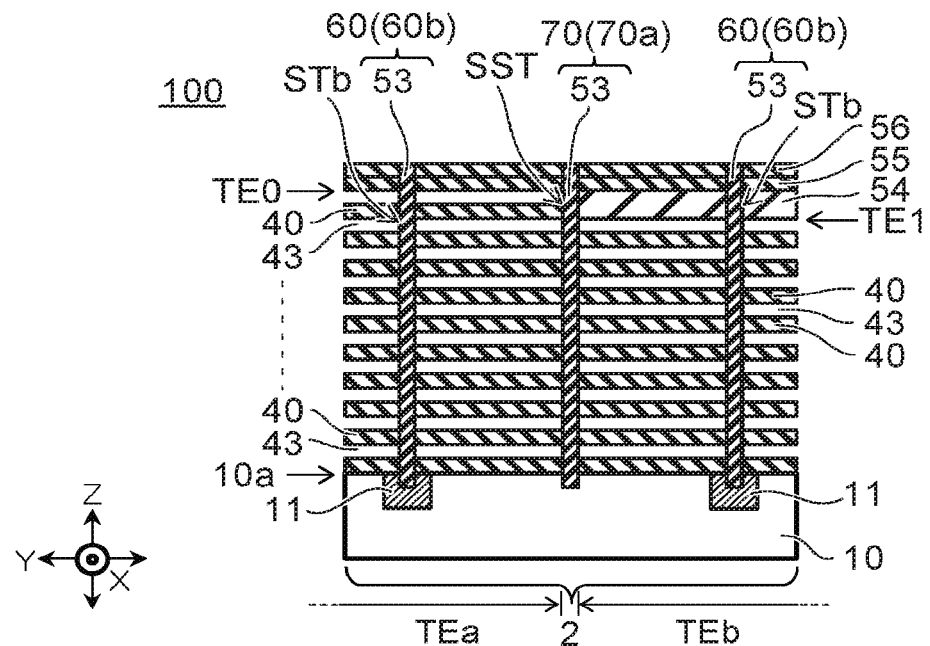

As shown in FIG. 8H, FIG. 10G, and FIG. 10H, the sacrificial layers 42 are removed via the regions STa and STc by using isotropic etching. One example of the isotropic etching is wet etching using phosphoric acid. Thereby, the space 43 is formed between the insulating body 40 and the insulating body 40. In the replacement process, the second portion 60b and the third portion 70a that are filled with the second insulator 53 are used as support walls and support the insulating bodies 40. Thereby, the sagging of the insulating bodies 40 is suppressed.

7. Replacement (Formation of the Electrode Layers 41)

Figure 8I:
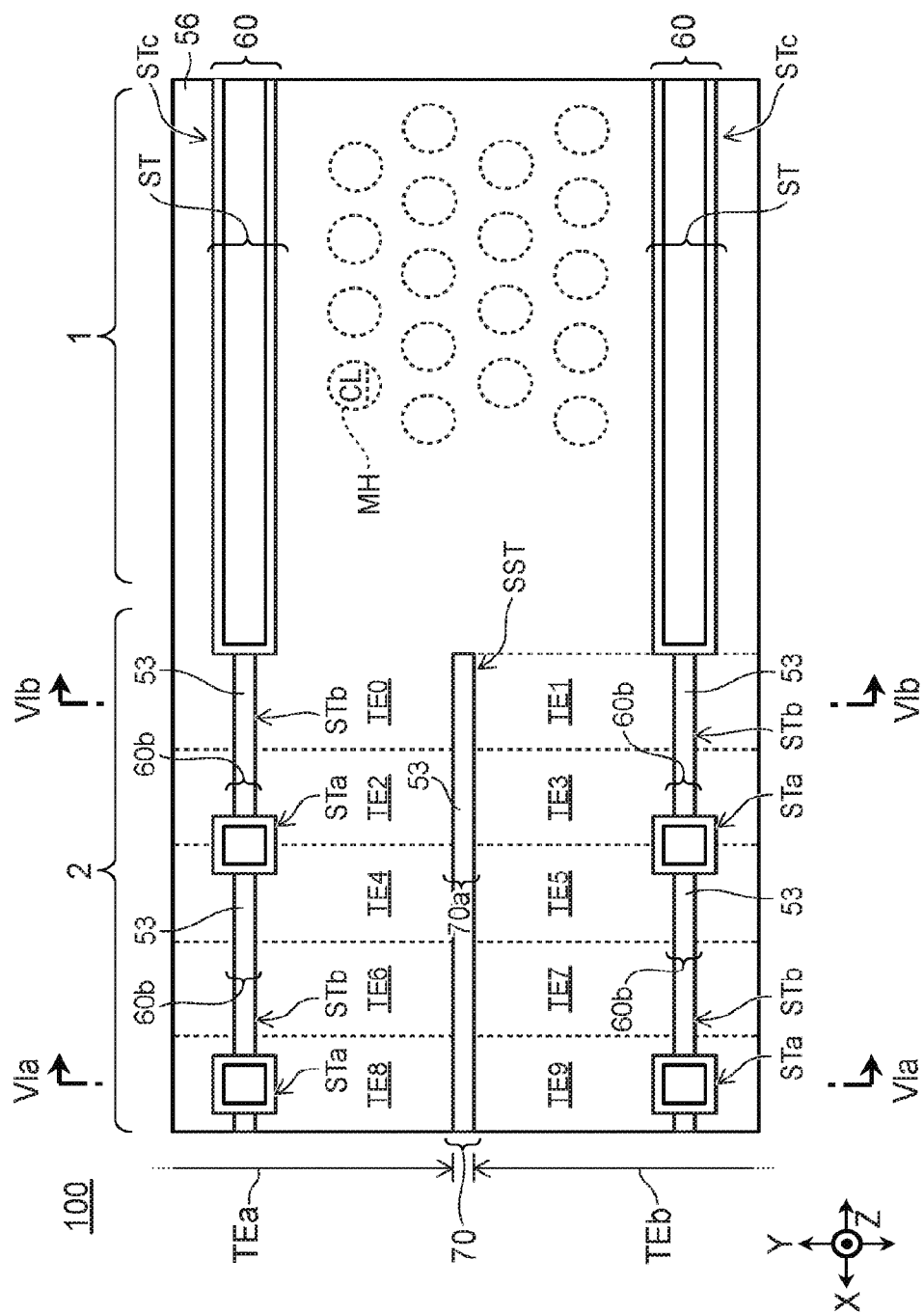
Figure 10I:
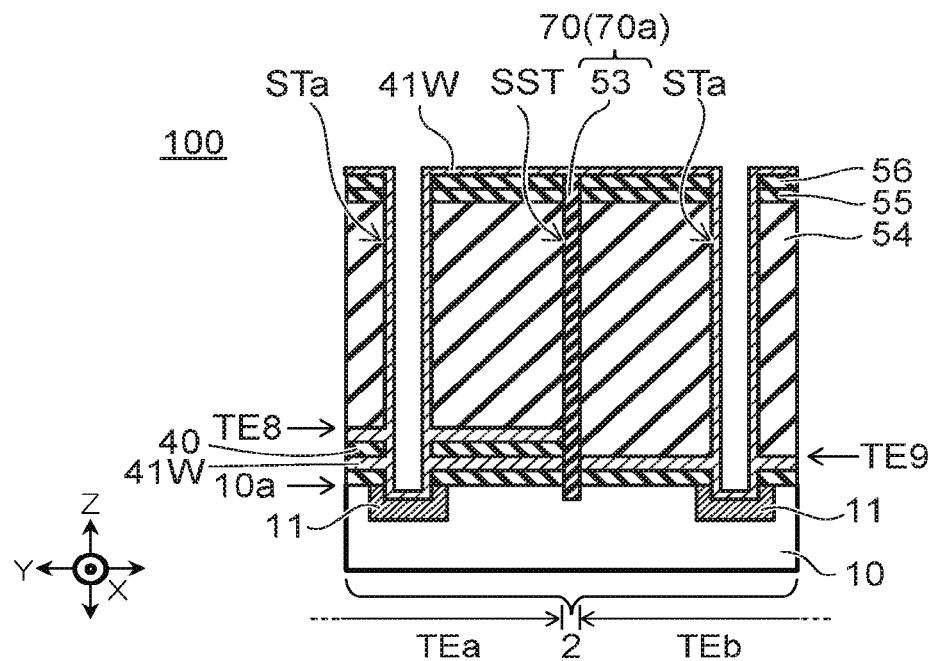
Figure 10J:
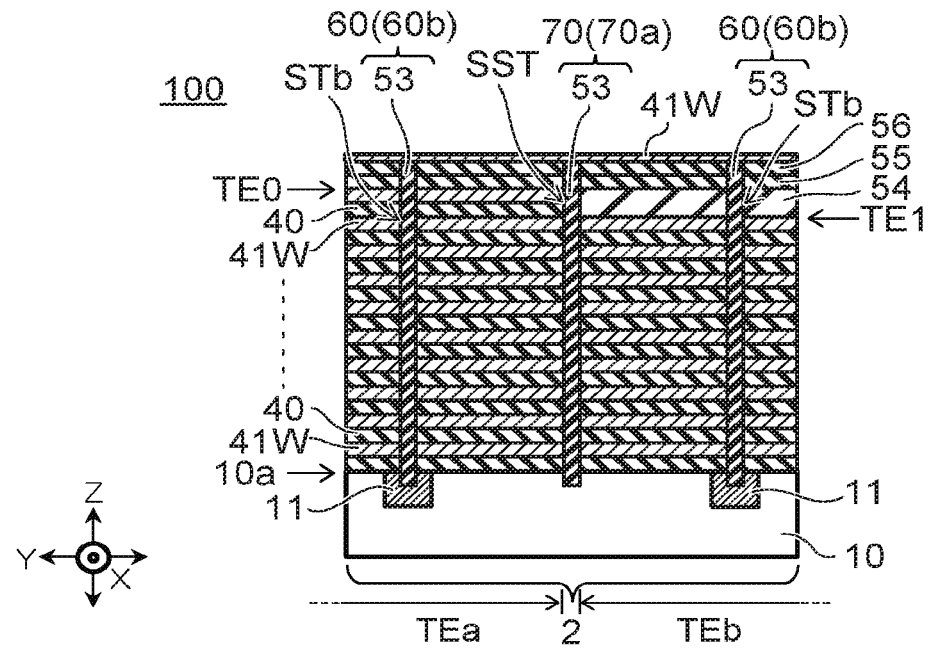

Then, as shown in FIG. 8I, FIG. 10I and FIG. 10J, a conductor film 41W that is used to form the electrode layers 41 is formed on the structure body shown in FIG. 8H, FIG. 10G, and FIG. 10H. Specifically, the conductor film 41W is formed in the following locations (a) to (g).

(a) The upper surface of the fifth insulator 56
(b) The upper surface of the second insulator 53
(c) The side surface of the fifth insulator 56 in the regions STa and STc
(d) The side surface of the fourth insulator 55 in the regions STa and STc
(e) The side surface of the third insulator 54 in the regions STa and STc
(f) The side surfaces of the insulating bodies 40 in the regions STa and STc
(g) The upper surface of the N-type semiconductor layer 11 in the regions STa and STc Further, the conductor film 41W is formed between the insulating body 40 and the insulating body 40 from the regions STa and STc toward the space 43 to fill the space 43.

Figure 8J:
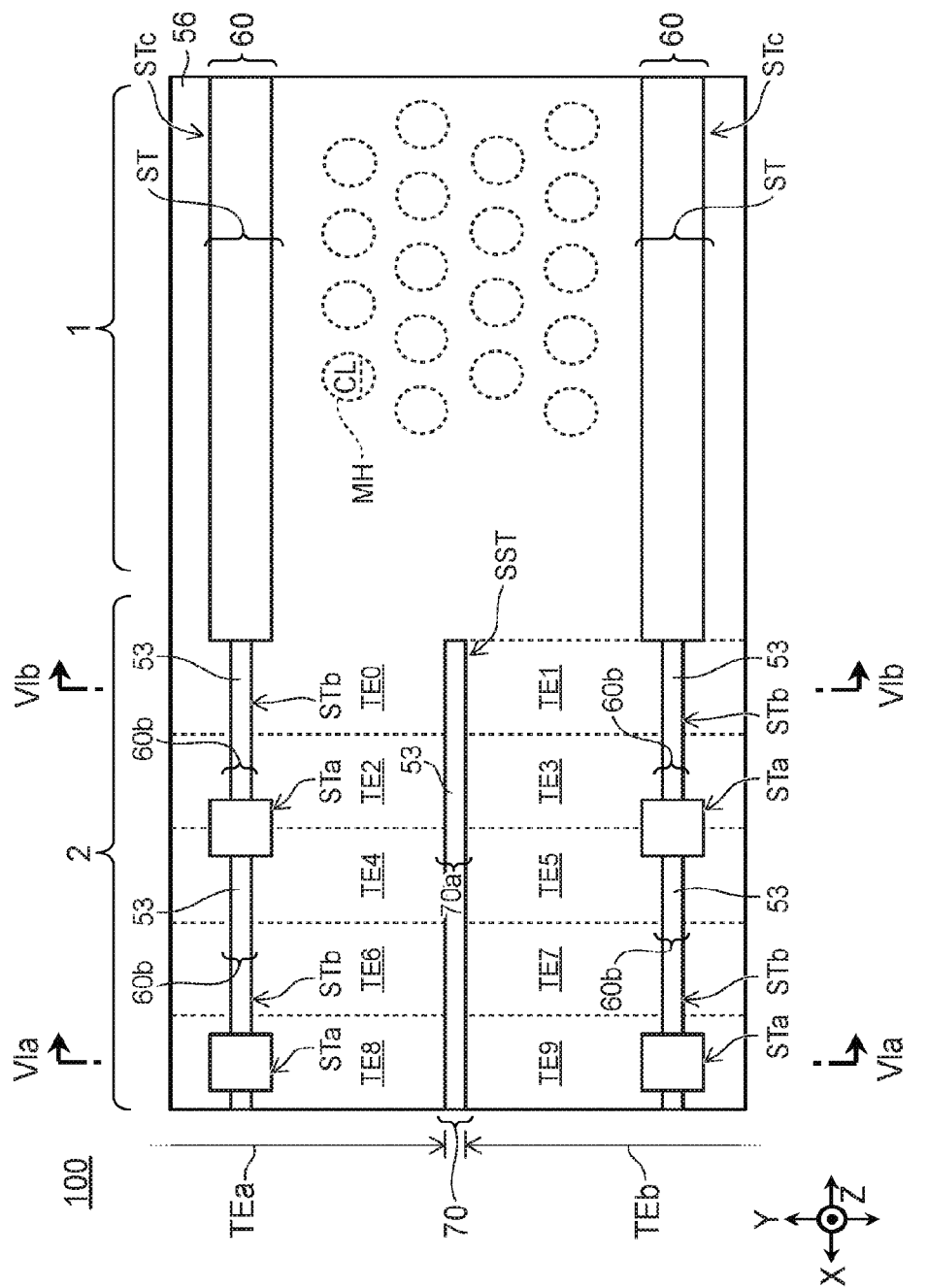
Figure 10K:
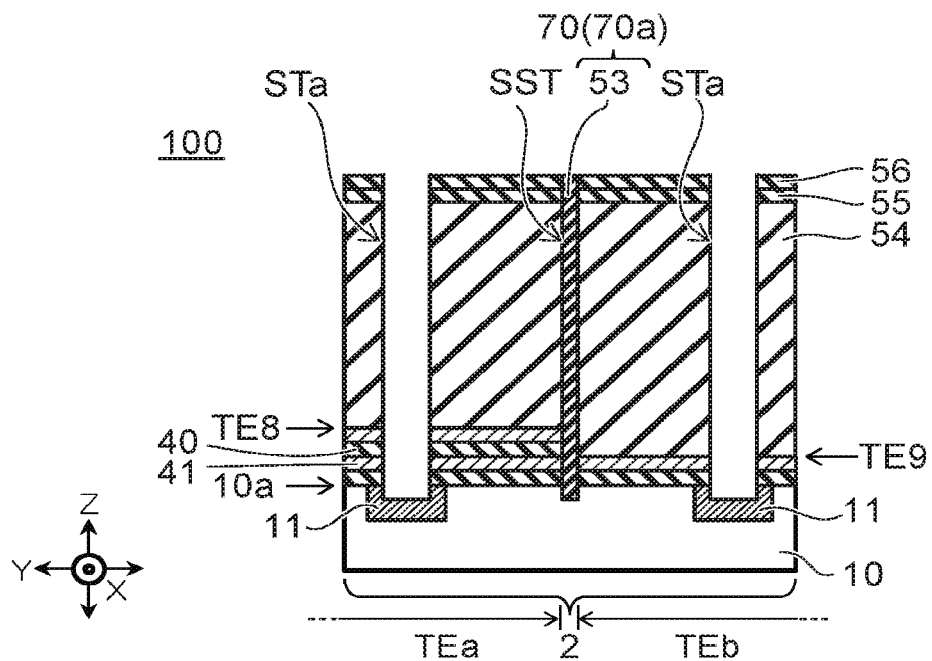
Figure 10L:
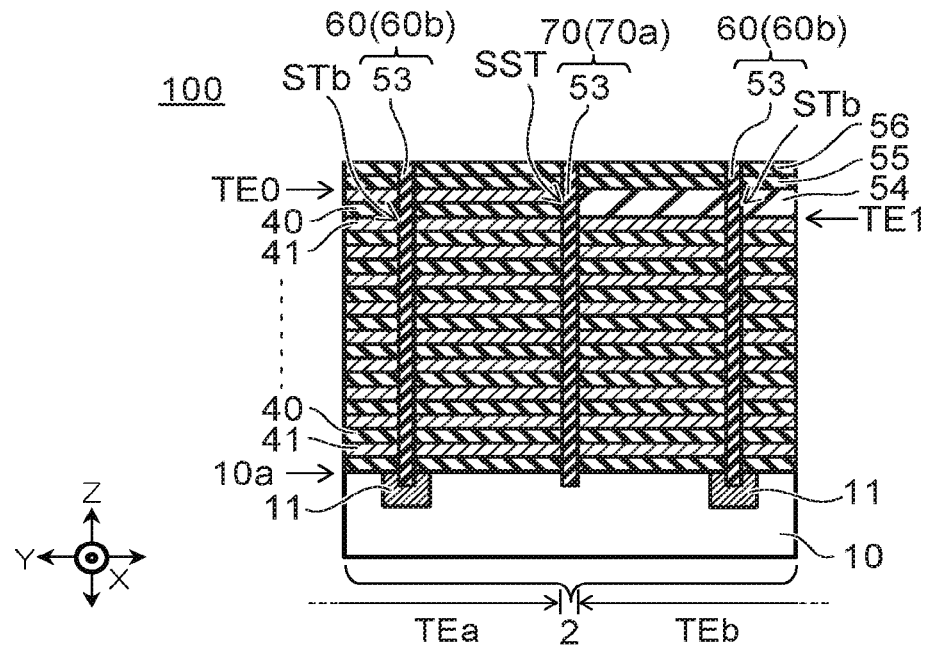

Then, as shown in FIG. 8J, FIG. 10K, and FIG. 10L, the conductor film 41W is selectively removed; and the conductor film 41W is caused to remain between the insulating body 40 and the insulating body 40 (the portion where the space 43 existed). Specifically, for example, isotropic etching of the conductor film 41W is performed; and the conductor film 41W is removed from the locations (a) to (g) recited above. Thereby, the electrode layer 41 is formed between the insulating body 40 and the insulating body 40.

8. Formation of the First Portion 60a and the Array Portion 60c

Figure 8K:
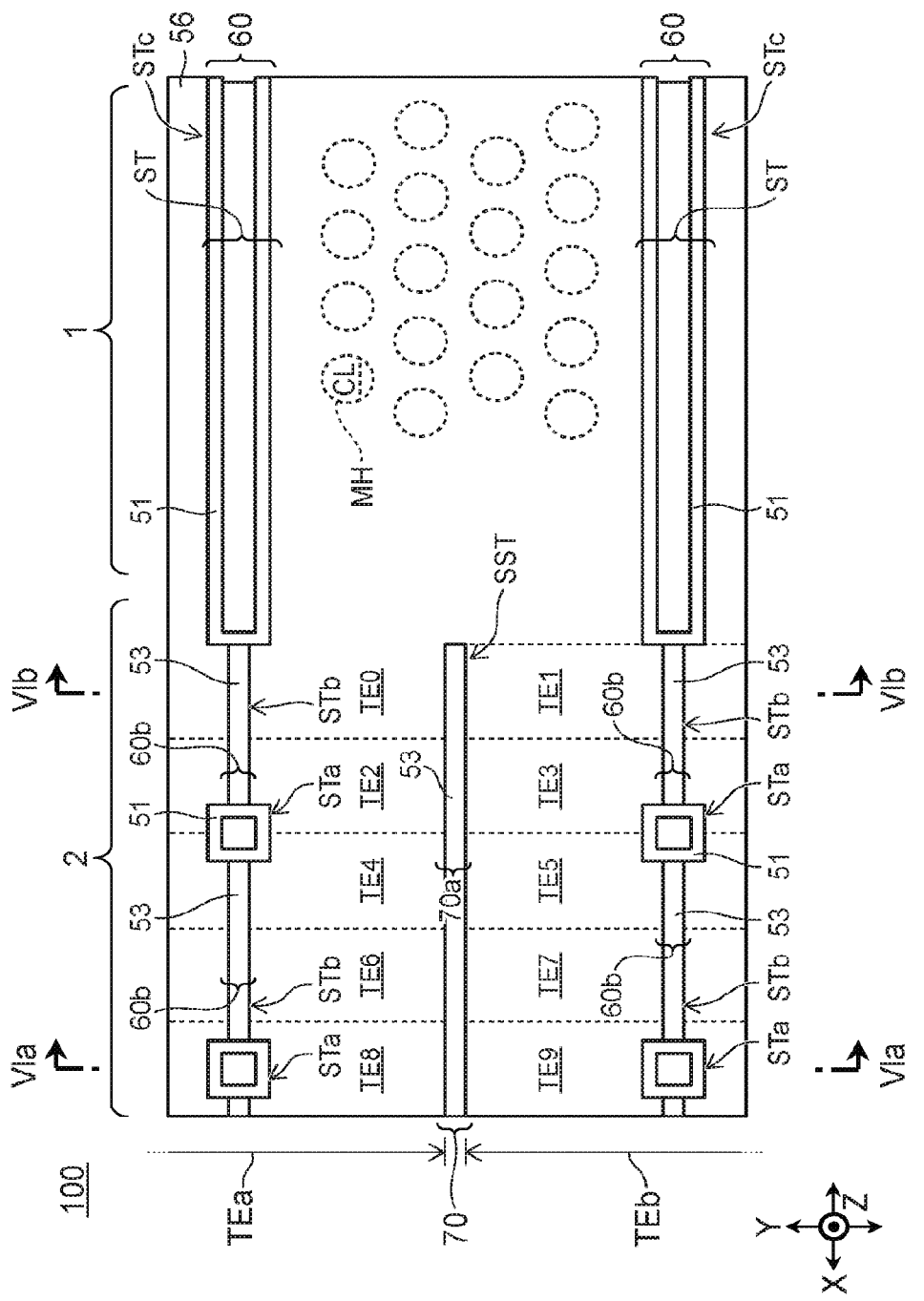
Figure 10M:
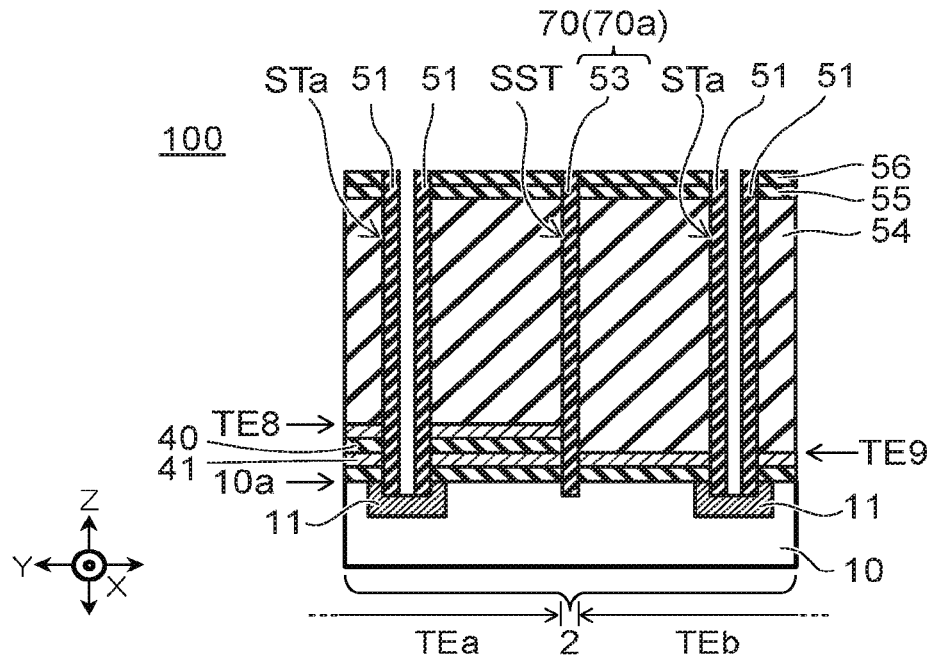
Figure 10N:
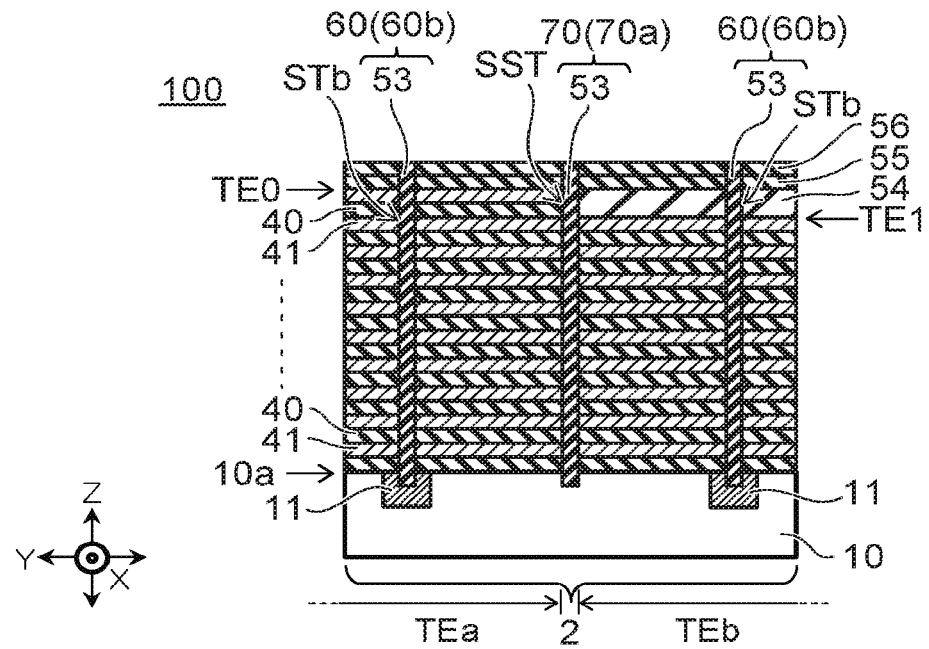

As shown in FIG. 8K, FIG. 10M, and FIG. 10N, the first insulator 51 is formed on the side walls of the regions STa and STc. Specifically, after forming the first insulator 51 on the locations (a) to (g) recited above and the side walls of the electrode layers 41, for example, anisotropic etching of the first insulator 51 is performed; and the first insulator 51 is caused to remain on the side walls of the regions STa and STc.

Figure 8L:
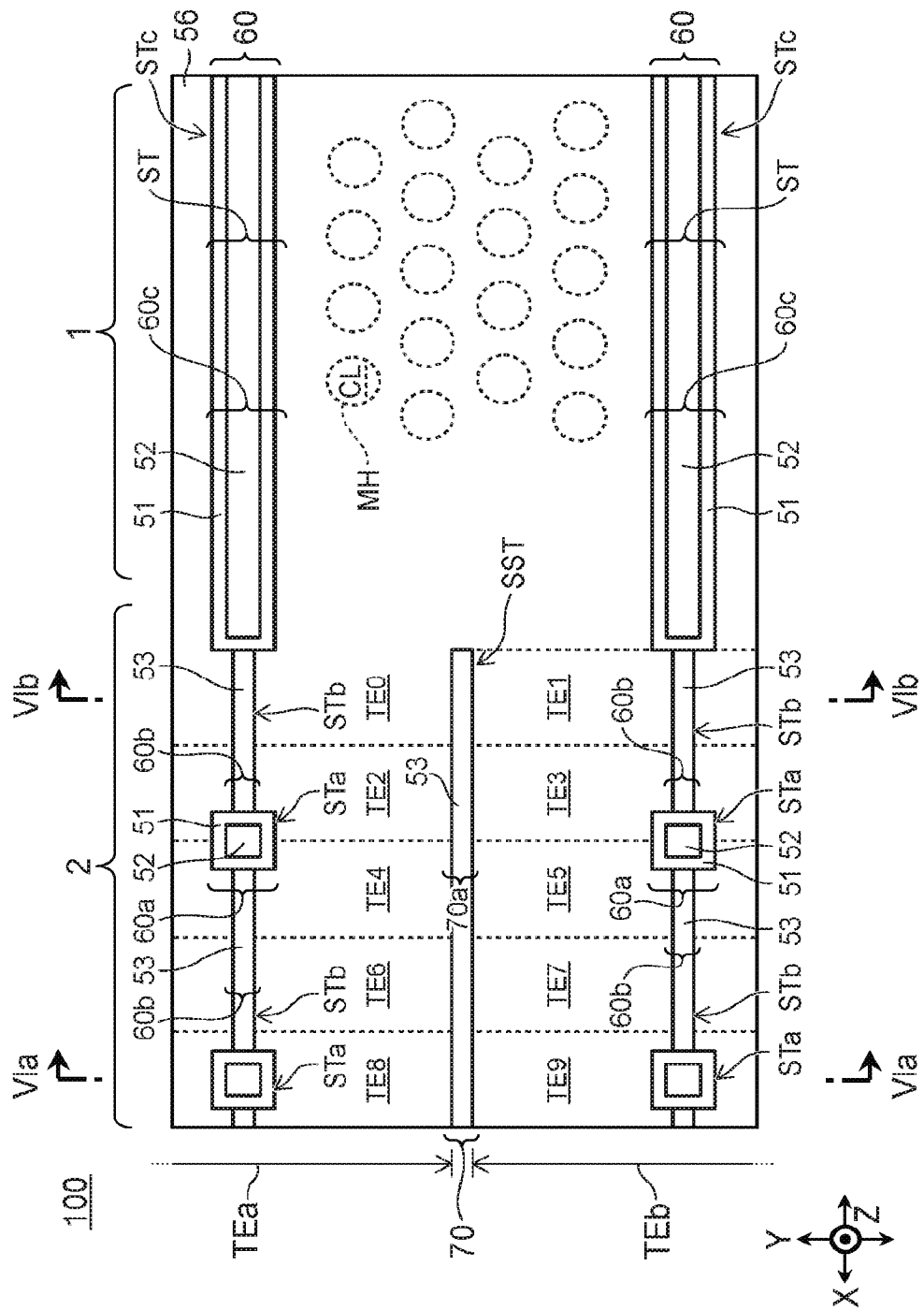
Figure 10O:
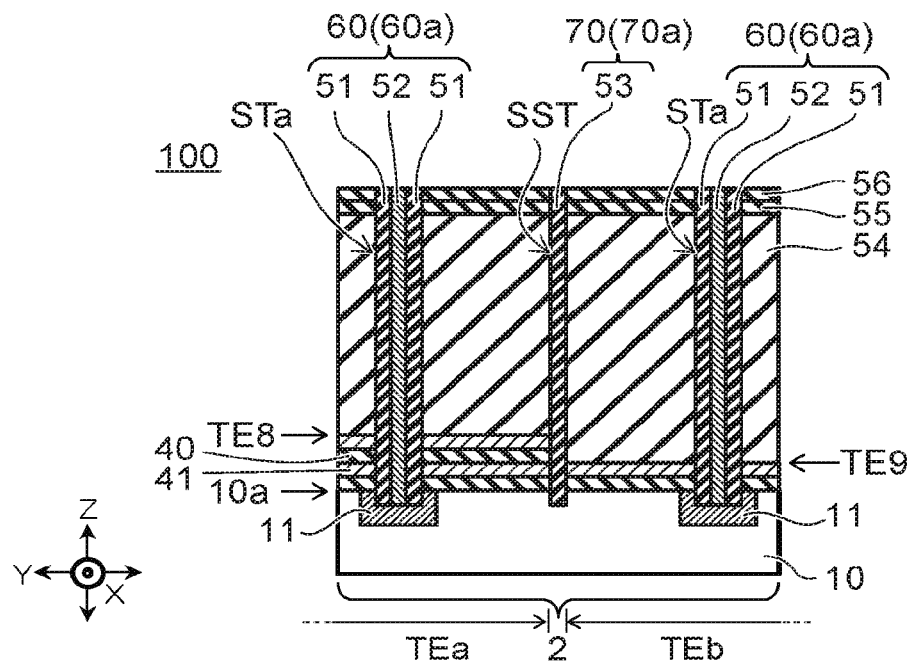
Figure 10P:
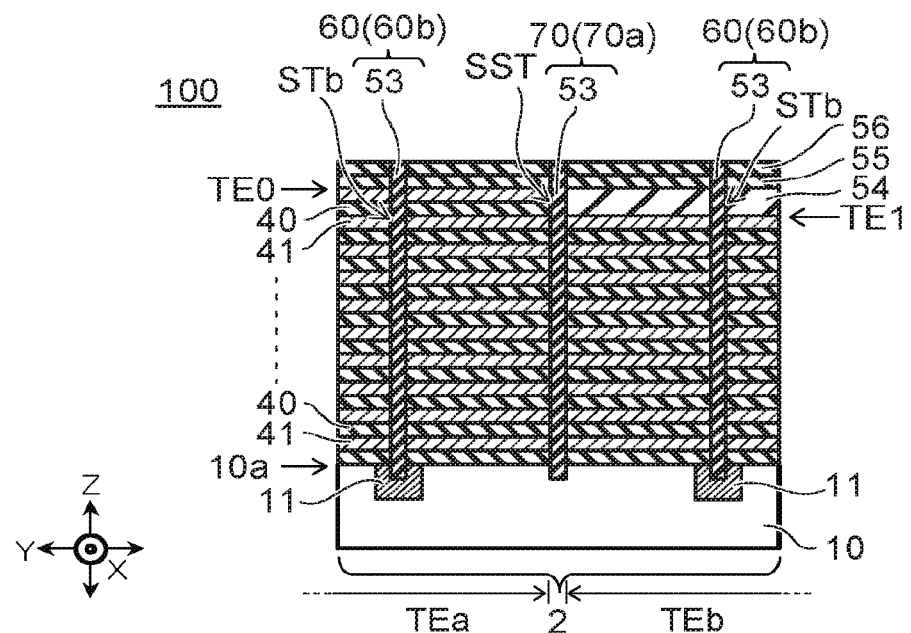

Then, as shown in FIG. 8L, FIG. 10O and FIG. 10P, the first conductor 52 is formed inside the regions STa and STc where the first insulator 51 is formed. Thereby, the first portion 60a of the first separation region 60 is formed in the region STa; and the array portion 60c of the first separation region 60 is formed in the region STc.

9. Formation of the Contacts CC0 to CC9

Figure 8M:
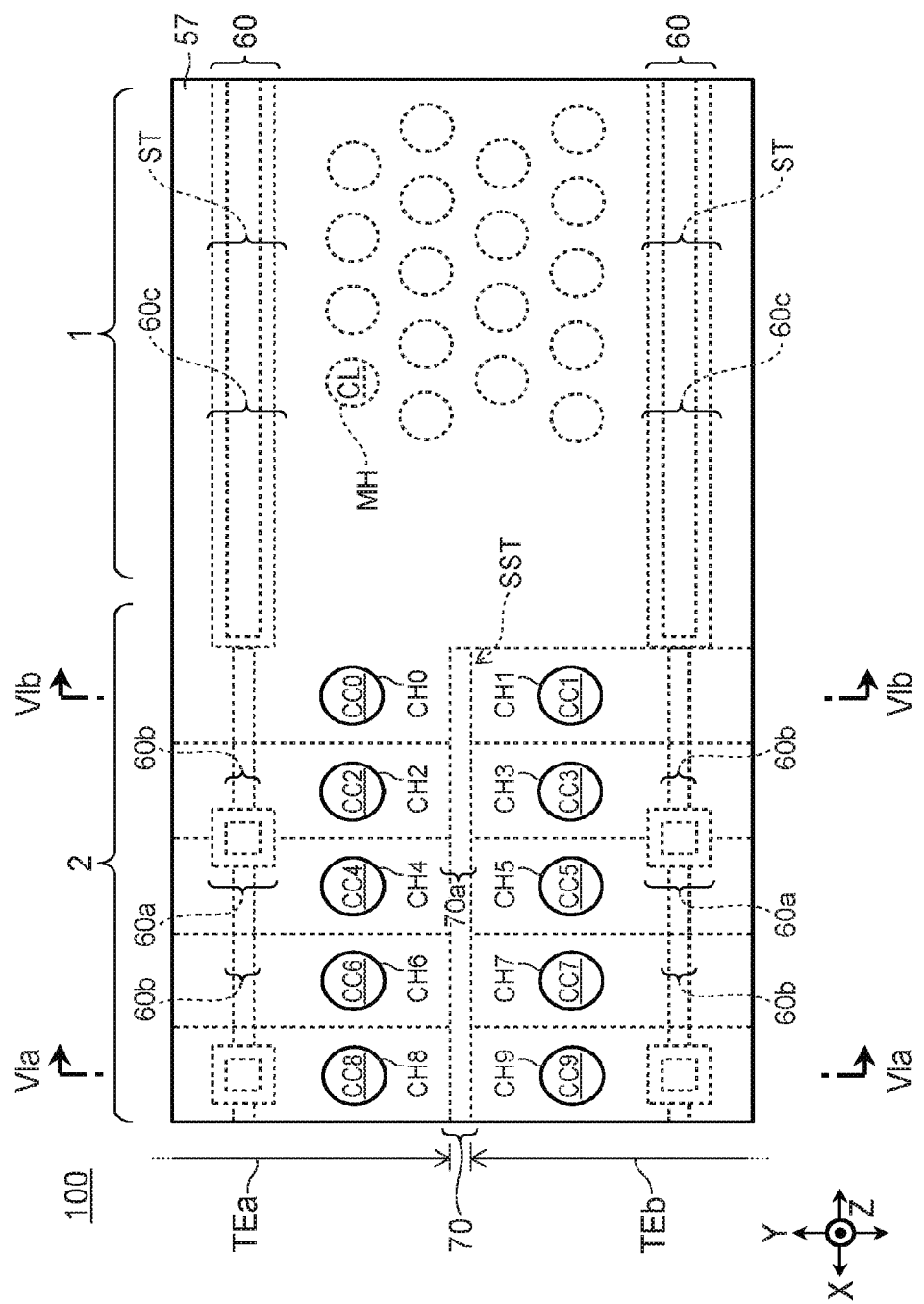
Figure 10Q:
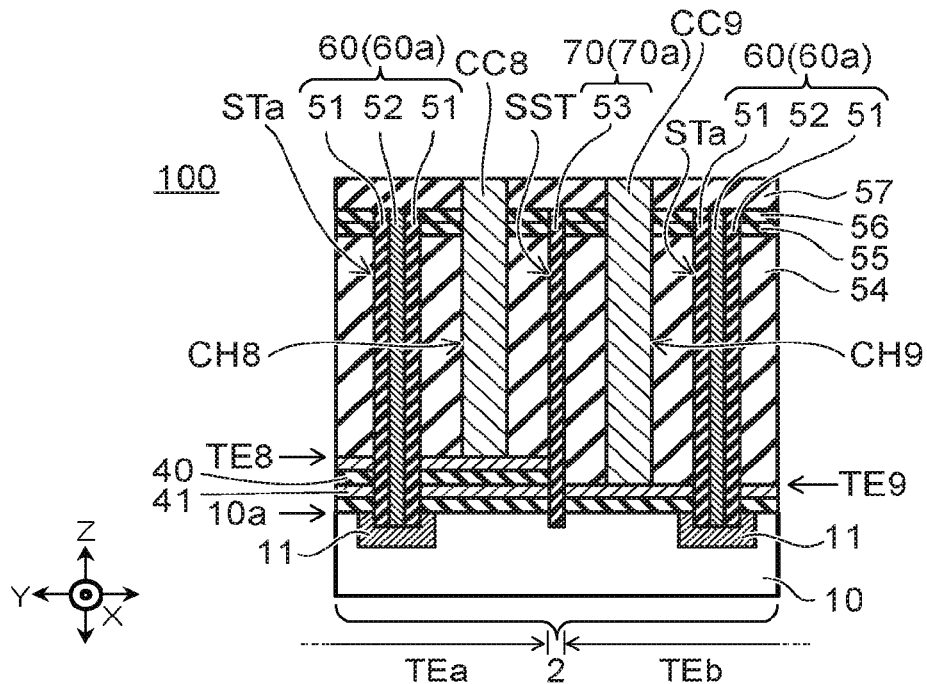
Figure 10R:
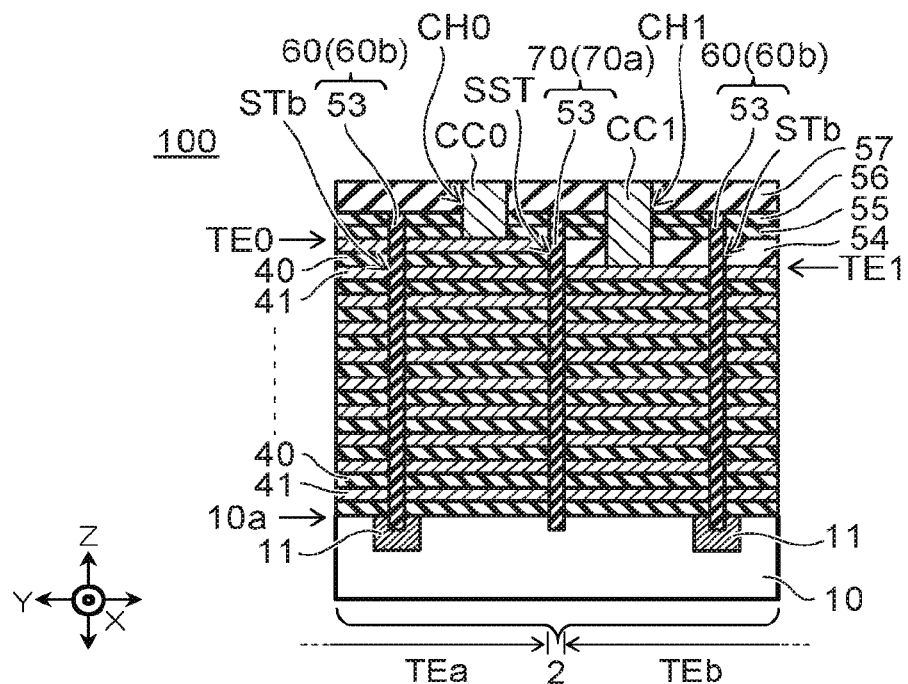

As shown in FIG. 8M, FIG. 10Q, and FIG. 10R, the sixth insulator 57 is formed on the first insulator 51, the first conductor 52, the second insulator 53, and the fifth insulator 56. Thereby, the upper surfaces of the first separation region 60 and the second separation region 70 are covered with the sixth insulator 57.

Then, openings CH0 to CH9 are formed from the front surface of the sixth insulator 57 toward the terraces TE0 to TE9 of the staircase portion 2. The opening CH0 reaches the electrode layer 41 of the terrace TE0. The opening CH1 reaches the electrode layer 41 of the terrace TE1. Similarly hereinbelow, the opening CH9 reaches the electrode layer 41 of the terrace TE9.

Then, the contacts CC0 to CC9 are formed respectively in the openings CH0 to CH9. Thereby, the contacts CC0 to CC9 that are electrically connected respectively to the electrode layer 41 of the terrace TE0 to the electrode layer 41 of the terrace TE9 are formed.

For example, the semiconductor device of the first embodiment can be manufactured by the manufacturing method shown in FIG. 8A to FIG. 8M, FIG. 9A to FIG. 9H, and FIG. 10A to FIG. 10R.

Second Embodiment

<Semiconductor Device>

Figure 11A:
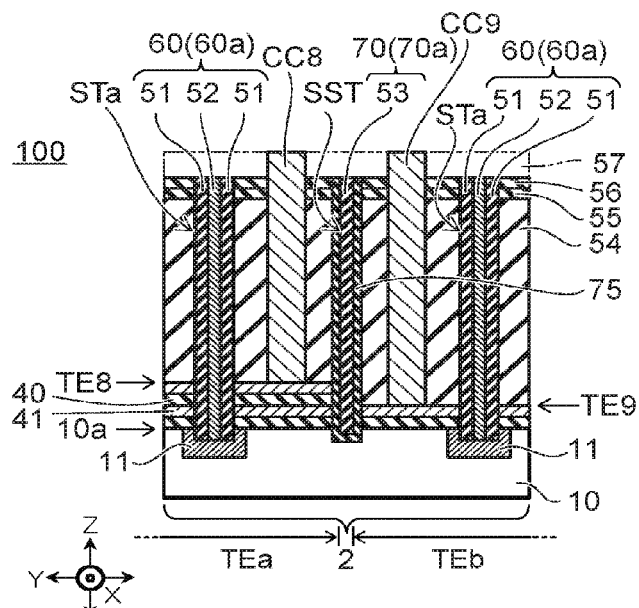
FIG. 11A to FIG. 11C are schematic cross-sectional views of a semiconductor device of a second embodiment.
Figure 11B:
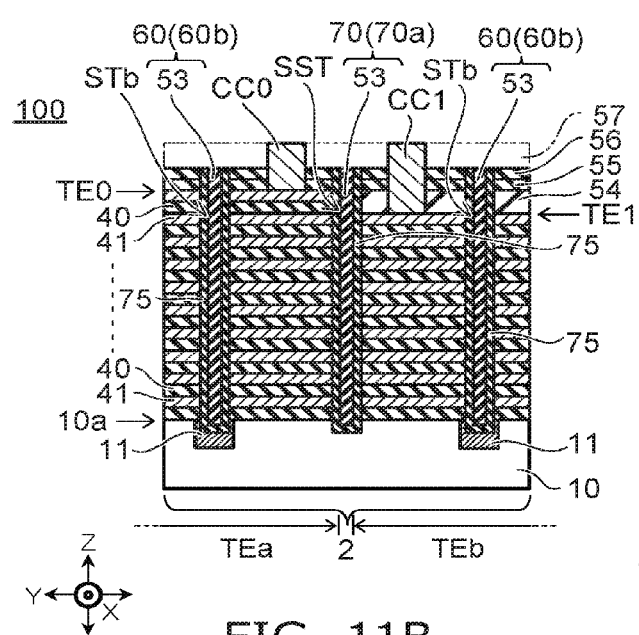
Figure 11C:
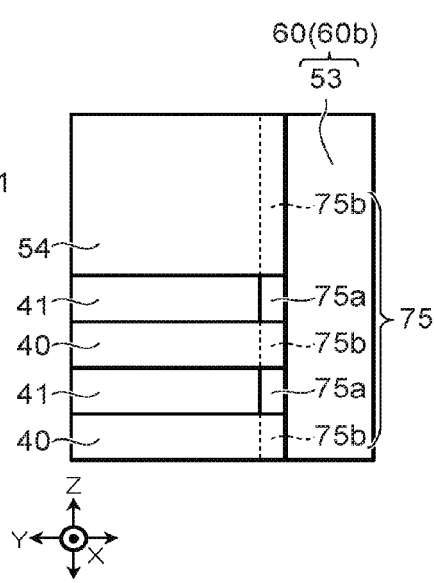

FIG. 11A to FIG. 11C are schematic cross-sectional views of a semiconductor device of a second embodiment. The cross section shown in FIG. 11A corresponds to the cross section shown in FIG. 6A. The cross section shown in FIG. 11B corresponds to the cross section shown in FIG. 6B. The cross section shown in FIG. 11C is a cross section of the second portion 60b shown as being enlarged.

As shown in FIG. 11A and FIG. 11B, the second embodiment differs from the first embodiment in that an oxide layer 75 is provided between the second portion 60b and the stacked body 100 and between the third portion 70a and the stacked body 100.

The cross section of the second portion 60b is shown as being enlarged in FIG. 11C. The third portion 70a also has a cross section similar to FIG. 11C.

As shown in FIG. 11C, the oxide layer 75 includes a first region 75a and a second region 75b. The first region 75a is an oxide region obtained by oxidizing the sacrificial layer 42. In the case where the sacrificial layer 42 is, for example, silicon nitride, the first region 75a is an oxide region obtained by oxidizing the silicon nitride. In such a case, the first region 75a includes, for example, silicon oxide and/or silicon oxynitride (or nitrogen-containing silicon oxide).

For example, the first region 75a becomes silicon oxide when the nitrogen atoms (N) inside the silicon nitride are replaced with oxygen atoms (O). The first region 75a becomes silicon oxynitride (or nitrogen-containing silicon oxide) when the O atoms are introduced to the silicon nitride.

The first region 75a also may be a region including both silicon oxide and silicon oxynitride (or nitrogen-containing silicon oxide). In such a case, for example, the concentration of the O atoms has a trend of decreasing from the second insulator 53 toward the electrode layer 41.

The second region 75b is a region where the silicon oxide of the insulating body 40, the third insulator 54, etc., is further oxidized. For example, the second region 75b is a region that includes more O atoms than the silicon oxide of the insulating body 40, the third insulator 54, etc.

However, for example, the second region 75b may be difficult to form according to the process conditions. Accordingly, it is sufficient for at least the first region 75a to be in the oxide layer 75.

For example, the oxide layer 75 that includes at least the first region 75a can function as a reinforcing member that reinforces the second portion 60b and the third portion 70a. Accordingly, according to the second embodiment, for example, compared to the case where there is no oxide layer 75, an advantage can be obtained in which the buckling strength of the second portion 60b and the buckling strength of the third portion 70a each increase. The second portion 60b and the third portion 70a are support walls. For example, the increase of the buckling strength of the support walls can be used advantageously when it is intended to increase the number of stacks of the stacked body 100.

Also, the oxide layer 75 is not etched easily by, for example, phosphoric acid. For example, the first region 75a is formed of the sacrificial layer 42, e.g., silicon nitride. Phosphoric acid is used to etch silicon nitride. Accordingly, the second embodiment that includes the oxide layer 75 including at least the first region 75a obtains the advantage in which, for example, in the "replace process," the etching resistance (e.g., the phosphoric acid resistance) of the second portion 60b and the etching resistance (e.g., the phosphoric acid resistance) of the third portion 70a can be improved. This advantage can be obtained particularly well in the case where ISSG (In-Situ Steam Generation) oxidization of silicon nitride, etc., is performed. For example, the phosphoric acid resistance is stronger for the case where, for example, the oxide layer 75 is obtained by ISSG oxidization of silicon nitride than for the case where silicon oxide is deposited on silicon nitride by using ALD.

<Manufacturing Method>

FIG. 12A, FIG. 12B to FIG. 14A, and FIG. 14B are schematic cross-sectional views showing a method for manufacturing the semiconductor device of the second embodiment. The cross sections shown in FIG. 12A to FIG. 14A correspond to the cross section shown in FIG. 11A. The cross sections shown in FIG. 12B to FIG. 14B correspond to the cross section shown in FIG. 11B.

1. Formation of the Slit ST and the Short Slit SST

Figure 12A:
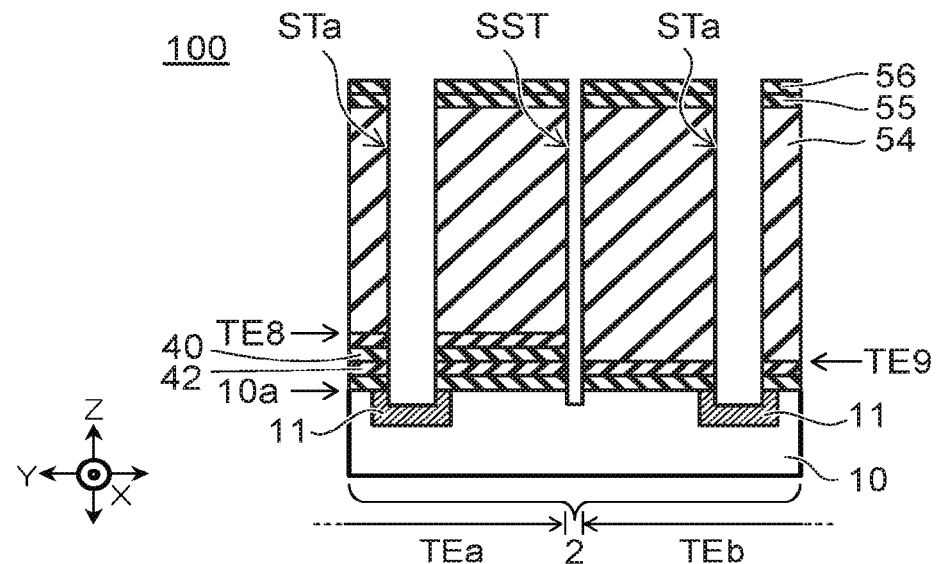
FIG. 12A and FIG. 12B are schematic cross-sectional views showing a method for manufacturing the semiconductor device of the second embodiment.
Figure 12B:
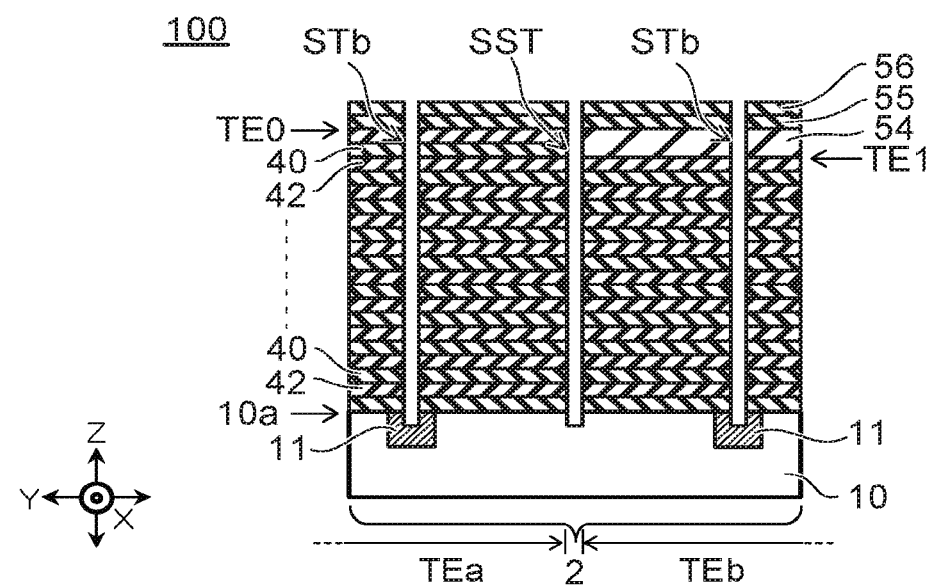

As shown in FIG. 12A and FIG. 12B, for example, the slit ST (STa and STb are illustrated; STc is not illustrated) and the short slit SST are formed inside the stacked body 100 according to the manufacturing method described in reference to FIG. 8A to FIG. 10B.

2. Formation of the Oxide Layer 75

Figure 13A:
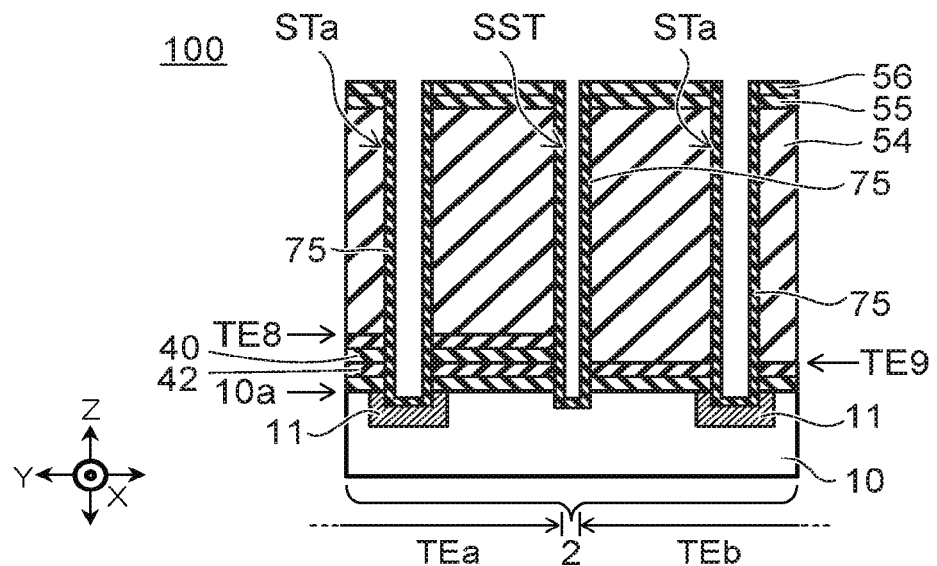
FIG. 13A and FIG. 13B are schematic cross-sectional views showing a method for manufacturing the semiconductor device of the second embodiment.
Figure 13B:
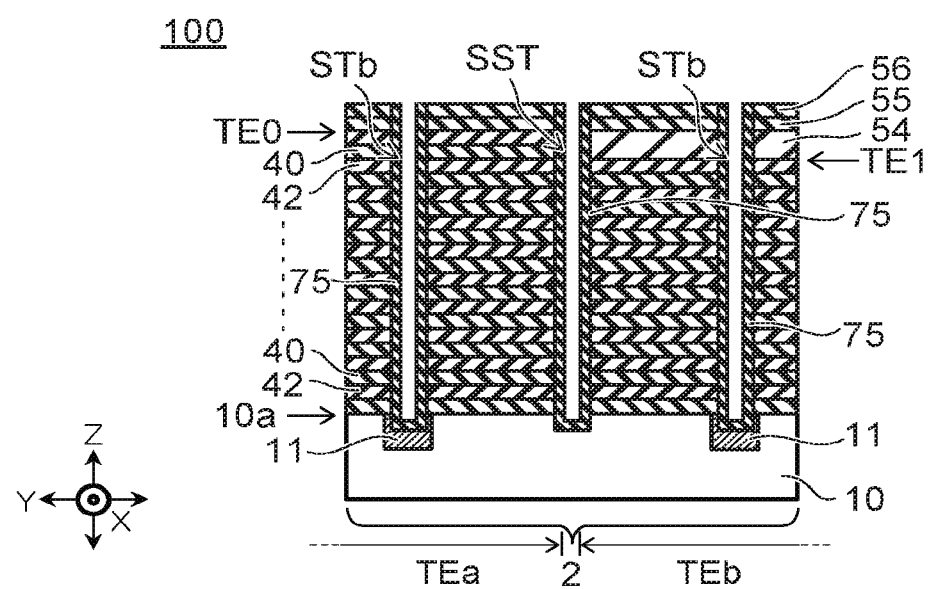

As shown in FIG. 13A and FIG. 13B, the oxide layer 75 is formed inside the stacked body 100 via the slit ST and the short slit SST. The oxide layer 75 is formed by, for example, ISSG (In-Situ Steam Generation) oxidization of the side wall of the stacked body 100 exposed inside the slit ST and the short slit SST. Oxidation other than ISSG oxidization also is usable if the oxide layer 75 is formable inside the stacked body 100.

In the case where the substrate 10 is exposed inside the slit ST and the short slit SST, for example, the oxide layer 75 is formed on the exposed surface of the substrate 10 as well. Even in the case where the N-type semiconductor layer 11 is exposed inside the slit ST, the oxide layer 75 is similarly formed on the exposed surface of the N-type semiconductor layer 11.

3. Formation of the Second Portion 60b and the Third Portion 70a and Replacement (Formation of the Space 43)

Figure 14A:
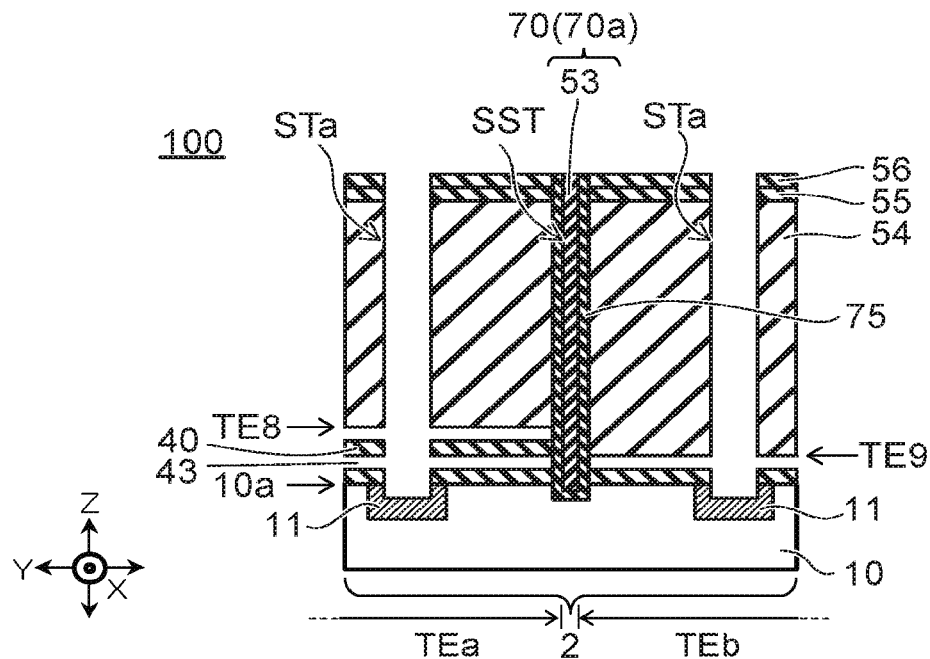
FIG. 14A and FIG. 14B are schematic cross-sectional views showing a method for manufacturing the semiconductor device of the second embodiment.
Figure 14B:
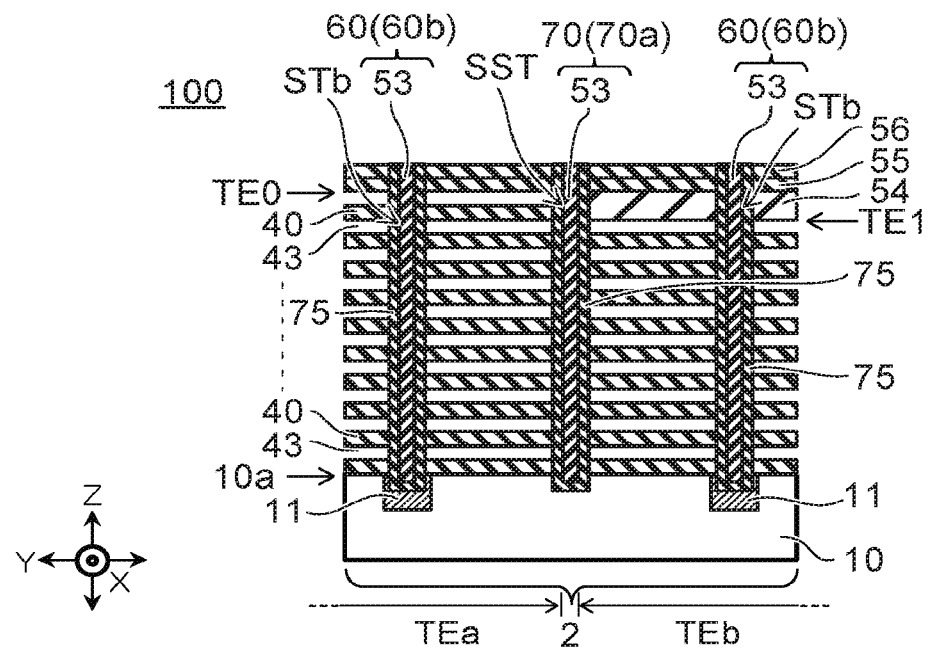

As shown in FIG. 14A and FIG. 14B, for example, the second insulator 53 is formed inside the region STb and the short slit SST according to the manufacturing method described in reference to FIG. 8F to FIG. 10F. Thereby, the second portion 60b is formed in the short slit SST; and the third portion 70a is formed in the region STc. For example, the oxide layer 75 that is formed in the regions STa and/or STc (not illustrated) is removed, for example, when removing the second insulator 53 from the regions STa and/or STc (not illustrated). For example, the side wall of the stacked body 100 is exposed inside the regions STa and/or STc (not illustrated).

Then, for example, the space 43 is formed between the insulating body 40 and the insulating body 40 according to the manufacturing method described in reference to FIG. 8H to FIG. 10H. The sacrificial layers 42 are etched by, for example, phosphoric acid when forming the space 43. The oxide layer 75 is used as a barrier of the etching by the phosphoric acid. Thereby, the second portion 60b and the third portion 70a are protected from the etching by the phosphoric acid.

For example, the width in the Y-direction of the second portion 60b and the width in the Y-direction of the third portion 70a are designed by considering the strength, etc. Albeit slight, etching of the second portion 60b and the third portion 70a may progress if the second portion 60b and the third portion 70a contact, for example, the phosphoric acid. Therefore, the width in the Y-direction of the second portion 60b and the third portion 70a each may be thinner than the design values.

Conversely, in the second embodiment, the oxide layer 75 is used as a barrier of the etching. Therefore, the width in the Y-direction of the second portion 60b and the third portion 70a Y-direction width being thinner than the design values can be suppressed.

Further, in the second embodiment, the second portion 60b, the third portion 70a, and the oxide layer 75 are used as support walls that support the insulating bodies 40 when forming the space 43 and after the formation of the space 43. The support wall of the second embodiment includes the oxide layer 75. Therefore, compared to the case where there is no oxide layer 75, for example, the buckling strength of the support wall can be increased.

4. Replacement (Formation of the Electrode Layers 41) to the Formation of the Contacts CC0 to CC9

After the process shown in FIG. 14A and FIG. 14B, for example, the semiconductor device of the second embodiment shown in FIG. 11A to FIG. 11C is completed by performing the replacement (the formation of the electrode layers 41) to the formation of the contacts CC0 to CC9 according to the manufacturing method described in reference to FIG. 8I to FIG. 10R.

For example, the semiconductor device of the second embodiment can be manufactured by the manufacturing method shown in FIG. 11A to FIG. 14B.

Third Embodiment

<Semiconductor Device>

Figure 15A:
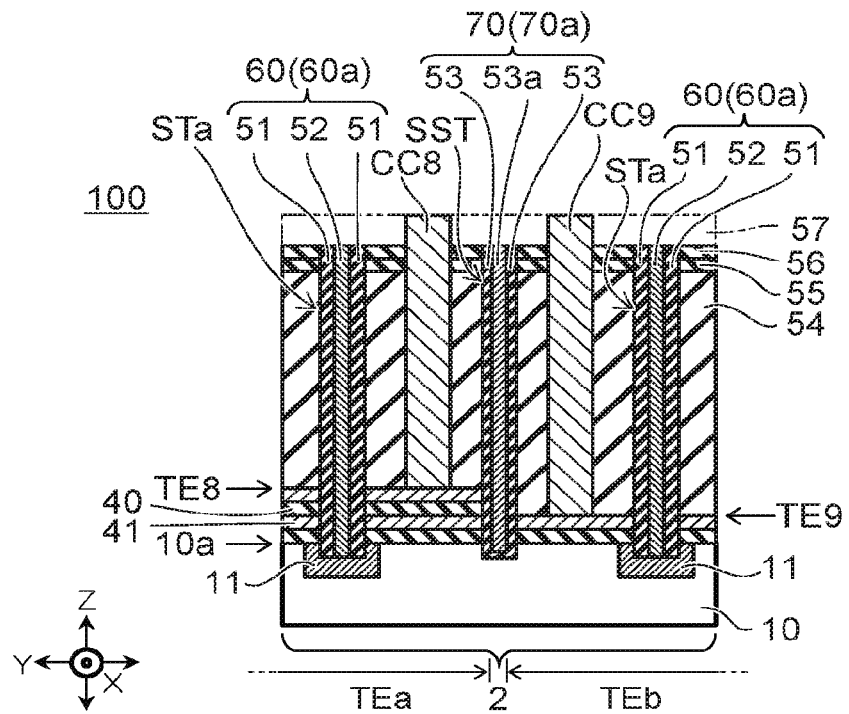
FIG. 15A and FIG. 15B are schematic cross-sectional views of a semiconductor device of a third embodiment.
Figure 15B:
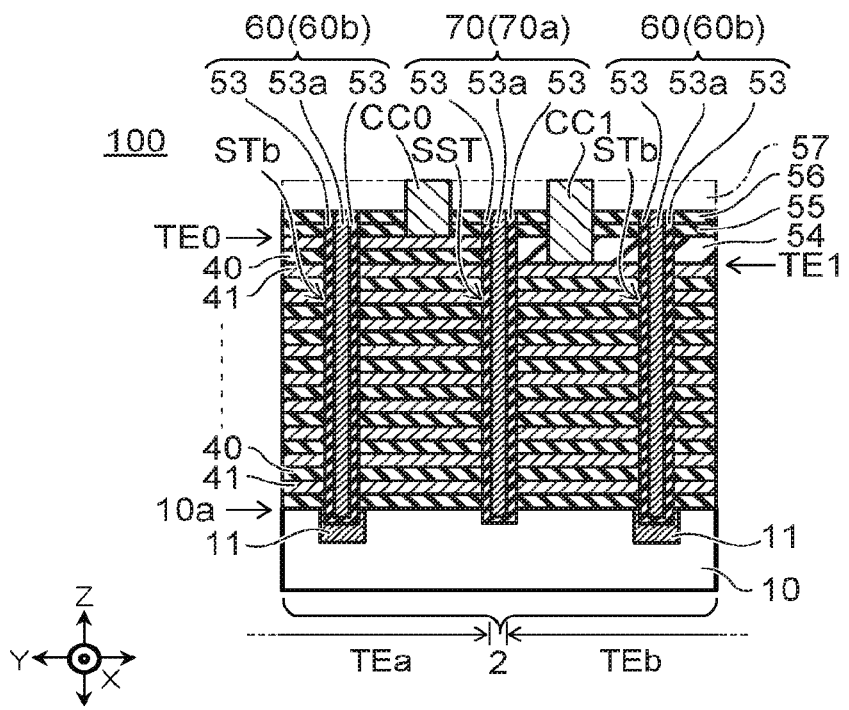

FIG. 15A and FIG. 15B are schematic cross-sectional views of a semiconductor device of a third embodiment. The cross section shown in FIG. 15A corresponds to the cross section shown in FIG. 6A. The cross section shown in FIG. 15B corresponds to the cross section shown in FIG. 6B.

As shown in FIG. 15A and FIG. 15B, the third embodiment differs from the first embodiment in that the second portion 60b and the third portion 70a include the second insulator 53 and an amorphous layer 53a. The amorphous layer 53a includes, for example, a substance that is different from the second insulator 53. For example, a substance that can have etching selectivity with the second insulator 53 is selected as the substance that is different from the second insulator 53. In the third embodiment, for example, silicon is included. The silicon that is included in the amorphous layer 53a may be undoped silicon or doped silicon.

It is not always necessary for the amorphous layer 53a to be amorphous. In the third embodiment, it is also possible to modify the second portion 60b and the third portion 70a to include the second insulator 53 and, for example, a crystallized silicon layer.

<Manufacturing Method>

FIG. 16A, FIG. 16B to FIG. 21A, and FIG. 21B are schematic cross-sectional views showing the method for manufacturing the semiconductor device of the third embodiment. The cross sections shown in FIG. 16A to FIG. 21A correspond to the cross section shown in FIG. 15A. The cross sections shown in FIG. 16B to FIG. 21B correspond to the cross section shown in FIG. 15B.

1. Formation of the Slit ST and the Short Slit SST

Figure 16A:
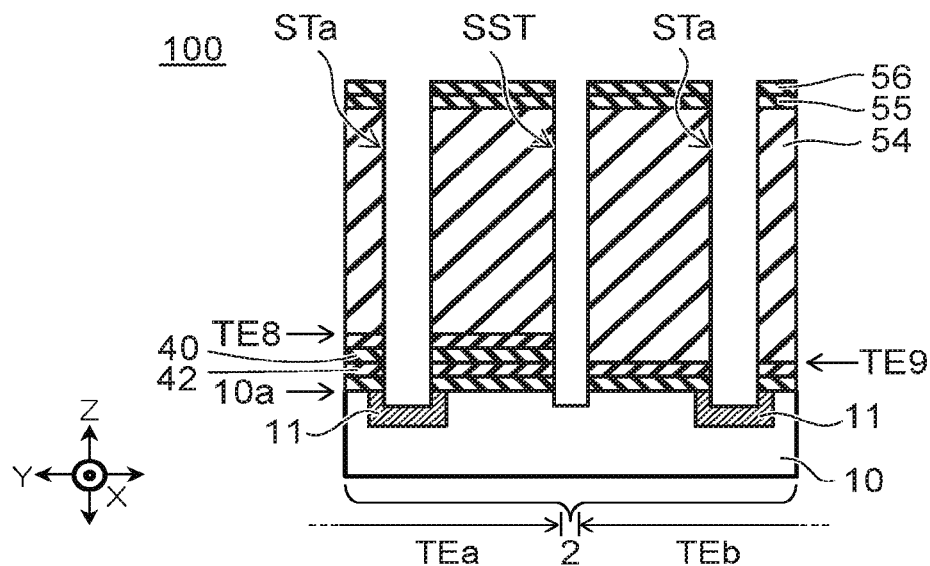
FIG. 16A and FIG. 16B are schematic cross-sectional views showing a method for manufacturing the semiconductor device of the third embodiment.
Figure 16B:
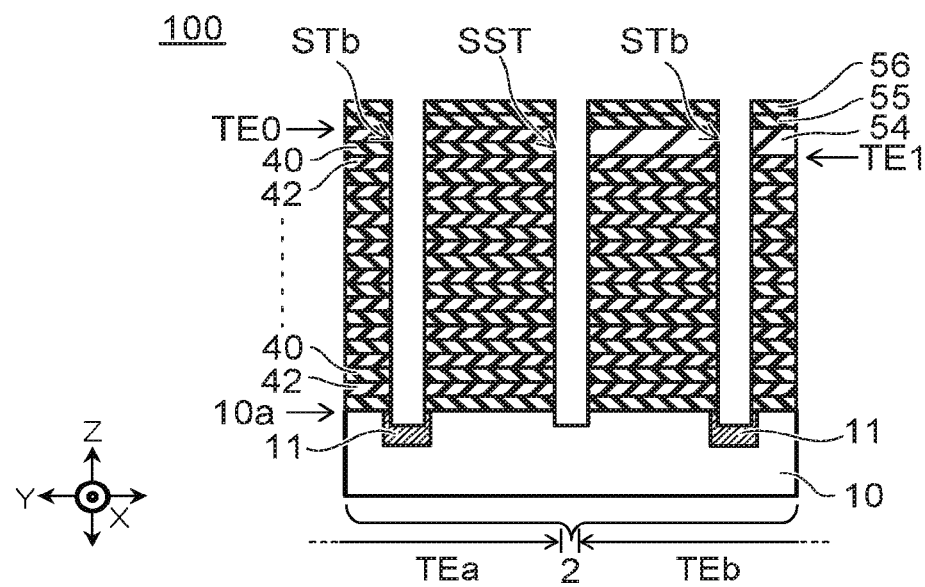

As shown in FIG. 16A and FIG. 16B, for example, the slit ST (STa and STb are illustrated; STc is not illustrated) and the short slit SST are formed inside the stacked body 100 according to the manufacturing method described in reference to FIG. 8A to FIG. 10B.

2. Formation of the Second Insulating Film 53

Figure 17A:
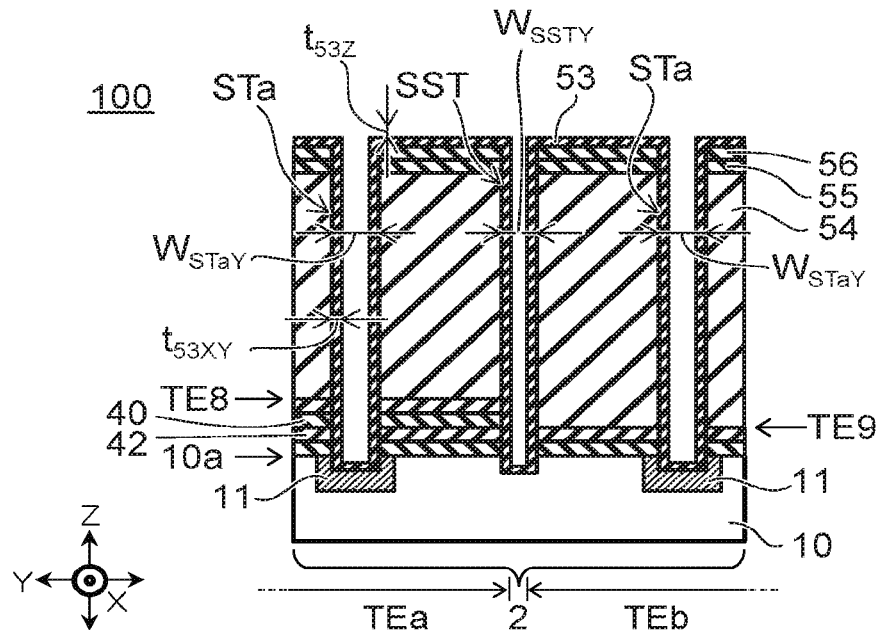
FIG. 17A and FIG. 17B are schematic cross-sectional views showing a method for manufacturing the semiconductor device of the third embodiment.
Figure 17B:
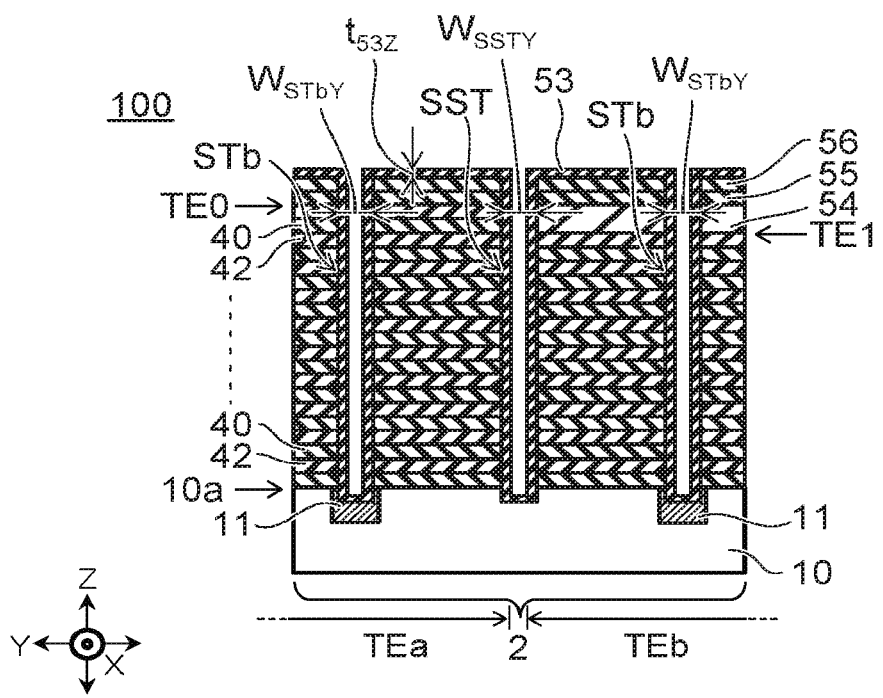

As shown in FIG. 17A and FIG. 17B, the second insulator 53 is formed on the structure body shown in FIG. 16A and FIG. 16B. The second insulator 53 is, for example, silicon oxide. In the third embodiment, for example, the film thickness $t_{53Z}$ in the Z-direction of the second insulator 53 is set as follows.

$$W_{SSTY}/2 > t_{53Z} \tag{2}$$

In Formula (2), "$W_{SSTY}$" is the width in the Y-direction of the short slit SST.

In the third embodiment, the relationship between the width $W_{SSTY}$, the width $W_{STaY}$ in the Y-direction of the region STa, the width $W_{STbY}$ in the Y-direction of the region STb, and the width $W_{STcY}$ in the Y-direction of the region STc (not illustrated in the third embodiment, referring to FIG. 8F of the first embodiment) is, for example, as follows.

$$W_{STaY} \approx W_{STcY}$$

$$W_{STaY} > W_{SSTY}$$

$$W_{SSTY} \approx W_{STbY}$$

For example, it is considered that the film thickness $t_{53Z}$ in the Z-direction of the second insulator 53 is substantially equal to the film thickness $t_{53XY}$ in the XY-plane direction of the second insulator 53 ($t_{53Z} \approx t_{53XY}$). In the third embodiment, if the film thickness $t_{53Z}$ satisfies the condition of Formula (2), the second insulator 53 can be formed on the side wall of the regions STa to STc, the side wall of the slit SST, the N-type semiconductor layer 11 exposed at the bottoms of the regions STa to STc, and the substrate 10 exposed at the bottom of the slit SST without the regions STa to STc and the slit SST being plugged by the second insulator 53.

3. Formation of the Amorphous Layer 53a

Figure 18A:
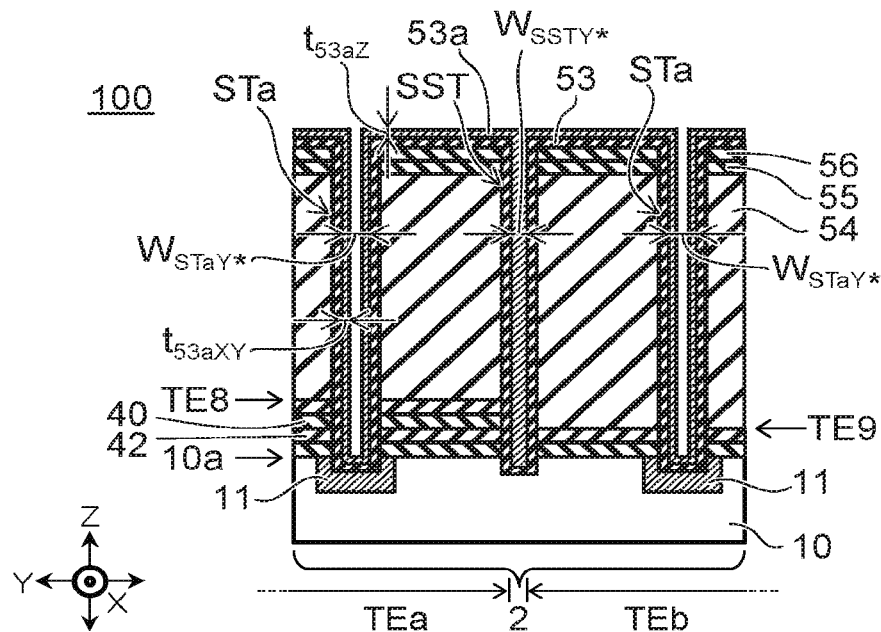
FIG. 18A and FIG. 18B are schematic cross-sectional views showing a method for manufacturing the semiconductor device of the third embodiment.
Figure 18B:
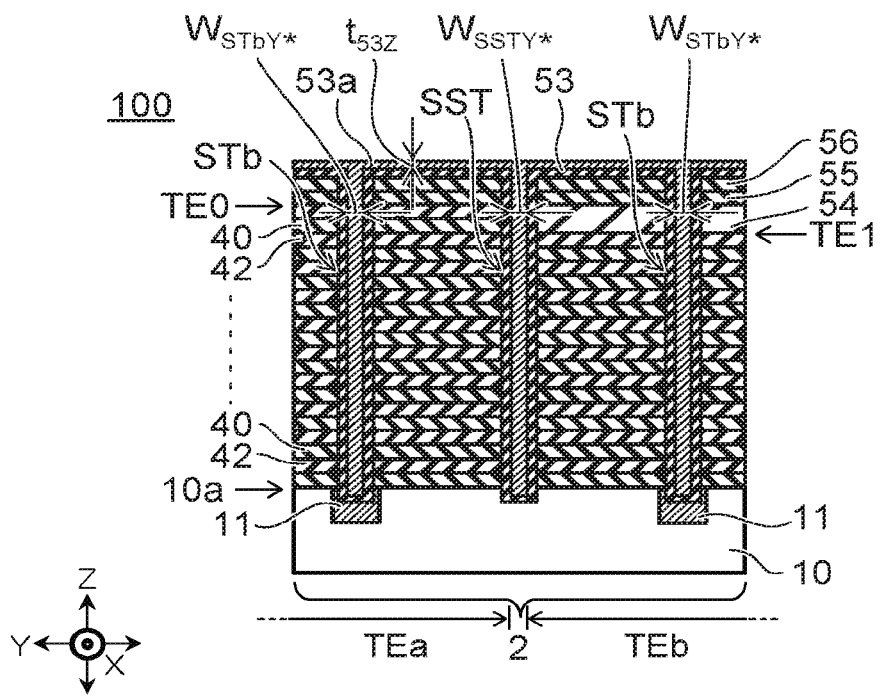

As shown in FIG. 18A and FIG. 18B, the amorphous layer 53a is formed on the structure body shown in FIG. 17A and FIG. 17B. The amorphous layer 53a is, for example, amorphous silicon. For example, a film thickness $t_{53aZ}$ in the Z-direction of the amorphous layer 53a is set as follows.

$$W_{STaY*}/2 > t_{53a7} \geq W_{SSTY*}/2 \tag{3}$$

In Formula (3), "$W_{STaY*}$" is the width in the Y-direction of the region STa where the second insulator 53 is formed.

"$W_{SSTY*}$" is the width in the Y-direction of the short slit SST where the second insulator 53 is formed.

For example, the relationship between the width $W_{SSTY*}$ and the width $W_{STbY*}$ in the Y-direction of the region STb where the second insulator 53 is formed is as follows.

$$W_{SSTY*} \approx W_{STbY*}$$

For example, it is considered that the film thickness $t_{53aZ}$ in the Z-direction of the amorphous layer 53a is substantially equal to a film thickness $t_{53aXY}$ in the XY-plane direction of the amorphous layer 53a ($t_{53aZ} \approx t_{53aXY}$). If the film thickness $t_{53aZ}$ satisfies the condition of Formula (3), the region STb and the short slit SST can be filled with the amorphous layer 53a without the regions STa and STc being plugged by the amorphous layer 53a.

4. Removal of the Amorphous Layer 53a

Figure 19A:
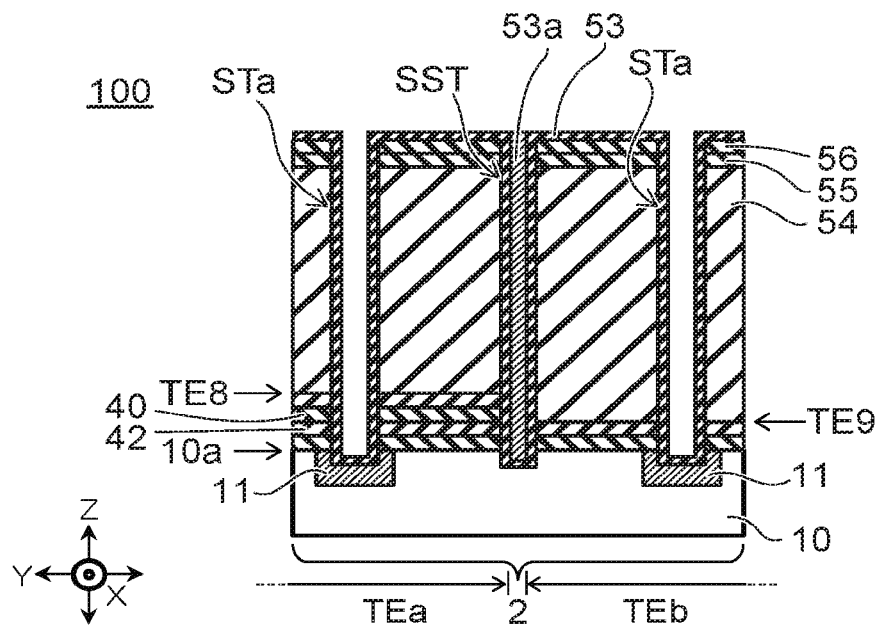
FIG. 19A and FIG. 19B are schematic cross-sectional views showing a method for manufacturing the semiconductor device of the third embodiment.
Figure 19B:
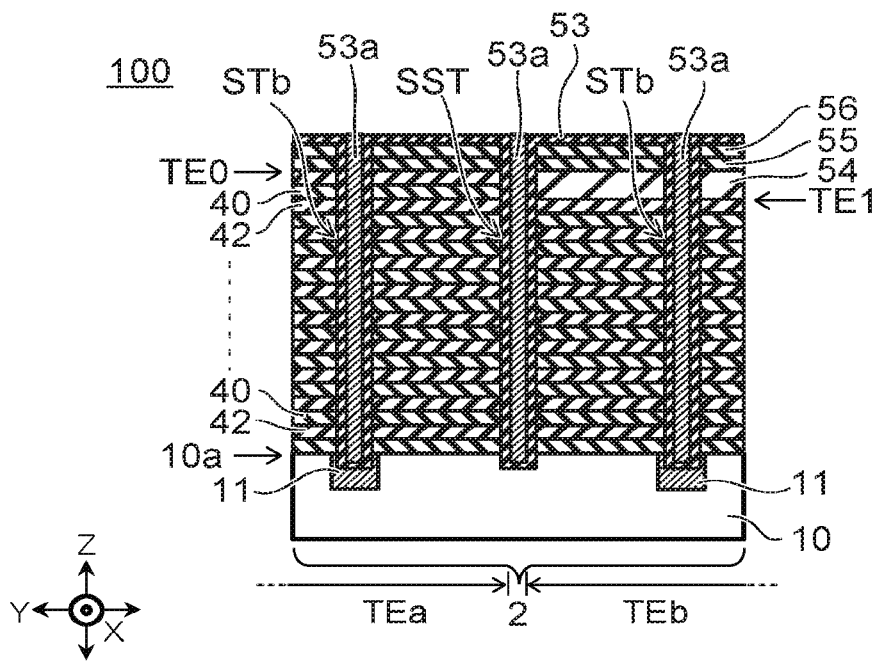

As shown in FIG. 19A and FIG. 19B, for example, the amorphous layer 53a is etched using isotropic etching; and the amorphous layer 53a is caused to remain inside the region STb and the short slit SST. At the stage shown in FIG. 19A and FIG. 19B, the regions STa and STc (referring to FIG. 8G) are openings. In this process, the amorphous layer 53a can be etched using the second insulating film 53 as an "etching stopper" in the case where the amorphous layer 53a is, for example, amorphous silicon and the second insulating film 53 is, for example, silicon oxide.

5. Formation of the Second Portion 60b and the Third Portion 70a

Figure 20A:
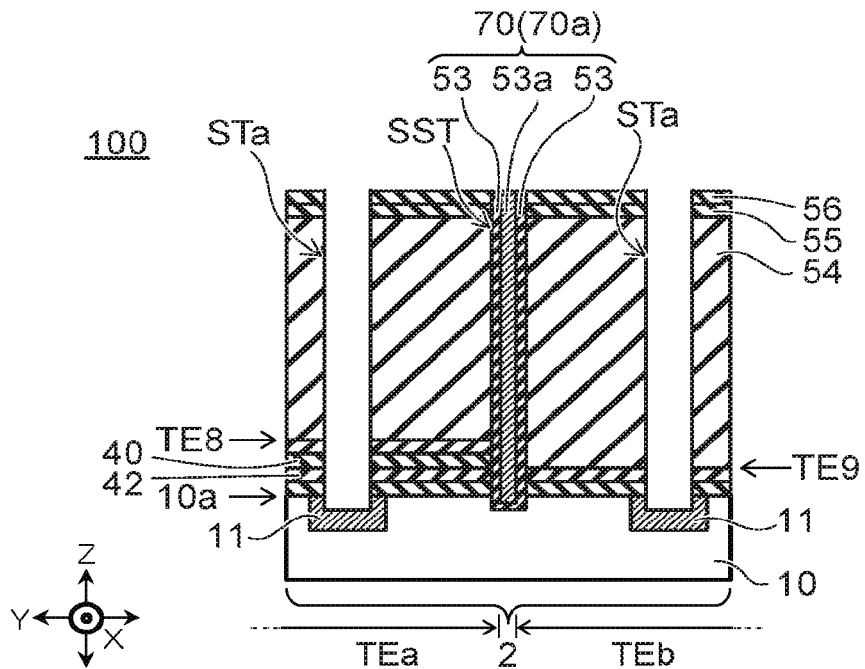
FIG. 20A and FIG. 20B are schematic cross-sectional views showing a method for manufacturing the semiconductor device of the third embodiment.
Figure 20B:
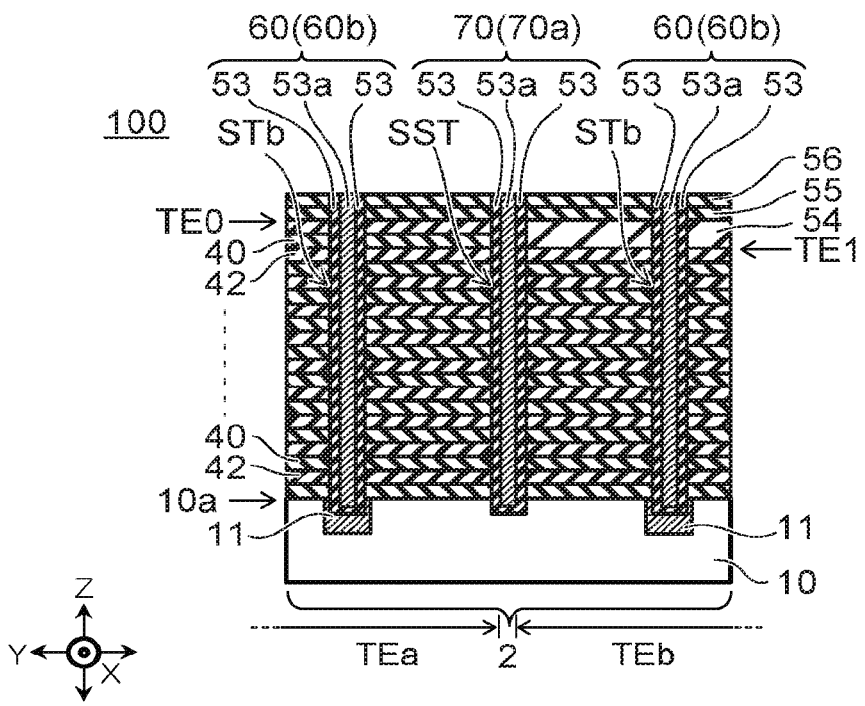

As shown in FIG. 20A and FIG. 20B, the second insulator 53 is etched using isotropic etching; and the second insulator 53 is removed from the regions STa and STc (referring to FIG. 8G). Thereby, the third portion 70a and the second portion 60b including the amorphous layer 53a and the second insulator 53 each are formed in the region STb and the short slit SST.

6. Replacement (Formation of the Space 43)

Figure 21A:
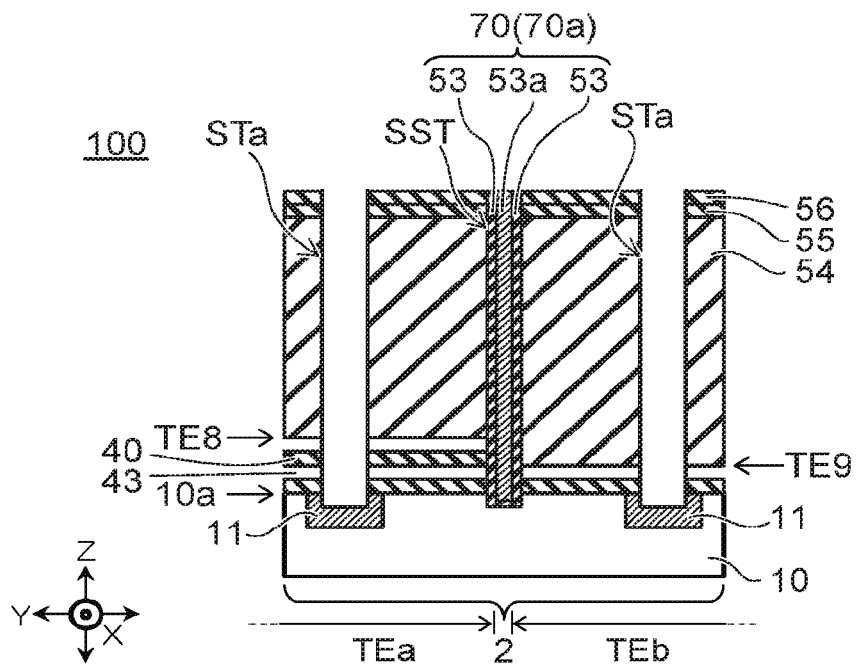
FIG. 21A and FIG. 21B are schematic cross-sectional views showing a method for manufacturing the semiconductor device of the third embodiment.
Figure 21B:
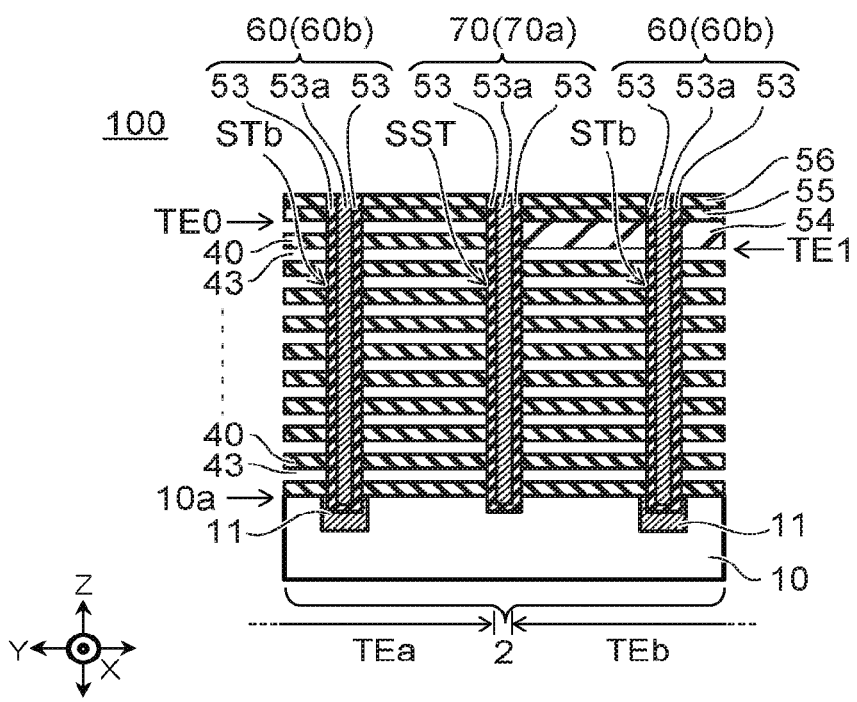

As shown in FIG. 21A and FIG. 21B, for example, the space 43 is formed between the insulating body 40 and the insulating body 40 according to the manufacturing method described in reference to FIG. 8H to FIG. 10H.

7. Replacement (Formation of the Electrode Layers 41) to the Formation of the Contacts CC0 to CC9

After the process shown in FIG. 21A and FIG. 21B, for example, the semiconductor device of the third embodiment shown in FIG. 15A and FIG. 15B is completed by performing the replacement (the formation of the electrode layers 41) to the formation of the contacts CC0 to CC9 according to the manufacturing method described in reference to FIG. 8I to FIG. 10R.

For example, the semiconductor device of the third embodiment can be manufactured by the manufacturing method shown in FIG. 15A to FIG. 21B.

In the third embodiment, the second portion 60b and the third portion 70a include the second insulator 53, and a layer including a substance that is different from the second insulator 53 (e.g., the amorphous layer 53a including silicon). Accordingly, compared to the case where, for example, the second portion 60b and the third portion 70a are filled with only the second insulator 53, the film thickness $t_{53Z}$ and/or the film thickness $t_{53XY}$ of the second insulator 53 can be thin. If the film thickness of the second insulator 53 is thin, the amount of the second insulator 53 removed from the first portion 60a and/or the array portion 60c decreases. Therefore, compared to the case where, for example, the second portion 60b and the third portion 70a are filled with only the second insulator 53, the etching time, e.g., the wet etching time, of the second insulator 53 can be shortened.

For example, in the case where both the second insulator 53 and the insulating body 40 inside the stacked body 100 are silicon oxide, there is a possibility that unexpected etching of the insulating body 40 may occur in the etching process of the second insulator 53. It is assumed that the unexpected etching of the insulating body 40 occurs easily as the etching time of the second insulator 53 lengthens.

Conversely, in the third embodiment, the etching time of the second insulator 53 can be shortened. Accordingly, according to the third embodiment, the occurrence of the unexpected etching of the insulating body 40 can be suppressed.

Also, in the etching of the amorphous layer 53a, the second insulator 53 can be used as an "etching stopper." By using the second insulator 53 as an "etching stopper," compared to the case where there is no "etching stopper," the amorphous layer 53a also can be removed while suppressing the occurrence of excessive etching at portions other than the amorphous layer 53a.

It is also possible to implement the third embodiment in combination with the second embodiment.

Fourth Embodiment

<Semiconductor Device>

Figure 22:
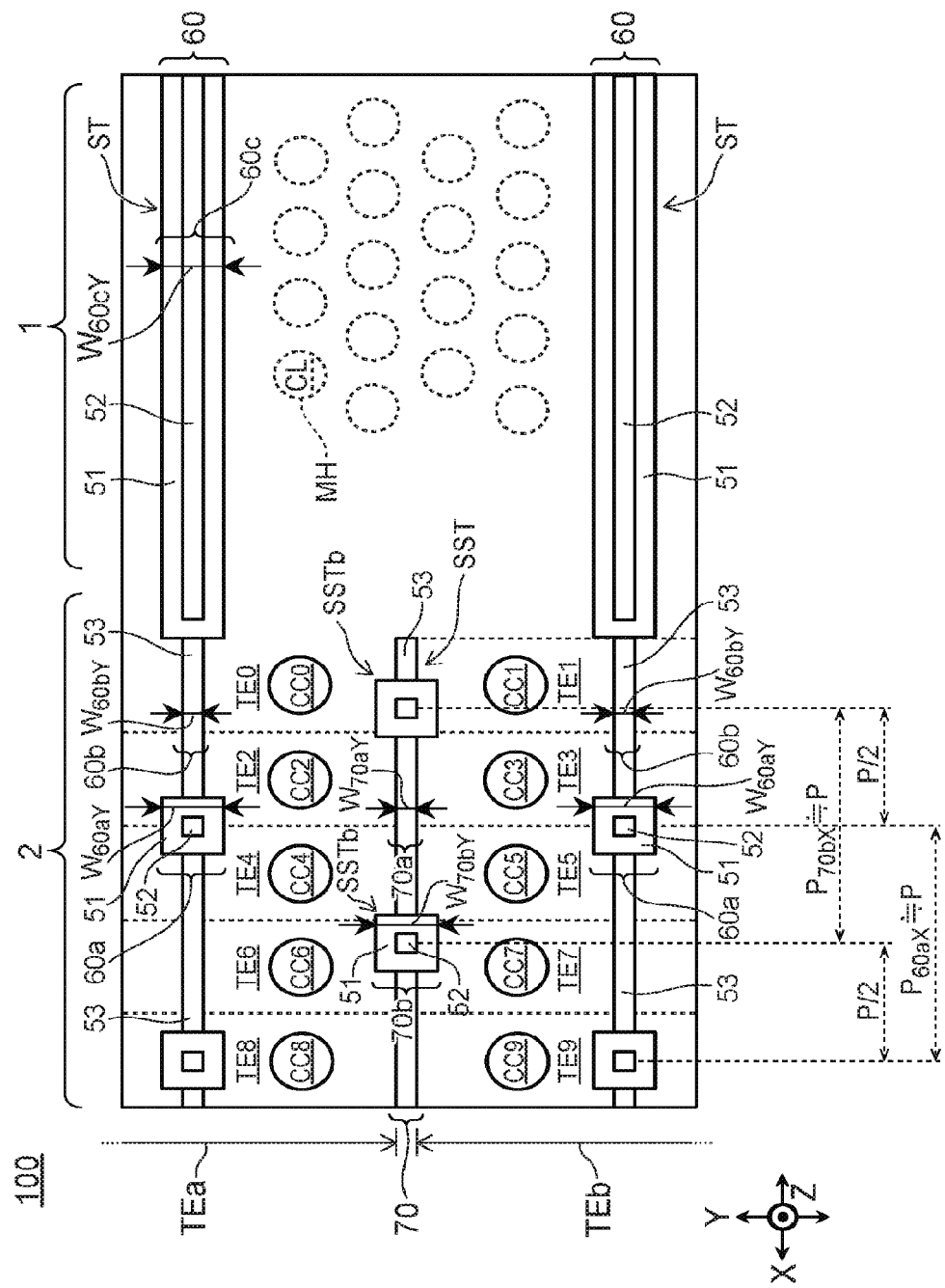
FIG. 22 is a schematic plan view of a memory cell array and a staircase portion of a semiconductor device of a fourth embodiment.

FIG. 22 is a schematic plan view of a memory cell array and a staircase portion of a semiconductor device of a fourth embodiment.

As shown in FIG. 22, the fourth embodiment differs from the first embodiment in that the second separation region 70 includes the third portion 70a and a fourth portion 70b.

For example, the fourth portion 70b has a configuration similar to that of the first portion 60a of the first separation region 60. The fourth portion 70b includes, for example, the first insulator 51 and the first conductor 52. An example of the first insulator 51 is silicon oxide. An example of the first conductor 52 is tungsten (W).

One example of the relationship between the width $W_{60aY}$ in the Y-direction of the first portion 60a, the width $W_{60bY}$ in the Y-direction of the second portion 60b, the width $W_{70aY}$ in the Y-direction of the third portion 70a, and a width $W_{70bY}$ in the Y-direction of the fourth portion 70b is shown below.

$$W_{60aY} > W_{60bY}$$

$$W_{70aY} < W_{70bY}$$

$$W_{70aY} \approx W_{60bY}$$

$$W_{70bY} \approx W_{60aY}$$

For example, the fourth portion 70b is provided, for example, in the region SSTb of the short slit SST. Similarly to the regions STa and STc, for example, the region SSTb can be an opening in the replacement process shown in FIG. 8H, FIG. 10G, and FIG. 10H. Therefore, in the staircase portion 2, the removal of the sacrificial layers 42 via the region SSTb and the formation of the electrode layers 41 via the region SSTb are possible.

In the fourth embodiment, the position along the X-direction of the fourth portion 70b is shifted from the position along the X-direction of the first portion 60a. In the specification, such an arrangement of the fourth portion 70b and the first portion 60a is called a "staggered arrangement."

When the arrangement of the fourth portion 70b and the first portion 60a is set to be the "staggered arrangement," compared to the case where the arrangement of the fourth portion 70b and the first portion 60a is set to be a "square lattice arrangement," an advantage is obtained in which the replacement of the sacrificial layers 42 with the electrode layers 41 is performed easily. For example, in the "replace process," compared to the "square lattice arrangement," the electrode layers 41 are filled into the space 43 more easily in the "staggered arrangement." When the electrode layers 41 are filled more easily into the space 43, for example, an advantage can be obtained in which the resistance increase of the electrode layers 41, etc., can be suppressed. In the specification, the "square lattice arrangement" refers to an arrangement in which the position along the X-direction of the fourth portion 70b and the position along the X-direction of the first portion 60a are not shifted from each other.

One example of the "staggered arrangement" is shown in FIG. 22. In the one example of the "staggered arrangement," the position along the X-direction of the fourth portion 70b is shifted, for example, "P/2" from the position along the X-direction of the first portion 60a when it is assumed that an arrangement pitch $P_{70bX}$ of the X-direction of the fourth portion 70b and an arrangement pitch $P_{60aX}$ of the first portion 60a are substantially equal to each other and are an "arrangement pitch P" ($P_{70bX} \approx P_{60aX} \approx P$).

According to the fourth embodiment, for example, in the staircase portion 2, the replacement of the sacrificial layers 42 with the electrode layers 41 can be performed from both the region STa and the region SSTb. Accordingly, according to the fourth embodiment, this is effective in the case where it is difficult to perform the replacement of the sacrificial layers 42 with the electrode layers 41 using only the region STa.

Further, according to the fourth embodiment, the replacement of the sacrificial layers 42 with the electrode layers 41 is performed from the region SSTb as well. Therefore, for example, this is effective also in the case where three or more columns of the terraces shown by the first terrace column TEa and/or the second terrace column TEb are provided.

It is also possible to implement the fourth embodiment in combination with the second embodiment and/or the third embodiment.

Fifth Embodiment

<Semiconductor Device>

Figure 23:
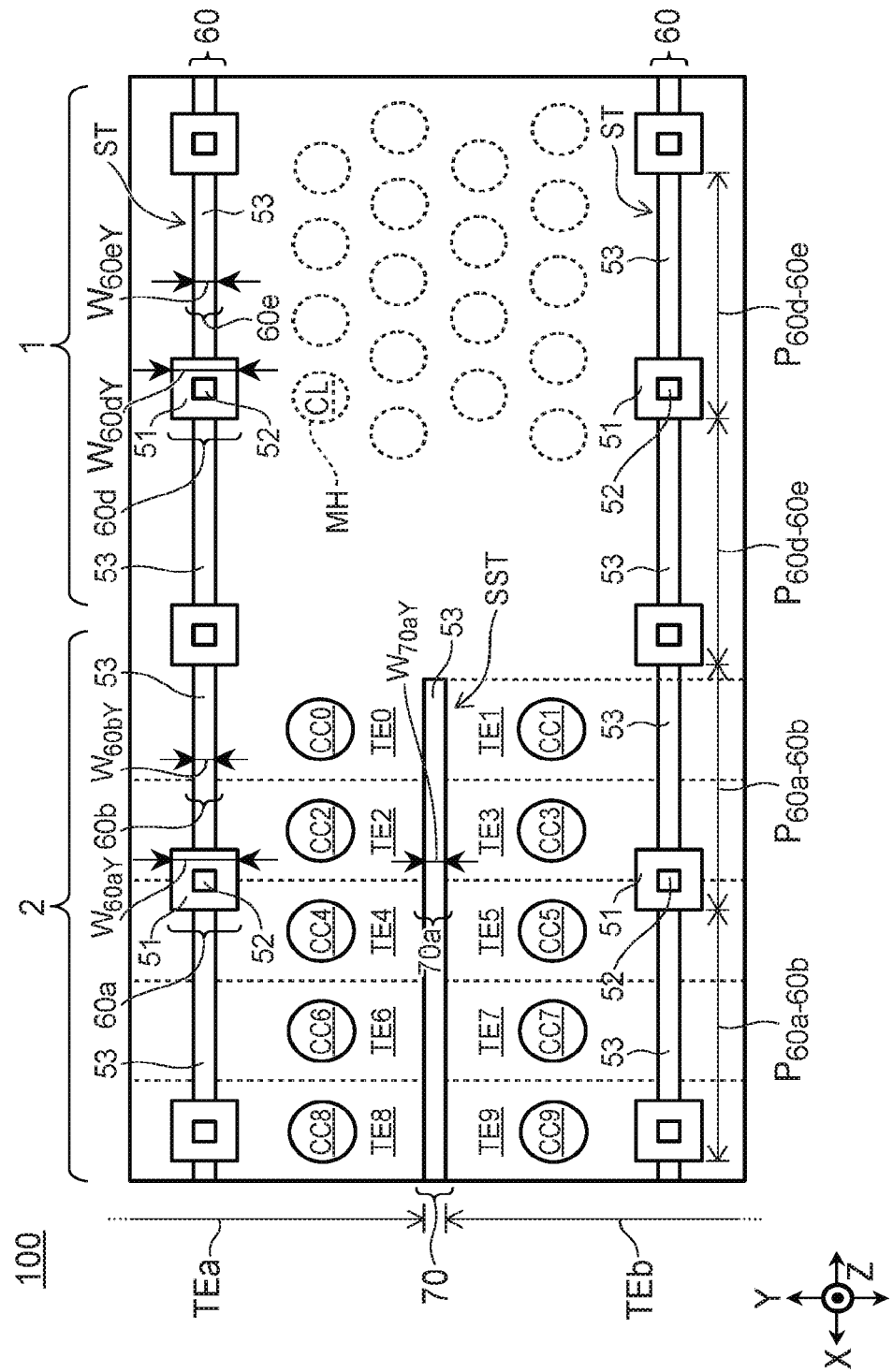
FIG. 23 is a schematic plan view of a memory cell array and a staircase portion of a semiconductor device of a fifth embodiment.

FIG. 23 is a schematic plan view of a memory cell array and a staircase portion of a semiconductor device of a fifth embodiment.

As shown in FIG. 23, the fifth embodiment differs from the first embodiment in that the first separation region 60 includes a fifth portion 60d and a sixth portion 60e in the memory cell array 1.

The fifth portion 60d has, for example, a configuration similar to that of the first portion 60a. The fifth portion 60d includes, for example, the first insulator 51 and the first conductor 52. An example of the first insulator 51 is silicon oxide. An example of the first conductor 52 is tungsten (W).

The sixth portion 60e has, for example, a configuration similar to that of the second portion 60b. The sixth portion 60e includes, for example, the second insulator 53. An example of the second insulator 53 is silicon oxide.

One example of the relationship between the width $W_{60aY}$ in the Y-direction of the first portion 60a, the width $W_{60bY}$ in the Y-direction of the second portion 60b, a width $W_{60dY}$ in the Y-direction of the fifth portion 60d, and a width $W_{60eY}$ in the Y-direction of the sixth portion 60e is shown below.

$$W_{60aY} > W_{60bY}$$

$$W_{60dY} > W_{60eY}$$

$$W_{60aY} \approx W_{60dY}$$

$$W_{60bY} \approx W_{60eY}$$

A pitch $P_{60a-60b}$ in the X-direction of the first portion 60a and the second portion 60b and a pitch $P_{60d-60e}$ in the X-direction of the fifth portion 60d and the sixth portion 60e are, for example, substantially equal ($P_{60a-60b} \approx P_{60d-60e}$). For example, when the pitch $P_{60a-60b}$ and the pitch $P_{60d-60e}$ are set to be substantially equal, the pattern of the first portion 60a, the second portion 60b, the fifth portion 60d, and the sixth portion 60e in the first separation region 60 is set to repeat periodically from the staircase portion 2 to the memory cell array 1. Therefore, for example, although it depends on the exposure conditions as well, the lithography of the slit ST for providing the first separation region 60 is performed more easily.

As in the fifth embodiment, in the memory cell array 1, it is possible to provide, in the first separation region 60, the fifth portion 60d having the wide width $W_{60dY}$ in the Y-direction and the sixth portion 60e having the narrow width $W_{60eY}$ in the Y-direction. In the fifth embodiment as well, for example, it is also possible to set the arrangement of the fifth portion 60d to be a "staggered arrangement."

According to such a fifth embodiment, it is possible to easily perform the lithography of the slit ST. Accordingly, for example, an advantage also can be obtained in which this is advantageous for further advancement of downscaling. Further, an advantage also can be obtained in which, for the arrangement of the first separation region 60, the width in the Y-direction of the electrode layers 41 inside the stacked body 100 between the sixth portions 60e adjacent to each other in the Y-direction spreads; and the resistance reduction of the electrode layers 41 can be realized.

It is also possible to implement the fifth embodiment in combination with the second to fourth embodiments. The combination of the second to fourth embodiments may be any combination.

Sixth Embodiment

<Semiconductor Device>

Figure 24:
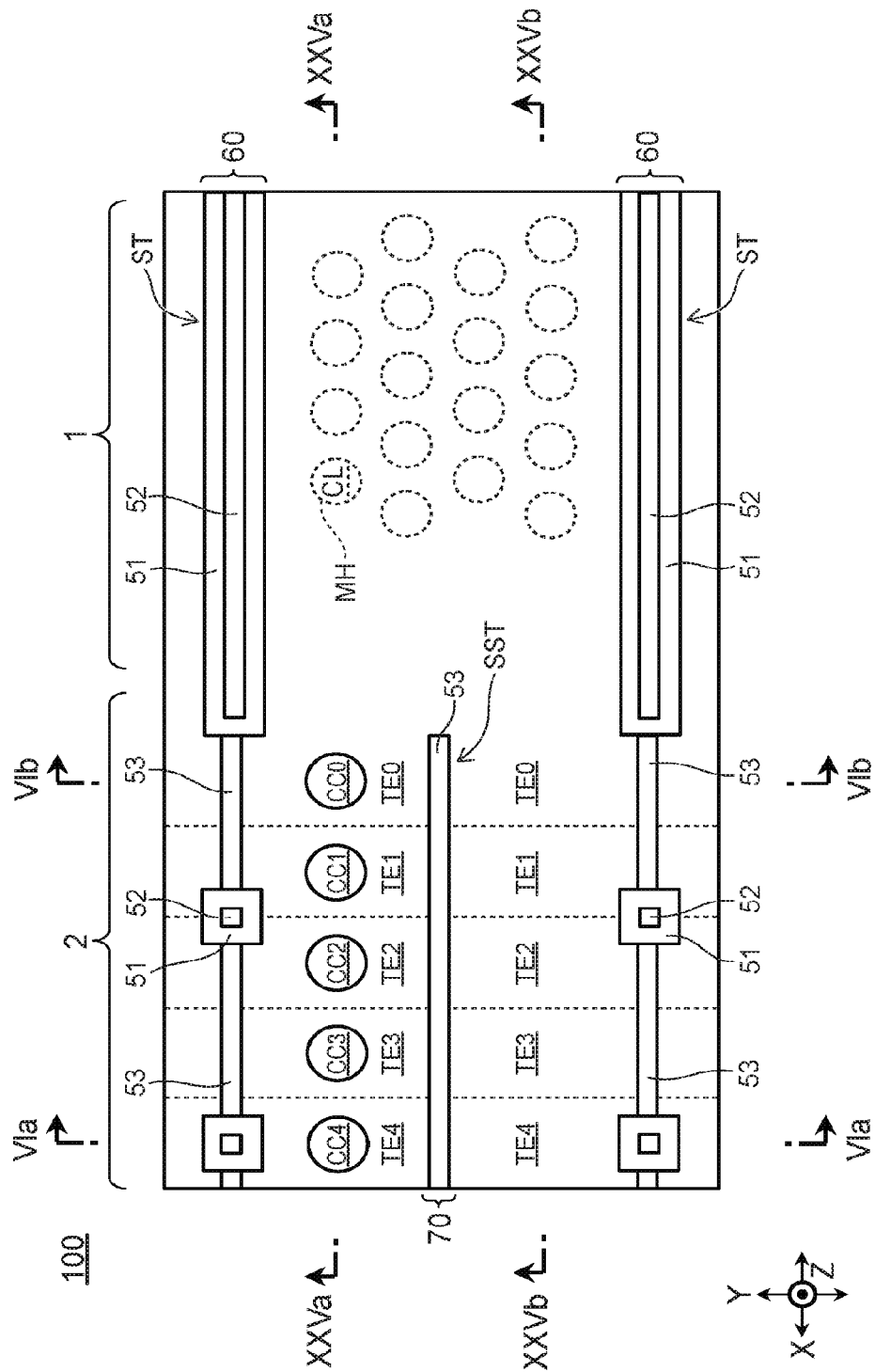
FIG. 24 is a schematic plan view of a memory cell array and a staircase portion of a semiconductor device of a sixth embodiment.
Figure 25A:
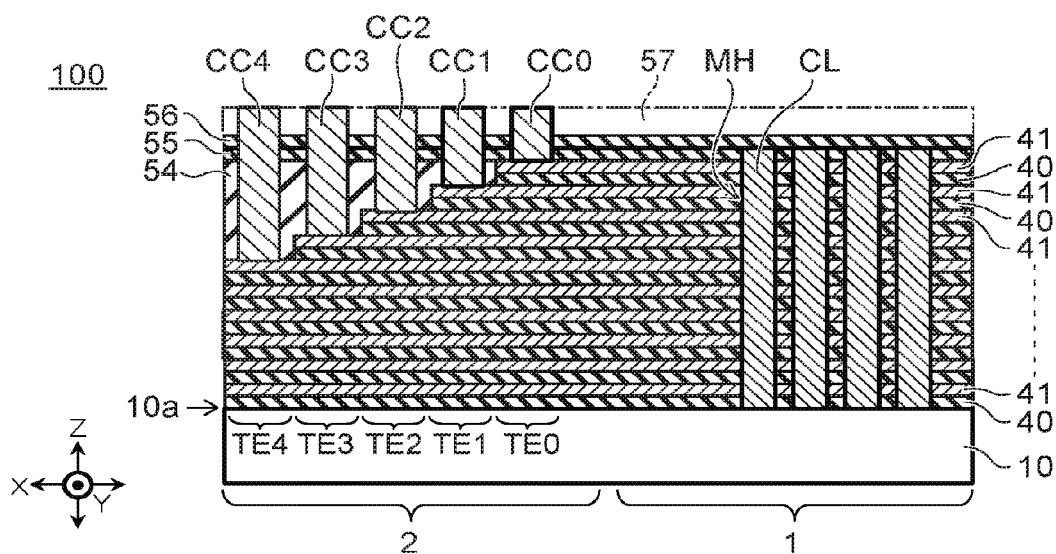
FIG. 25A is a schematic cross-sectional view along line XXVa-XXVa in FIG. 24.
Figure 25B:
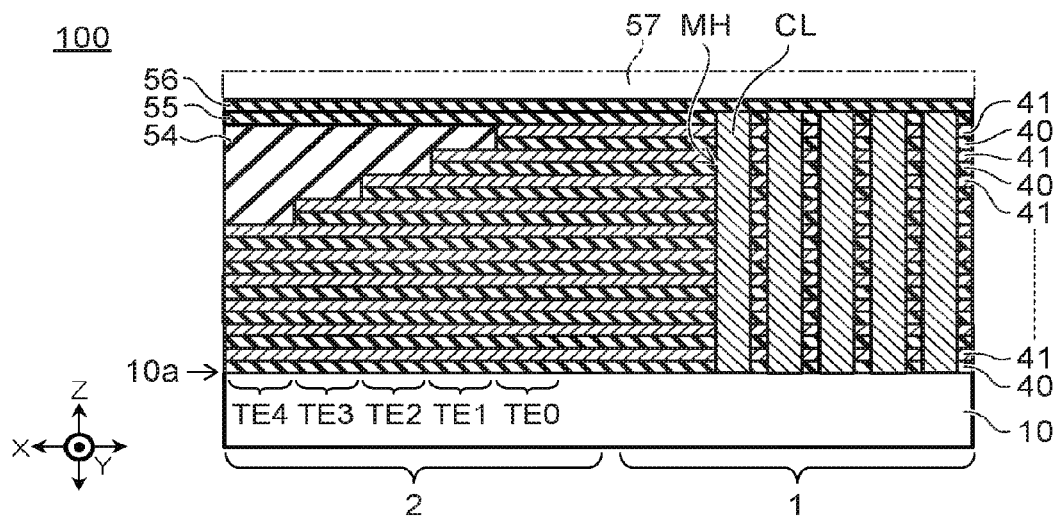
FIG. 25B is a schematic cross-sectional view along line XXVb-XXVb in FIG. 24.

FIG. 24 is a schematic plan view of a memory cell array and a staircase portion of a semiconductor device of a sixth embodiment. FIG. 25A is a schematic cross-sectional view along line XXVa-XXVa in FIG. 24. FIG. 25B is a schematic cross-sectional view along line XXVb-XXVb in FIG. 24.

As shown in FIG. 24, FIG. 25A, and FIG. 25B, the sixth embodiment differs from the first embodiment in that the sixth embodiment is an example in which the terrace columns that are provided between two first separation regions 60 are set to be one column. The terraces TE0 to TE4 are shown in the drawing.

The terrace columns that are provided between two first separation regions 60 are not limited to being multiple as in the first to fifth embodiments, and may be one column as in the sixth embodiment.

Thus, according to the embodiments, a semiconductor device can be obtained in which it is possible to reduce the planar size of the staircase portion 2.

Hereinabove, the embodiments are described with reference to several examples. However, the embodiments are not limited to the examples described in the specification. The embodiments described above are not intended to limit the scope of the invention.

For example, in the embodiments, for example, the third portion 70a and the second portion 60b filled with the second insulator 53 are utilized as support walls supporting the insulating bodies 40 in the "replace process." The "replace process" of the embodiments is, for example, the process of replacing the sacrificial layers 42 with the electrode layers 41.

However, in the case where insulators between the adjacent electrode layers 41 are, for example, "air gaps," the third portion 70a and the second portion 60b filled with the second insulator 53 also can be utilized as support walls supporting the electrode layers 41.

Also, in the embodiments, the third portion 70a and the second portion 60b that are filled with the second insulator 53 are utilized as support walls. However, if only the second portion 60b appears to be sufficient as the support wall in the staircase portion 2, the formation of the second separation region 70 may be omitted for the stacked body 100.

Further, in the embodiments, the first conductor 52 is filled, with the first insulator 51 interposed, into the first portion 60a and the array portion 60c or the fifth portion 60d of the first separation region 60 and/or the fourth portion 70d of the second separation region 70; and the first conductor 52 that is filled into the memory cell array 1 is particularly utilized as the source line SL. However, in the case where a conductive layer is formed between the substrate 10 and the stacked body 100 and utilized as a source layer by electrically connecting the lower ends of the semiconductor bodies 20 of the columnar portions CL to the conductive layer, it is possible to omit the first conductor 52 that is inside the first portion 60a and the array portion 60c or the fifth portion 60d of the first separation region 60 and/or the fourth portion 70d of the second separation region 70 and entirely fill these portions with only the first insulator 51, or to use these entire portions as "air gaps" by omitting the formation of not only the first conductor 52 but also the first insulator 51.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
a stacked body including a plurality of electrode layers stacked with an insulator interposed;
a columnar portion provided in the stacked body and extending in a stacking direction of the electrode layers; and
a first separation region provided in the stacked body and extending in a first direction,
the stacked body including a memory cell array and a staircase portion arranged in the first direction, the memory cell array including memory cells provided along the columnar portion, and the staircase portion including a plurality of terraces arranged along the first direction, and
the first separation region including a first portion and a second portion in the staircase portion, the first portion having a first width in a second direction crossing the first direction, and the second portion having a second width in the second direction, the second width being narrower than the first width.

2. The semiconductor device according to claim 1, wherein the first separation region is provided in the staircase portion and the memory cell array.

3. The semiconductor device according to claim 1, further comprising:
a second separation region extending in the first direction, the second separation region being provided in the staircase portion and including a third portion, the third portion having a third width in the second direction narrower than the first width.

4. The semiconductor device according to claim 3, wherein
the first portion includes a first insulator and a first conductor, and
the second portion and the third portion include a second insulator without including a substance same as the first conductor.

5. The semiconductor device according to claim 3, further comprising:
a first oxide layer provided between the second portion and the stacked body; and
a second oxide layer provided between the third portion and the stacked body.

6. The semiconductor device according to claim 4, wherein the second portion and the third portion include the second insulator and a layer including a substance different from the second insulator.

7. The semiconductor device according to claim 2, wherein
the first separation region includes an array portion in the memory cell array, and
the array portion has a width in the second direction substantially equal to the first width.

8. The semiconductor device according to claim 3, wherein the second width is substantially equal to the third width.

9. The semiconductor device according to claim 4, wherein
the second separation region includes the third portion and a fourth portion in the staircase portion, and
the fourth portion has a fourth width in the second direction wider than the third width.

10. The semiconductor device according to claim 9, wherein the fourth portion includes the first insulator and the first conductor.

11. The semiconductor device according to claim 9, wherein the fourth width is substantially equal to the first width.

12. The semiconductor device according to claim 9, wherein a position along the first direction of the fourth portion is shifted from a position along the first direction of the first portion.

13. The semiconductor device according to claim 2, wherein
the first separation region includes a fifth portion and a sixth portion in the memory cell array, and
the fifth portion has a fifth width in the second direction wider than a sixth width in the second direction of the sixth portion.

14. The semiconductor device according to claim 13, wherein
the first portion and the fifth portion include a first insulator and a first conductor, and
the second portion and the sixth portion include a second insulator without including a substance same as the first conductor.

15. The semiconductor device according to claim 13, wherein the fifth width is substantially equal to the first width.

16. The semiconductor device according to claim 3, wherein
- the staircase portion includes a first terrace column and a second terrace column arranged in the second direction, and
- a terrace included in the first terrace column and a terrace included in the second terrace column are different in a position in the stacking direction from each other.

17. The semiconductor device according to claim 16, wherein the second separation region is provided at a boundary between the first terrace column and the second terrace column.

* * * * *